(12) United States Patent
Payer et al.

(10) Patent No.: US 11,158,434 B2
(45) Date of Patent: Oct. 26, 2021

(54) RADIOACTIVE WASTE REPOSITORY SYSTEMS AND METHODS

(71) Applicant: Deep Isolation, Inc., Berkeley, CA (US)

(72) Inventors: Joe H. Payer, Brecksville, OH (US); Stefan Finsterle, Kensington, CA (US); John Apps, Lafayette, CA (US); Richard A. Muller, Berkeley, CA (US)

(73) Assignee: Deep Isolation, Inc., Berkeley, CA (US)

( * ) Notice: Subject to any disclaimer, the term of this patent is extended or adjusted under 35 U.S.C. 154(b) by 0 days.

(21) Appl. No.: 16/718,654

(22) Filed: Dec. 18, 2019

(65) Prior Publication Data

US 2020/0194140 A1 Jun. 18, 2020

Related U.S. Application Data

(60) Provisional application No. 62/781,337, filed on Dec. 18, 2018, provisional application No. 62/784,991, (Continued)

(51) Int. Cl.
*B09B 1/00* (2006.01)
*G21F 9/36* (2006.01)
(Continued)

(52) U.S. Cl.
CPC ............... *G21F 9/36* (2013.01); *B09B 1/008* (2013.01); *E21B 41/005* (2013.01); *G21F 5/015* (2013.01); *G21F 5/06* (2013.01)

(58) Field of Classification Search
CPC .............. G21F 5/08; G21F 9/36; B09B 1/008
See application file for complete search history.

(56) References Cited

U.S. PATENT DOCUMENTS 2,861,636 A * 11/1958 Messenger .............. C04B 14/10
166/292
3,899,631 A 8/1975 Clark
(Continued)

FOREIGN PATENT DOCUMENTS

EP 2555203 2/2013
GB 2151839 A 7/1985
(Continued)

OTHER PUBLICATIONS https://www.scientificamerican.com/article/why-doesnt-stainless-stee/ Free, Michael "Why doesn't stainless steel rust?" 2001.*
(Continued)

*Primary Examiner* — Janine M Kreck
(74) *Attorney, Agent, or Firm* — Fish & Richardson P.C.

(57) ABSTRACT

A hazardous material repository includes a drillhole formed from a terranean surface into a subterranean zone that includes a geologic formation, where the drillhole includes a vertical portion and a non-vertical portion coupled to the vertical portion by a transition portion, the non-vertical portion includes a storage volume for hazardous waste; a casing installed between the geologic formation and the drillhole, the casing including one or more metallic tubular sections; at least one canister positioned in the storage volume of the non-vertical portion of the drillhole, the at least one canister sized to enclose a portion of hazardous material and including an outer housing formed from a non-corrosive metallic material; and a backfill material inserted into the non-vertical portion of the drillhole to fill at least a portion of the storage volume between the at least one canister and the casing.

28 Claims, 26 Drawing Sheets

Related U.S. Application Data filed on Dec. 26, 2018, provisional application No. 62/840,216, filed on Apr. 29, 2019.

(51) Int. Cl.
  *E21B 41/00* (2006.01)
  *G21F 5/015* (2006.01)
  *G21F 5/06* (2006.01)

(56) References Cited

U.S. PATENT DOCUMENTS

| | | | |
|---|---|---|---|
| 3,948,575 A | 4/1976 | Rosser | |
| 4,057,108 A * | 11/1977 | Broussard | E21B 41/02 166/371 |
| 4,320,028 A | 3/1982 | Leuchtag | |
| 4,337,167 A | 6/1982 | Bird et al. | |
| 4,625,122 A * | 11/1986 | Botzem | G21F 5/14 250/506.1 |
| 4,708,522 A | 11/1987 | Bergman et al. | |
| 5,165,235 A | 11/1992 | Nitschke | |
| 5,199,488 A | 4/1993 | Kasevich et al. | |
| 5,284,996 A * | 2/1994 | Vickers | B64G 1/22 220/590 |
| 5,314,264 A | 5/1994 | Danko et al. | |
| 5,340,235 A | 8/1994 | Milliken | |
| 5,377,104 A | 12/1994 | Sorrells et al. | |
| 5,387,741 A | 2/1995 | Shuttle | |
| 5,464,988 A * | 11/1995 | Rossmassler | G21F 5/002 250/507.1 |
| 5,835,548 A | 10/1998 | Lindgren et al. | |
| 5,832,392 A | 11/1998 | Forsberg | |
| 5,850,614 A | 12/1998 | Crichlow | |
| 5,863,283 A | 1/1999 | Gardes | |
| 5,920,602 A * | 7/1999 | Botzem | E21F 17/02 376/272 |
| 6,238,138 B1 | 5/2001 | Crichlow | |
| 6,889,108 B2 | 5/2005 | Tanaka et al. | |
| 6,925,138 B2 | 8/2005 | Nakamaru et al. | |
| 7,287,934 B2 | 10/2007 | Okutsu et al. | |
| 7,781,637 B2 | 8/2010 | Russell et al. | |
| 8,135,107 B2 | 3/2012 | Singh et al. | |
| 8,933,289 B2 | 1/2015 | Crichlow | |
| 9,833,819 B2 | 12/2017 | Burget | |
| 10,002,683 B2 | 6/2018 | Muller et al. | |
| 10,020,084 B2 | 7/2018 | Lehnert et al. | |
| 10,115,490 B1 | 10/2018 | Downey | |
| 10,265,743 B1 | 4/2019 | Muller et al. | |
| 10,300,512 B2 | 5/2019 | Muller et al. | |
| 10,315,238 B1 | 6/2019 | Muller et al. | |
| 2002/0020528 A1 | 2/2002 | McCabe et al. | |
| 2008/0308271 A1 | 12/2008 | Chouzenoux et al. | |
| 2010/0105975 A1* | 4/2010 | Baird | E21B 41/0057 588/16 |
| 2010/0225107 A1* | 9/2010 | Tverlid | F16L 13/007 285/286.2 |
| 2011/0005762 A1 | 1/2011 | Poole | |
| 2013/0112408 A1 | 5/2013 | Oxtoby | |
| 2014/0034875 A1* | 2/2014 | Nakarai | G21F 9/36 252/194 |
| 2017/0186505 A1 | 6/2017 | Muller et al. | |
| 2018/0290188 A1* | 10/2018 | Crichlow | G21F 5/005 |
| 2018/0345336 A1 | 12/2018 | Muller et al. | |
| 2019/0099790 A1 | 4/2019 | Muller et al. | |
| 2019/0295735 A1* | 9/2019 | Crichlow | G21F 9/36 |
| 2019/0318838 A1 | 10/2019 | Muller et al. | |

FOREIGN PATENT DOCUMENTS

| | | |
|---|---|---|
| JP | H09264992 | 10/1997 |
| WO | WO 92/007667 | 5/1992 |
| WO | WO 2015/069300 | 5/2015 |
| WO | WO 2016/177876 | 11/2016 |

OTHER PUBLICATIONS

[No Author] "Yucca Mountain cost estimate rises to $96 billion," World Nuclear News, Aug. 6, 2008, 2 pages.

Arnold, et al., "Reference Design and Operations of Deep Borehole Disposal of High-Level Radioactive Waste," SAND2011-6749, Sandia National Laboratories, 2011, 67 pages.

Cornwall, "Deep Sleep. Boreholes drilled into Earth's crust get a fresh look for nuclear waste disposal," Science, Jul. 10, 2015, 349(6244):132-35.

Dozier, "Feasibility of Very Deep Borehole Disposal of US Nuclear Defense Wastes," Thesis for the degree of Master of Science in Nuclear Science and Engineering, Massachusetts Institute of Technology, Sep. 2011.

Gibb et al., "A Model for Heat Flow in Deep Borehole Disposals of High-Level Nuclear Waste," J. Geophysical Research, May 6, 2008, 113, 18 pages.

Gibbs, "Feasibility of Lateral Emplacement in Very Deep Borehole Disposal of High Level Nuclear Waste," Thesis for the degrees of Naval Engineering and Nuclear Engineering, Massachusetts Institute of Technology, 2010.

Hoag, "Canister Design for Deep Borehole Disposal of Nuclear Waste," Thesis for the degree of Master of Science in Nuclear Science and Engineering, Massachusetts Institute of Technology, May 2006.

International Approaches for Deep Geological Disposal of Nuclear Waste: Geological Challenges in Radioactive Waste Isolation, Fifth Worldwide Review, Faybishenko et al. (ed)., 2016, prepared for the US Department of Energy, 474 pages.

Neuzil et al., "Shale: An overlooked option for US nuclear waste disposal," Bulletin of the Atomic Scientists, Nov. 2014, retrieved on Sep. 26, 2016, retrieved from URL<http://thebulletin.org/shale-overlooked-option-us-nuclear-waste-disposal7831>, 5 pages.

Neuzil, "Can Shale Safely Host U.S. Nuclear Waste?" EOS, Jul. 23, 2013, 94(30), 3 pages.

PCT International Search Report and Written Opinion in International Appln. No. PCT/US2016/066539, dated Apr. 19, 2017, 13 pages.

PCT International Search Report and Written Opinion in International Appln. No. PCT/US2018/035974, dated Aug. 24, 2018, 13 pages.

PCT International Search Report and Written Opinion in International Appln. No. PCT/US2019/035324, dated Dec. 2, 2019, 19 pages.

PCT Invitation to Pay Additional Fees in International Appln. No. PCT/US2019/035324, dated Sep. 12, 2019, 15 pages.

Performance Confirmation Concepts Study Report Civilian Radioactive Waste Management System Management & Operating Contractor TRW 1996.

Sone and Zoback, "Mechanical properties of shale-gas reservoir rocks—Part 1:Static and dynamic elastic properties and anisotropy," Geophysics, Sep./Oct. 2013, 78(5):D381-92.

U.S. Nuclear Waste Technical Review Board, "A Report to the U.S. Congress and the Secretary of Energy, Evaluation of Technical Issues Associated With the Development of a Separate Repository for U.S. Department of Energy-Managed High-Level Radioactive Waste and Spent Nuclear Fuel," 2015, 30 pages.

Vartabedian, "Decades-old war over Yucca Mountain nuclear dump resumes under Trump budget plan," Mar. 29, 2017, ralph. vartabdian@latimes.com; twitter @rvartabedian; 4 pages.

Winterle et al., "Regulatory Perspectives on Deep Borehole Disposal Concepts," prepared for the U.S. Nuclear Regulatory Commission, Contract NRC-02-07006, Center for Nuclear Waste Regulatory Analyses, San Antonio, TX, May 2011, 24 pages.

YuccaMountain.org [online]; "Eureka County, Nevada—Nuclear Waste Office, FAQ's," last updated Mar. 17, 2017; 12 pages.

King et al., "Copper corrosion under expected conditions in a deep geological repository," SKB Technical Report, Svensk Karnbranslehantering, SE, No. TR-01-23, Jan. 1, 2001, pp. 1-176, XP003023578, p. 51-136.

(56) References Cited

OTHER PUBLICATIONS

PCT International Search Report and Written Opinion in International Application No. PCT/US2019/066920, dated May 11, 2020, 16 pages.

* cited by examiner

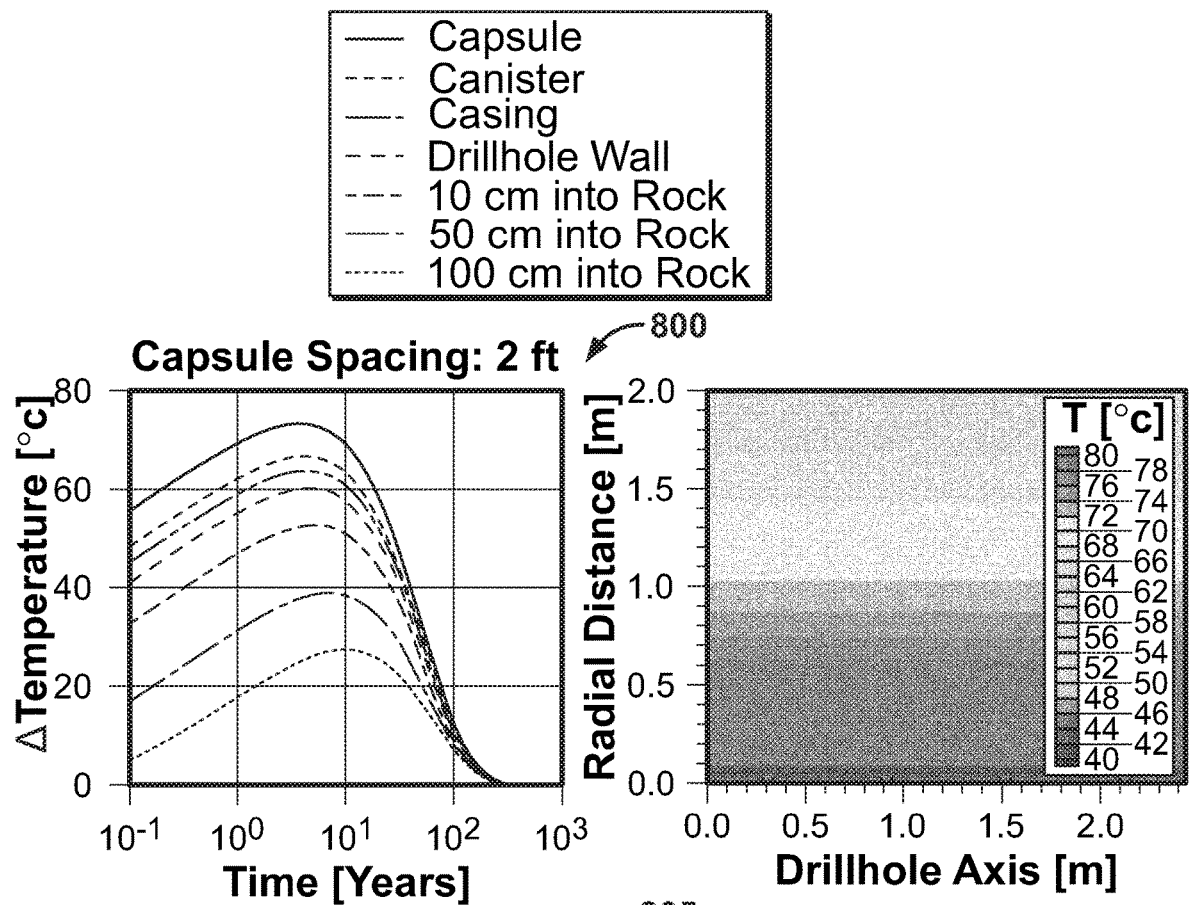
FIG. 8A
FIG. 8B
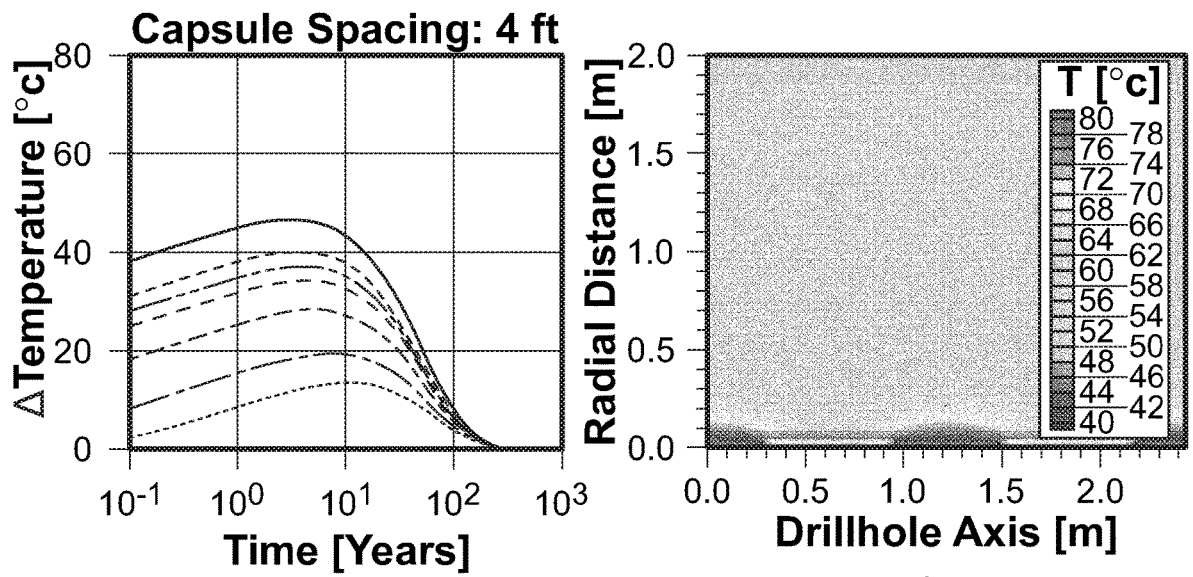
FIG. 8C
FIG. 8D

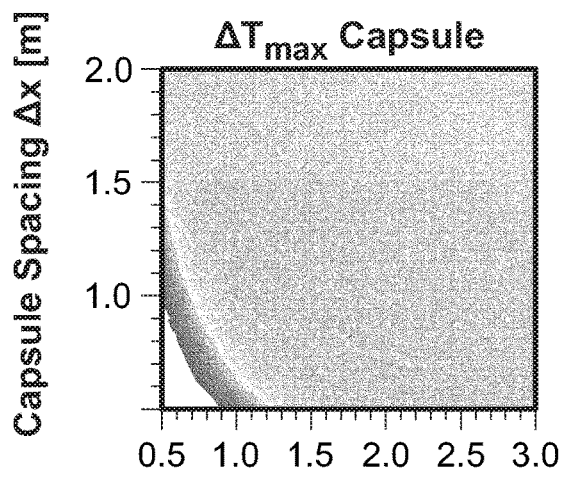
FIG. 10A
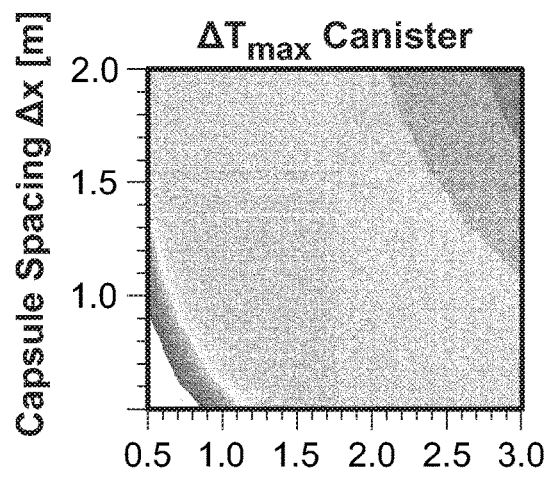
FIG. 10B
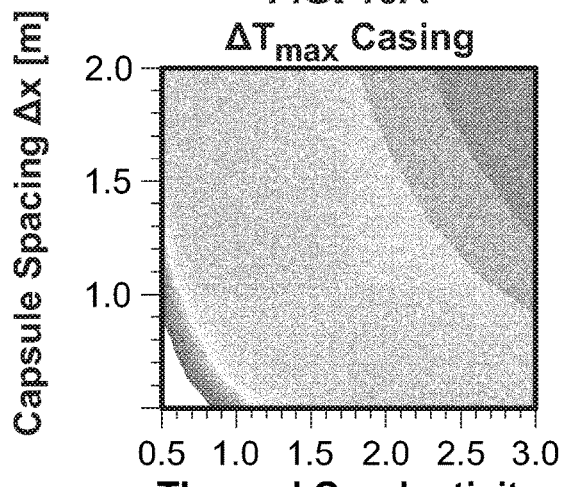
FIG. 10C
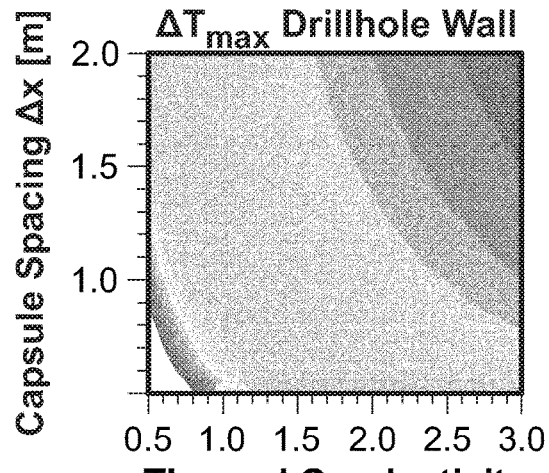
FIG. 10D
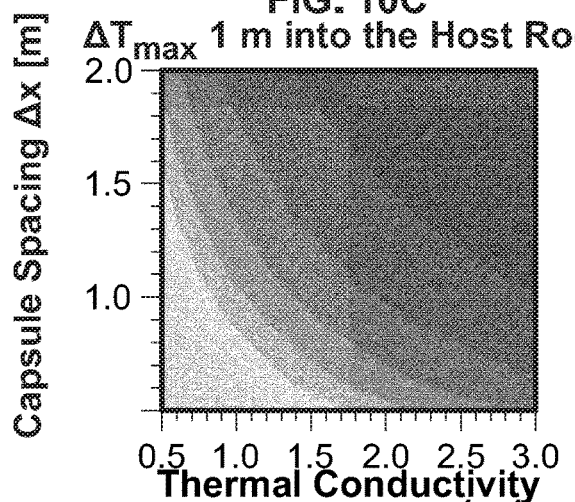
FIG. 10E
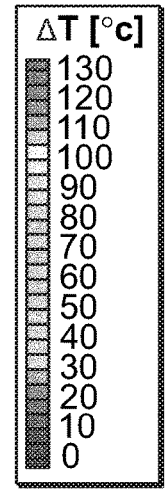

|  | Ni | Cr | Mo | Nb + Ta | Nb | Ta | Fe |
|---|---|---|---|---|---|---|---|
| Weight % | 58 | 23 | 10 |  | 2 | 2 | 5 |
| Atomic % | 60 | 27 | 6 | 0 | 1.30 | 0.67 | 5.4 |

Table 1

FIG. 14A

| |
|---|
| $3Fe + 4H_2O = Fe_3O_4 + 4H_2$ |
| $Ni + H_2O = NiO + H_2$ |
| $2Cr + 3H_2O = Cr_2O_3 + 3H_2$ |
| $Mo + 2H_2O = MO_2 + 2H_2$ |

Table 2

FIG. 14B

| Corrosion Rate (um/yr) | Weight Loss (g/m2) per year | mols Hydrogen per mol 625 | mols hydrogen per m2 per year | mols 625 oxides per mol 625 | Vol 625 oxides (cm3/m2) per year | Vol Expansion of solids (cm3/m2) per year |
|---|---|---|---|---|---|---|
| 0.01 | 0.084 | 1.19 | 0.0119 | 2.33 | 0.03 | 0.02 |
| 0.1 | 0.84 | 1.19 | 0.119 | 2.33 | 0.28 | 0.18 |
| 1 | 8.44 | 1.19 | 1.19 | 2.33 | 2.77 | 1.77 |
| 10 | 84.4 | 1.19 | 11.9 | 2.33 | 27.73 | 17.73 |

Table 3

FIG. 14C

| Years after Emplacement | Condition | Years Explosure | Corrosion Rate-um/yr | Canister Metal Loss per period (um) | Cumulative Canister Metal Loss (um) | Canister Remaining wall thickness mm |
|---|---|---|---|---|---|---|
| Canister Placed | As-Installed | | | | | 9.25 |
| 0-2 | Early Transition | 2 | 2 | 4 | 4 | 9.25 |
| 2-20 | Anaerobic T > 120 C | 18 | 2 | 36 | 40 | 9.21 |
| 20-100 | Anaerobic T 120-80 C | 80 | 1 | 80 | 120 | 9.13 |
| 100-1000 | Anaerobic T < 80 C | 900 | 0.1 | 90 | 210 | 9.04 |
| 1000-10000 | Anaerobic T = 60 C (ambient rock T) | 9000 | 0.1 | 900 | 1110 | 8.14 |

Table 4

FIG. 14D

| Years after Emplacement | Condition | Hydrogen Generated per Period-cm3 | Hydrogen (cm3) STP per year | Cumulative Hydr Generated (cm3 STP) | Cumulative Hydr Generated (cm3 at HZ) | % Expansion Total with T/P Effect |
|---|---|---|---|---|---|---|
| Casing Placed | As-Installed | 0 | 0 | 0 | 0 | 0 |
| 0-2 | Early Transition | 11 | 5.7 | 11 | 0 | 0.000 |
| 2-20 | Anaerobic T > 120 C | 102 | 5.7 | 114 | 2 | 0.000 |
| 20-100 | Anaerobic T 120-80 C | 228 | 2.8 | 341 | 5 | 0.001 |
| 100-1000 | Anaerobic T < 80 C | 256 | 0.3 | 597 | 7 | 0.002 |
| 1000-10000 | Anaerobic T = 60 C (ambient rock T) | 2560 | 0.3 | 3157 | 38 | 0.010 |

Table 5

FIG. 14E

| Years after Emplacement | Condition | Years Exposure per Period | corrosion Rate-um/yr | Volume Oxide Formed per Period-cm3 | Cumilative Volume Oxide Expansion cm3 |
|---|---|---|---|---|---|
| Canisterss Placed | As-Installed | 0 | 0 | 0 | 0 |
| 0-2 | Early Transition | 2 | 2 | 22 | 22 |
| 2-20 | Anaerobic T> 120 C | 18 | 2 | 200 | 223 |
| 20-100 | Anarobic T 120-80 C | 80 | 1 | 445 | 668 |
| 100-1000 | Anaerobic T < 80 C | 900 | 0.1 | 501 | 1169 |
| 1000-10000 | Anaerobic T = 60 C (ambient) | 9000 | 0.1 | 5012 | 6181 |

Table 6

FIG. 14F

| Years after Emplacement | Vol Oxide Expansion per year cm3 | % Expansion Inside Canister | % Expansion Inside Drillhole |
|---|---|---|---|
| 2 | 11.1 | 0.02 | 0.01 |
| 20 | 10.0 | 0.18 | 0.06 |
| 100 | 5.6 | 0.53 | 0.17 |
| 1000 | 0.6 | 0.93 | 0.30 |
| 10000 | 0.6 | 4.94 | 1.61 |

Table 7

FIG. 14G

| Corrosion Rate (um/yr) | Volume L80 (cm3/m2) per year | Weight (g/m2)per year | mols L80 per m2 per year | mols Hydrogen per mol L80 | mols Hydrogen per m2 per year | mols L80 oxides per mol L80 | Vol L80 oxides (cm3/m2) per year | Vol Expansion of solids (cm3/m2) per year | Expansion 100 yrs (mm) |
|---|---|---|---|---|---|---|---|---|---|
| 0.1 | 0.1 | 0.784 | 0.09 | 1.36 | 0.13 | 2.085 | 0.21 | 0.11 | 0.01 |
| 1 | 1 | 7.84 | 0.95 | 1.36 | 1.29 | 2.085 | 2.09 | 1.09 | 0.10 |
| 10 | 10 | 78.4 | 9.47 | 1.36 | 12.88 | 2.085 | 20.85 | 10.85 | 1 |
| 100 | 100 | 784 | 100.00 | 1.36 | 136.00 | 2.085 | 208.50 | 108.50 | 11 |

Table 8

FIG. 14H

| Years after Emplacement | Condition | Years Exposure | Corrosion Rate-um/yr | Casing Metal Loss per period (um) | Cumulative Casing Metal Loss (um) | Casing Remaing wall thickness- (mm) |
|---|---|---|---|---|---|---|
| Casing Placed | As-Installed | | | | | 12.50 |
| 0-2 | Early Transition | 2 | 20 | 40 | 40 | 12.42 |
| 2-20 | Anaerobic T > 120 | 18 | 4 | 72 | 112 | 12.28 |
| 20-100 | Anaerobic T 120-80 C | 80 | 2 | 160 | 272 | 11.96 |
| 100-1000 | Anaerobic T < 80 | 900 | 1 | 900 | 1172 | 10.16 |
| 1000-10000 | Anaerobic T = 60 C (ambient rock T) | 5078 | 1 | 5078 | 6250 | 0.00 |

Table 9

FIG. 14I

| Year | Cumulative Hydrg ID cm3 STP | Cumulative Hydrg OD cm3 STP | Cumulative Total Hydrg cm3 STP | % Expansion ID STP | % Expansion ID with P/T Effect | % Expansion OD STP | % Expansion OD with P/T Effect | % Expansion Total STP | % Expansion Total With P/T Effect |
|---|---|---|---|---|---|---|---|---|---|
| 0 | | | | | | | | | |
| 2 | 292 | 344 | 636 | 0.2 | 0.004 | 0.2 | 0.003 | 0.2 | 0.003 |
| 20 | 817 | 963 | 1780 | 0.7 | 0.010 | 0.5 | 0.008 | 0.5 | 0.007 |
| 100 | 1692 | 1994 | 3687 | 1.4 | 0.022 | 1.1 | 0.017 | 1.0 | 0.015 |
| 1000 | 7731 | 9112 | 16844 | 6.2 | 0.099 | 4.9 | 0.078 | 4.4 | 0.070 |
| 6078 | 25084 | 29563 | 54646 | 20.0 | 0.321 | 15.9 | 0.254 | 14.2 | 0.228 |

Table 10

FIG. 14J

| Years after Emplacement | Condition | Years Exposure per Period | Corrosion Rate-um/yr | Volume Metal Loss-Casing ID per Period-cm3 | Volume Oxide Formed Casing ID per Period-cm3 | Volume Metal Loss-Casing OD per Period-cm3 | Volume Oxide Formed OD per Period-cm3 | Total Volume Oxide Formed per Period-cm3 | ID Oxide Expansion per Year During Period (cm3) | OD Oxide Expansion per Year During Period (cm3) | Total Oxide Expansion per Year During Period (cm3) |
|---|---|---|---|---|---|---|---|---|---|---|---|
| 0-2 | Early Transition | 2 | 20 | 215 | 447 | 253 | 527 | 974 | 116 | 137 | 254 |
| 2-20 | Anaerobic T > 120 C | 18 | 4 | 386 | 805 | 455 | 949 | 1754 | 23 | 27 | 51 |
| 20-100 | Anaerobic T 120-80 C | 80 | 2 | 858 | 1789 | 1011 | 2109 | 3898 | 12 | 14 | 25 |
| 100-1000 | Anaerobic T < 80 C | 900 | 1 | 4827 | 10064 | 5689 | 11861 | 21925 | 6 | 7 | 13 |
| 1000-10000 | 60 C (ambient rock T) | 5078 | 1 | 13617 | 28391 | 16049 | 33461 | 61853 | 3 | 3 | 6 |

Table 11

FIG. 14K

| Year | Cumulative Volume Oxide Formed ID- cm3 | Cumulative Oxide Expansion ID (cm3) | Cumulative Volume Oxide Formed OD - cm3 | Cumulative Oxide Expansion OD (cm3) | Cumulative Total Volume Oxide Formed- cm3 | Cumulative Total Oxide Expansion (cm3) | % Expansion ID | % Expansion OD | % Expansion Total |
|---|---|---|---|---|---|---|---|---|---|
| 0 | | | | | | | | | |
| 2 | 447 | 233 | 527 | 274 | 974 | 507 | 0.19% | 0.15% | 0.13% |
| 20 | 1252 | 652 | 1476 | 768 | 2728 | 1420 | 0.52% | 0.41% | 0.37% |
| 100 | 3042 | 1583 | 3585 | 1865 | 6626 | 3448 | 1.26% | 1.00% | 0.90% |
| 1000 | 13105 | 6820 | 15446 | 8038 | 28551 | 14858 | 5.45% | 4.32% | 3.87% |
| 5078 | 41497 | 21594 | 48907 | 25450 | 90404 | 47045 | 17.25% | 13.68% | 12.24% |

Table 12

FIG. 14L

| Material | Parameter | Units | Value | Range |
|---|---|---|---|---|
| capsule | thermal conductivity, K | W m$^{-1}$ K$^{-1}$ | 11.9 | 8.0 - 40.0 |
| | solid density, $\rho_s$ | kg m$^{-3}$ | 5500.0 | n/a |
| | solid specific heat, $C_s$ | J kg$^{-1}$ K$^{-1}$ | 427.0 | 400.0 - 700.0 |
| | porosity, $\phi$ | % | 1.0 | n/a |
| | permeability, k | m$^2$ | 0.0 | n/a |
| canister | thermal conductivity, K | W m$^{-1}$ K$^{-1}$ | 13.0 | 8.0 - 40.0 |
| | solid density, $\rho_s$ | kg m$^{-3}$ | 8000.0 | n/a |
| | solid specific heat, $C_s$ | J kg$^{-1}$ K$^{-1}$ | 490.0 | 400.0 - 700.0 |
| | porosity, $\phi$ | % | 1.0 | n/a |
| | permeability, k | m$^2$ | 0.0 | n/a |
| casing | thermal conductivity, K | W m$^{-1}$ K$^{-1}$ | 40.0 | 8.0 - 40.0 |
| | solid density, $\rho_s$ | kg m$^{-3}$ | 7670.0 | n/a |
| | solid specific heat, $C_s$ | J kg$^{-1}$ K$^{-1}$ | 460.0 | 400.0 - 700.0 |
| | porosity, $\phi$ | % | 1.0 | n/a |
| | permeability, k | m$^2$ | 0.0 | n/a |
| backfill | thermal conductivity, K | W m$^{-1}$ K$^{-1}$ | 2.0 | 0.5 - 3.0 |
| | solid density, $\rho_s$ | kg m$^{-3}$ | 2650.0 | n/a |
| | solid specific heat, $C_s$ | J kg$^{-1}$ K$^{-1}$ | 880.0 | 700.0 - 900.0 |
| | porosity, $\phi$ | % | 40.0 | n/a |
| | permeability, k | log(m$^2$) | -16.0 | n/a |
| host rock | thermal conductivity, K | W m$^{-1}$ K$^{-1}$ | 2.0 | 0.5 - 3.0 |
| | solid density, $\rho_s$ | kg m$^{-3}$ | 2710.0 | n/a |
| | solid specific heat, $C_s$ | J kg$^{-1}$ K$^{-1}$ | 850.0 | 700.0 - 900.0 |
| | porosity, $\phi$ | % | 5.0 | n/a |
| | permeability, k | log(m$^2$) | -17.0 | n/a |
| waste | initial heat load, $Q_{H0}$ | W/Capsule | 100.0 | 50.0 - 200.0 |
| | capsule spacing, $\Delta x$ | m | 1.0 | 0.61 - 4.30 |

Table 13

FIG. 14M

| Obs. | Parameters | | | | | | | | |
|---|---|---|---|---|---|---|---|---|---|
| | Kcapsule | Kback1 | Kcanister | Kback2 | Kcasing | Kannulus | Krock | Qheat | $\Sigma \bar{S}_f$ |
| Tcapsule | 0.13 | 2.76 | 0.06 | 1.25 | 0.05 | 1.18 | 14.25 | 4.67 | 24.35 |
| Tcanister | 0.02 | 0.06 | 0.06 | 1.25 | 0.05 | 1.18 | 14.36 | 4.00 | 20.98 |
| Tcasing | 0.02 | 0.05 | 0.03 | 0.02 | 0.05 | 1.18 | 14.44 | 3.72 | 19.51 |
| Trock 0.0 m | 0.01 | 0.04 | 0.02 | 0.02 | 0.04 | 0.12 | 14.61 | 3.42 | 18.28 |
| Trock 0.1 m | 0.01 | 0.02 | 0.01 | 0.01 | 0.02 | 0.06 | 12.22 | 2.83 | 15.18 |
| Trock 0.5 m | 0.00 | 0.01 | 0.01 | 0.00 | 0.00 | 0.00 | 8.28 | 1.96 | 10.26 |
| Trock 1.0 m | 0.00 | 0.00 | 0.00 | 0.00 | 0.00 | 0.00 | 5.51 | 1.37 | 6.88 |
| $\Sigma \bar{S}_t$ | 0.19 | 2.94 | 0.19 | 2.55 | 0.21 | 3.72 | 83.67 | 21.97 | |

Table 14

FIG. 14N

| | Estimation | | Prediction | | | | |
|---|---|---|---|---|---|---|---|
| Time [d] | $\sigma K_{rock}$ | $\sigma T,capsule$ | $\sigma T,canister$ | $\sigma T,casing$ | $\sigma T,wall$ | $\sigma T,0.1m$ | $\sigma T,0.5m$ | $\sigma T,1.0m$ |
| 0 | 1.00 | 14.8 | 14.6 | 14.6 | 14.7 | 12.3 | 8.3 | 5.6 |
| 1 | 0.28 | 2.9 | 2.1 | 2.1 | 2.8 | 2.3 | 1.6 | 1.0 |
| 2 | 0.25 | 2.7 | 1.5 | 1.3 | 2.0 | 1.7 | 1.1 | 0.8 |
| 5 | 0.20 | 2.7 | 1.2 | 0.8 | 1.2 | 1.0 | 0.7 | 0.5 |
| 10 | 0.16 | 2.7 | 1.1 | 0.7 | 0.9 | 0.7 | 0.5 | 0.3 |
| 20 | 0.14 | 2.7 | 1.1 | 0.6 | 0.6 | 0.5 | 0.3 | 0.2 |
| 30 | 0.13 | 2.7 | 1.1 | 0.6 | 0.5 | 0.4 | 0.2 | 0.2 |

Table 15

FIG. 14O

RADIOACTIVE WASTE REPOSITORY SYSTEMS AND METHODS

CROSS-REFERENCE TO RELATED APPLICATIONS

This application claims priority under 35 U.S.C. § 119 to: U.S. Provisional Patent Application No. 62/781,337, filed on Dec. 18, 2018; U.S. Provisional Patent Application No. 62/784,991, filed on Dec. 26, 2018; and U.S. Provisional Patent Application No. 62/840,216, filed on Apr. 29, 2019. The entire contents of each of the previous applications are incorporated by reference herein.

TECHNICAL FIELD

This disclosure relates to radioactive waste repository systems and methods.

BACKGROUND

Hazardous waste, such as radioactive waste, is often placed in long-term, permanent, or semi-permanent storage so as to prevent health issues among a population living near the stored waste. Such hazardous waste storage is often challenging, for example, in terms of storage location identification and surety of containment. For instance, the safe storage of nuclear waste (e.g., spent nuclear fuel, whether from commercial power reactors, test reactors, or even high-grade military waste) is considered to be one of the outstanding challenges of energy technology. Safe storage of the long-lived radioactive waste is a major impediment to the adoption of nuclear power in the United States and around the world. Conventional waste storage methods have emphasized the use of tunnels, and is exemplified by the design of the *Yucca* Mountain storage facility. Other techniques include boreholes, including vertical boreholes, drilled into crystalline basement rock. Other conventional techniques include forming a tunnel with boreholes emanating from the walls of the tunnel in shallow formations to allow human access.

SUMMARY

In a general implementation, a hazardous material repository includes a drillhole formed from a terranean surface into a subterranean zone that includes a geologic formation, where the drillhole includes a vertical portion and a non-vertical portion coupled to the vertical portion by a transition portion, the non-vertical portion includes a storage volume for hazardous waste; a casing installed between the geologic formation and the drillhole, the casing including one or more metallic tubular sections; at least one canister positioned in the storage volume of the non-vertical portion of the drillhole, the at least one canister sized to enclose a portion of hazardous material and including an outer housing formed from a non-corrosive metallic material; and a backfill material inserted into the non-vertical portion of the drillhole to fill at least a portion of the storage volume between the at least one canister and the casing.

In an aspect combinable with the general implementation, the hazardous material includes radioactive material waste.

In another aspect combinable with any one of the previous aspects, the radioactive material waste includes spent nuclear fuel.

In another aspect combinable with any one of the previous aspects, the non-corrosive material includes an alloy that includes at least one of nickel, chromium, or molybdenum.

In another aspect combinable with any one of the previous aspects, the non-corrosive material includes a nickel-chromium-molybdenum alloy.

In another aspect combinable with any one of the previous aspects, the alloy includes Alloy 625.

In another aspect combinable with any one of the previous aspects, the nickel-chromium-molybdenum alloy includes a bulk corrosion resistant alloy.

In another aspect combinable with any one of the previous aspects, the nickel-chromium-molybdenum alloy includes a clad corrosion resistant metal.

In another aspect combinable with any one of the previous aspects, the casing includes a carbon steel alloy.

In another aspect combinable with any one of the previous aspects, the backfill includes a slurry pumped from the terranean surface into the non-vertical portion of the drillhole to fill the portion of the storage volume between the at least one canister and the casing.

In another aspect combinable with any one of the previous aspects, the slurry includes bentonite.

In another aspect combinable with any one of the previous aspects, the slurry includes a bentonite-based slurry.

In another aspect combinable with any one of the previous aspects, the storage volume is at an oxidizing environmental state during a first time period that begins at placement of the at least one canister into the storage volume.

In another aspect combinable with any one of the previous aspects, the at least one canister includes a corrosion rate of about 2 µm/year during the first time period.

In another aspect combinable with any one of the previous aspects, the casing includes a corrosion rate of about 20 µm/year during the first time period.

In another aspect combinable with any one of the previous aspects, the first time period is a first time duration from the placement of the at least one canister into the storage volume.

In another aspect combinable with any one of the previous aspects, the storage volume is at a first reducing environmental state during a second time period that begins at an end of the first time period.

In another aspect combinable with any one of the previous aspects, the at least one canister includes a corrosion rate of about 2 µm/year during the second time period.

In another aspect combinable with any one of the previous aspects, the casing includes a corrosion rate of about 4 µm/year during the second time period.

In another aspect combinable with any one of the previous aspects, the second time period extends from an end of the first time duration to a second time duration from the placement of the at least one canister into the storage volume.

In another aspect combinable with any one of the previous aspects, the storage volume is at a second reducing environmental state during a third time period that begins at an end of the second time period.

In another aspect combinable with any one of the previous aspects, the at least one canister includes a corrosion rate of about 1 µm/year during the third time period.

In another aspect combinable with any one of the previous aspects, the casing includes a corrosion rate of about 2 µm/year during the third time period.

In another aspect combinable with any one of the previous aspects, the third time period extends from an end of the second time duration to a third time duration from the placement of the at least one canister into the storage volume.

In another aspect combinable with any one of the previous aspects, the storage volume is at a third reducing environmental state during a fourth time period that begins at an end of the third time period.

In another aspect combinable with any one of the previous aspects, the at least one canister includes a corrosion rate of about 0.1 µm/year during the fourth time period.

In another aspect combinable with any one of the previous aspects, the casing includes a corrosion rate of about 1 µm/year during the fourth time period.

In another aspect combinable with any one of the previous aspects, the fourth time period extends from an end of the third time duration to a fourth time duration from the placement of the at least one canister into the storage volume.

In another aspect combinable with any one of the previous aspects, the storage volume is at a fourth reducing environmental state during a fifth time period that begins at an end of the fourth time period.

In another aspect combinable with any one of the previous aspects, the at least one canister includes a corrosion rate of about 0.1 µm/year during the fifth time period.

In another aspect combinable with any one of the previous aspects, the casing includes a corrosion rate of about 1 µm/year during the fifth time period.

In another aspect combinable with any one of the previous aspects, the fifth time period extends from an end of the fourth time duration to a fifth duration from the placement of the at least one canister into the storage volume.

In another aspect combinable with any one of the previous aspects, the geologic formation is at a depth in which a hydrostatic pressure at the depth is great enough to prevent boiling of water.

In another aspect combinable with any one of the previous aspects, the geologic formation includes pore water that is highly reducing.

In another aspect combinable with any one of the previous aspects, the geologic formation includes a rock in which pore waters are anoxic.

In another aspect combinable with any one of the previous aspects, the geologic formation includes a fully saturated rock formation.

In another aspect combinable with any one of the previous aspects, the non-vertical portion includes a horizontal drillhole.

In another aspect combinable with any one of the previous aspects, a thermal load of the hazardous material repository is controlled by spacing of the at least one canister within the storage volume.

In another aspect combinable with any one of the previous aspects, a temperatures in the storage volume is controlled by spacing of the at least one canister within the storage volume.

In another aspect combinable with any one of the previous aspects, the at least one canister includes a plurality of canisters arranged linearly in the storage volume.

In another aspect combinable with any one of the previous aspects, the linear arrangement allows for uniform conditions along the storage volume.

In another aspect combinable with any one of the previous aspects, the at least one canister is resistant to corrosion during a heat up and cool down cycle caused by heat from the hazardous waste.

In another aspect combinable with any one of the previous aspects, an environment of the storage volume is controlled to reduce corrosivity during the heat up and cool down cycle.

In another aspect combinable with any one of the previous aspects, the at least one canister is resistant to corrosion in a high temperature, oxidizing water environment.

In another aspect combinable with any one of the previous aspects, the at least one canister includes a protective film by application of a surface treatment or coating.

In another aspect combinable with any one of the previous aspects, oxygen in the drillhole is minimized during formation of the hazardous material repository.

Another aspect combinable with any one of the previous aspects further includes oxygen scavengers in the drillhole to consume or tie up oxygen.

In another aspect combinable with any one of the previous aspects, temperature or pressure or both is controlled in the drillhole to control a formation of metal oxide corrosion products.

Another aspect combinable with any one of the previous aspects further includes one or more expansion absorbers.

In another aspect combinable with any one of the previous aspects, the one or more expansion absorbers are placed at predetermined locations in the casing.

In another aspect combinable with any one of the previous aspects, the non-vertical portion includes an expansion leg at an end of non-vertical portion.

In another aspect combinable with any one of the previous aspects, the casing includes an engineered filling to control corrosion.

In another aspect combinable with any one of the previous aspects, the engineered filling includes a bentonite-based slurry to control corrosion.

In another aspect combinable with any one of the previous aspects, the engineering filling modifies the environment to be mildly alkaline.

In another aspect combinable with any one of the previous aspects, the engineering filling reduces oxygen in the drillhole.

In another aspect combinable with any one of the previous aspects, the engineering filling mitigates microbial activity.

Another aspect combinable with any one of the previous aspects further includes a cementitious material between the casing and geologic formation to control corrosion of the casing.

Another aspect combinable with any one of the previous aspects further includes a material between the casing and geologic formation to modify the drillhole to be mildly alkaline.

Another aspect combinable with any one of the previous aspects further includes a bentonite-based slurries between the casing and geologic formation to control corrosion of the casing.

In another general implementation, a method for forming an engineered barrier system for a hazardous material repository includes forming a drillhole from a terranean surface into a subterranean zone that includes a geologic formation, where the drillhole includes a vertical portion and a non-vertical portion coupled to the vertical portion by a transition portion, the non-vertical portion includes a storage volume for hazardous waste; installing a casing between the geologic formation and the drillhole, the casing including one or more metallic tubular sections; positioning at least one canister in the storage volume of the non-vertical portion of the drillhole, the at least one canister enclosing a portion of hazardous material and including an outer housing formed from a non-corrosive metallic material; and inserting a backfill material into the non-vertical portion of the drillhole to fill at least a portion of the storage volume between the at least one canister and the casing.

In an aspect combinable with the general implementation, the hazardous material includes radioactive material waste.

In another aspect combinable with any one of the previous aspects, the radioactive material waste includes spent nuclear fuel.

In another aspect combinable with any one of the previous aspects, the non-corrosive material includes an alloy that includes at least one of nickel, chromium, or molybdenum.

In another aspect combinable with any one of the previous aspects, the alloy includes Alloy 625.

In another aspect combinable with any one of the previous aspects, the casing includes a carbon steel alloy.

In another aspect combinable with any one of the previous aspects, the backfill includes a slurry pumped from the terranean surface into the non-vertical portion of the drillhole to fill the portion of the storage volume between the at least one canister and the casing.

In another aspect combinable with any one of the previous aspects, the slurry includes bentonite.

In another aspect combinable with any one of the previous aspects, the storage volume is at an oxidizing environmental state during a first time period that begins at placement of the at least one canister into the storage volume.

In another aspect combinable with any one of the previous aspects, the at least one canister includes a corrosion rate of about 2 µm/year during the first time period.

In another aspect combinable with any one of the previous aspects, the casing includes a corrosion rate of about 20 µm/year during the first time period.

In another aspect combinable with any one of the previous aspects, the first time period is a first time duration from the placement of the at least one canister into the storage volume.

In another aspect combinable with any one of the previous aspects, the storage volume is at a first reducing environmental state during a second time period that begins at an end of the first time period.

In another aspect combinable with any one of the previous aspects, the at least one canister includes a corrosion rate of about 2 µm/year during the second time period.

In another aspect combinable with any one of the previous aspects, the casing includes a corrosion rate of about 4 µm/year during the second time period.

In another aspect combinable with any one of the previous aspects, the second time period extends from an end of the first time duration to a second time duration from the placement of the at least one canister into the storage volume.

In another aspect combinable with any one of the previous aspects, the storage volume is at a second reducing environmental state during a third time period that begins at an end of the second time period.

In another aspect combinable with any one of the previous aspects, the at least one canister includes a corrosion rate of about 1 µm/year during the third time period.

In another aspect combinable with any one of the previous aspects, the casing includes a corrosion rate of about 2 µm/year during the third time period.

In another aspect combinable with any one of the previous aspects, the third time period extends from an end of the second time duration to a third time duration from the placement of the at least one canister into the storage volume.

In another aspect combinable with any one of the previous aspects, the storage volume is at a third reducing environmental state during a fourth time period that begins at an end of the third time period.

In another aspect combinable with any one of the previous aspects, the at least one canister includes a corrosion rate of about 0.1 µm/year during the fourth time period.

In another aspect combinable with any one of the previous aspects, the casing includes a corrosion rate of about 1 µm/year during the fourth time period.

In another aspect combinable with any one of the previous aspects, the fourth time period extends from an end of the third time duration to a fourth time duration from the placement of the at least one canister into the storage volume.

In another aspect combinable with any one of the previous aspects, the storage volume is at a fourth reducing environmental state during a fifth time period that begins at an end of the fourth time period.

In another aspect combinable with any one of the previous aspects, the at least one canister includes a corrosion rate of about 0.1 µm/year during the fifth time period.

In another aspect combinable with any one of the previous aspects, the casing includes a corrosion rate of about 1 µm/year during the fifth time period.

In another aspect combinable with any one of the previous aspects, the fifth time period extends from an end of the fourth time duration to a fifth time duration from the placement of the at least one canister into the storage volume.

In another aspect combinable with any one of the previous aspects, the geologic formation is at a depth in which a hydrostatic pressure at the depth is great enough to prevent boiling of water.

In another aspect combinable with any one of the previous aspects, the geologic formation includes pore water that is highly reducing.

In another aspect combinable with any one of the previous aspects, the geologic formation includes a rock in which pore waters are anoxic.

In another aspect combinable with any one of the previous aspects, the geologic formation includes a fully saturated rock formation.

In another aspect combinable with any one of the previous aspects, the non-vertical portion includes a horizontal drillhole.

In another aspect combinable with any one of the previous aspects, a thermal load of the hazardous material repository is controlled by spacing of the at least one canister within the storage volume.

In another aspect combinable with any one of the previous aspects, a temperatures in the storage volume is controlled by spacing of the at least one canister within the storage volume.

In another aspect combinable with any one of the previous aspects, the at least one canister includes a plurality of canisters arranged linearly in the storage volume.

In another aspect combinable with any one of the previous aspects, the linear arrangement allows for uniform conditions along the storage volume.

In another aspect combinable with any one of the previous aspects, the at least one canister is resistant to corrosion during a heat up and cool down cycle caused by heat from the hazardous waste.

In another aspect combinable with any one of the previous aspects, an environment of the storage volume is controlled to reduce corrosivity during the heat up and cool down cycle.

In another aspect combinable with any one of the previous aspects, the at least one canister is resistant to corrosion in a high temperature, oxidizing water environment.

In another aspect combinable with any one of the previous aspects, the at least one canister includes a protective film by application of a surface treatment or coating.

In another aspect combinable with any one of the previous aspects, oxygen in the drillhole is minimized during formation of the hazardous material repository.

Another aspect combinable with any one of the previous aspects further includes oxygen scavengers in the drillhole to consume or tie up oxygen.

In another aspect combinable with any one of the previous aspects, temperature or pressure or both is controlled in the drillhole to control a formation of metal oxide corrosion products.

Another aspect combinable with any one of the previous aspects further includes one or more expansion absorbers.

In another aspect combinable with any one of the previous aspects, the one or more expansion absorbers are placed at predetermined locations in the casing.

In another aspect combinable with any one of the previous aspects, the non-vertical portion includes an expansion leg at an end of non-vertical portion.

In another aspect combinable with any one of the previous aspects, the casing includes an engineered filling to control corrosion.

In another aspect combinable with any one of the previous aspects, the engineered filling includes a bentonite-based slurry to control corrosion.

In another aspect combinable with any one of the previous aspects, the engineering filling modifies the environment to be mildly alkaline.

In another aspect combinable with any one of the previous aspects, the engineering filling reduces oxygen in the drillhole.

In another aspect combinable with any one of the previous aspects, the engineering filling mitigates microbial activity.

Another aspect combinable with any one of the previous aspects further includes a cementitious material between the casing and geologic formation to control corrosion of the casing.

Another aspect combinable with any one of the previous aspects further includes a material between the casing and geologic formation to modify the drillhole to be mildly alkaline.

Another aspect combinable with any one of the previous aspects further includes a bentonite-based slurries between the casing and geologic formation to control corrosion of the casing.

Implementations of a hazardous material storage repository according to the present disclosure may include one or more of the following features. For example, a hazardous material storage repository according to the present disclosure may allow for multiple levels of containment of hazardous material within a storage repository located thousands of feet underground, decoupled from any nearby mobile water. A hazardous material storage repository according to the present disclosure may also use proven techniques (e.g., drilling) to create or form a storage area for the hazardous material, in a subterranean zone proven to have fluidly sealed hydrocarbons therein for millions of years. As another example, a hazardous material storage repository according to the present disclosure may provide long-term (e.g., thousands of years) storage for hazardous material (e.g., radioactive waste) in a shale formation that has geologic properties suitable for such storage, including low permeability, thickness, and ductility, among others. In addition, a greater volume of hazardous material may be stored at low cost—relative to conventional storage techniques—due in part to directional drilling techniques that facilitate long horizontal boreholes, often exceeding a mile in length. In addition, rock formations that have geologic properties suitable for such storage may be found in close proximity to sites at which hazardous material may be found or generated, thereby reducing dangers associated with transporting such hazardous material.

Implementations of a hazardous material storage repository according to the present disclosure may also include one or more of the following features. Large storage volumes, in turn, allow for the storage of hazardous materials to be emplaced without a need for complex prior treatment, such as concentration or transfer to different forms or canisters. As a further example, in the case of nuclear waste material from a reactor for instance, the waste can be kept in its original pellets, unmodified, or in its original fuel rods, or in its original fuel assemblies, which contain dozens of fuel rods. In another aspect, the hazardous material may be kept in an original holder but a cement or other material is injected into the holder to fill the gaps between the hazardous materials and the structure. For example, if the hazardous material is stored in fuel rods which are, in turn, stored in fuel assemblies, then the spaces between the rods (typically filled with water when inside a nuclear reactor) could be filled with cement or other material to provide yet an additional layer of isolation from the outside world. As yet a further example, secure and low cost storage of hazardous material is facilitated while still permitting retrieval of such material if circumstances deem it advantageous to recover the stored materials.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

FIGS. 7-12 are graphical representations of one or more metrics or criteria of thermal property testing system for a hazardous material storage repository according to the present disclosure.

FIGS. 14A-14O illustrate tables described in the present disclosure.

DETAILED DESCRIPTION

Figure 1:
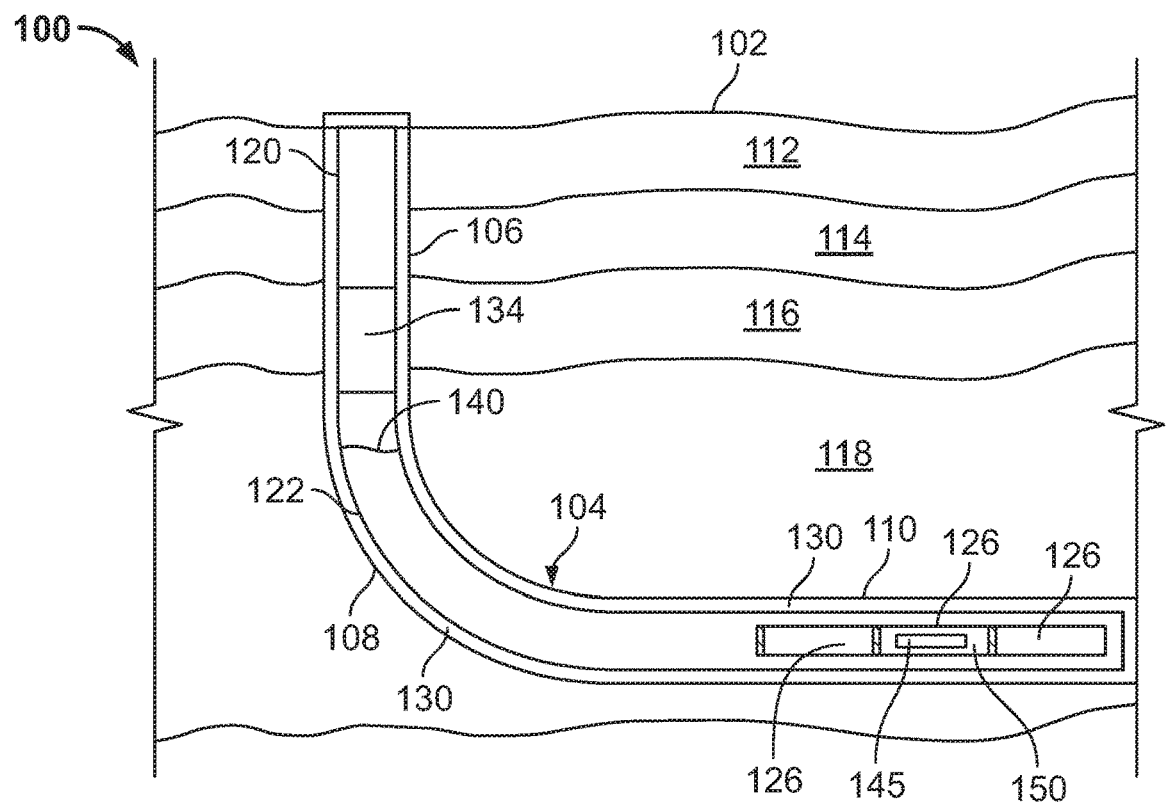
FIG. 1 is a schematic illustration of an example implementation of a hazardous material storage repository that includes an engineered barrier according to the present disclosure.

FIG. 1 is a schematic illustration of an example implementation of a hazardous material storage repository system 100, e.g., a subterranean location for the long-term (e.g., tens, hundreds, or thousands of years or more), but retrievable, safe and secure storage of hazardous material. For example, this figure illustrates the example hazardous material storage repository system 100 once one or more canisters 126 of hazardous material have been deployed in a subterranean formation 118. As illustrated, the hazardous material storage repository system 100 includes a drillhole 104 formed (e.g., drilled or otherwise) from a terranean surface 102 and through multiple subterranean layers 112, 114, 116, and 118. Although the terranean surface 102 is illustrated as a land surface, terranean surface 102 may be a sub-sea or other underwater surface, such as a lake or an ocean floor or other surface under a body of water. Thus, the present disclosure contemplates that the drillhole 104 may be formed under a body of water from a drilling location on or proximate the body of water.

The illustrated drillhole 104 is a directional drillhole in this example of hazardous material storage repository system 100. For instance, the drillhole 104 includes a substantially vertical portion 106 coupled to a radiussed or curved portion 108, which in turn is coupled to a substantially horizontal portion 110. As used in the present disclosure, "substantially" in the context of a drillhole orientation, refers to drillholes that may not be exactly vertical (e.g., exactly perpendicular to the terranean surface 102) or exactly horizontal (e.g., exactly parallel to the terranean surface 102), or exactly inclined at a particular incline angle relative to the terranean surface 102. In other words, vertical drillholes often undulate offset from a true vertical direction, that they might be drilled at an angle that deviates from true vertical, and inclined drillholes often undulate offset from a true incline angle. Further, in some aspects, an inclined drillhole may not have or exhibit an exactly uniform incline (e.g., in degrees) over a length of the drillhole. Instead, the incline of the drillhole may vary over its length (e.g., by 1-5 degrees). As illustrated in this example, the three portions of the drillhole 104—the vertical portion 106, the radiussed portion 108, and the horizontal portion 110—form a continuous drillhole 104 that extends into the Earth. As used in the present disclosure, the drillhole 104 (and drillhole portions described) may also be called wellbores. Thus, as used in the present disclosure, drillhole and wellbore are largely synonymous and refer to bores formed through one or more subterranean formations that are not suitable for human-occupancy (i.e., are too small in diameter for a human to fit therewithin).

The illustrated drillhole 104, in this example, has a surface casing 120 positioned and set around the drillhole 104 from the terranean surface 102 into a particular depth in the Earth. For example, the surface casing 120 may be a relatively large-diameter tubular member (or string of members) set (e.g., cemented) around the drillhole 104 in a shallow formation. As used herein, "tubular" may refer to a member that has a circular cross-section, elliptical cross-section, or other shaped cross-section. For example, in this implementation of the hazardous material storage repository system 100, the surface casing 120 extends from the terranean surface through a surface layer 112. The surface layer 112, in this example, is a geologic layer comprised of one or more layered rock formations. In some aspects, the surface layer 112 in this example may or may not include freshwater aquifers, salt water or brine sources, or other sources of mobile water (e.g., water that moves through a geologic formation). In some aspects, the surface casing 120 may isolate the drillhole 104 from such mobile water, and may also provide a hanging location for other casing strings to be installed in the drillhole 104. Further, although not shown, a conductor casing may be set above the surface casing 120 (e.g., between the surface casing 120 and the surface 102 and within the surface layer 112) to prevent drilling fluids from escaping into the surface layer 112.

As illustrated, a production casing 122 is positioned and set within the drillhole 104 downhole of the surface casing 120. Although termed a "production" casing, in this example, the casing 122 may or may not have been subject to hydrocarbon production operations. Thus, the casing 122 refers to and includes any form of tubular member that is set (e.g., cemented) in the drillhole 104 downhole of the surface casing 120. In some examples of the hazardous material storage repository system 100, the production casing 122 may begin at an end of the radiussed portion 108 and extend throughout the inclined portion 110. The casing 122 could also extend into the radiussed portion 108 and into the vertical portion 106.

As shown, cement 130 is positioned (e.g., pumped) around the casings 120 and 122 in an annulus between the casings 120 and 122 and the drillhole 104. The cement 130, for example, may secure the casings 120 and 122 (and any other casings or liners of the drillhole 104) through the subterranean layers under the terranean surface 102. In some aspects, the cement 130 may be installed along the entire length of the casings (e.g., casings 120 and 122 and any other casings), or the cement 130 could be used along certain portions of the casings if adequate for a particular drillhole 102. The cement 130 can also provide an additional layer of confinement for the hazardous material in canisters 126.

The drillhole 104 and associated casings 120 and 122 may be formed with various example dimensions and at various example depths (e.g., true vertical depth, or TVD). For instance, a conductor casing (not shown) may extend down to about 120 feet TVD, with a diameter of between about 28 in. and 60 in. The surface casing 120 may extend down to about 2500 feet TVD, with a diameter of between about 22 in. and 48 in. An intermediate casing (not shown) between the surface casing 120 and production casing 122 may extend down to about 8000 feet TVD, with a diameter of between about 16 in. and 36 in. The production casing 122 may extend inclinedly (e.g., to case the inclined portion 110) with a diameter of between about 11 in. and 22 in. The foregoing dimensions are merely provided as examples and other dimensions (e.g., diameters, TVDs, lengths) are contemplated by the present disclosure. For example, diameters and TVDs may depend on the particular geological composition of one or more of the multiple subterranean layers (112, 114, 116, and 118), particular drilling techniques, as well as a size, shape, or design of a hazardous material canister 126 that contains hazardous material to be deposited in the hazardous material storage repository system 100. In some alternative examples, the production casing 122 (or other casing in the drillhole 104) could be circular in cross-section, elliptical in cross-section, or some other shape.

As illustrated, the vertical portion 106 of the drillhole 104 extends through subterranean layers 112, 114, and 116, and, in this example, lands in a subterranean layer 118. As discussed above, the surface layer 112 may or may not include mobile water. In this example, a mobile water layer 114 is below the surface layer 112 (although surface layer 112 may also include one or more sources of mobile water or liquid). For instance, mobile water layer 114 may include one or more sources of mobile water, such as freshwater aquifers, salt water or brine, or other source of mobile water. In this example of hazardous material storage repository system 100, mobile water may be water that moves through a subterranean layer based on a pressure differential across all or a part of the subterranean layer. For example, the mobile water layer 114 may be a permeable geologic formation in which water freely moves (e.g., due to pressure differences or otherwise) within the layer 114. In some aspects, the mobile water layer 114 may be a primary source of human-consumable water in a particular geographic area. Examples of rock formations of which the mobile water layer 114 may be composed include porous sandstones and limestones, among other formations.

Other illustrated layers, such as the impermeable layer 116 and the storage layer 118, may include immobile water. Immobile water, in some aspects, is water (e.g., fresh, salt, brine), that is not fit for human or animal consumption, or both. Immobile water, in some aspects, may be water that, by its motion through the layers 116 or 118 (or both), cannot reach the mobile water layer 114, terranean surface 102, or both, within 10,000 years or more (such as to 1,000,000 years).

Below the mobile water layer 114, in this example implementation of hazardous material storage repository system 100, is an impermeable layer 116. The impermeable layer 116, in this example, may not allow mobile water to pass through. Thus, relative to the mobile water layer 114, the impermeable layer 116 may have low permeability, e.g., on the order of nanodarcy permeability. Additionally, in this example, the impermeable layer 116 may be a relatively non-ductile (i.e., brittle) geologic formation. One measure of non-ductility is brittleness, which is the ratio of compressive stress to tensile strength. In some examples, the brittleness of the impermeable layer 116 may be between about 20 MPa and 40 MPa.

As shown in this example, the impermeable layer 116 is shallower (e.g., closer to the terranean surface 102) than the storage layer 118. In this example rock formations of which the impermeable layer 116 may be composed include, for example, certain kinds of sandstone, mudstone, clay, and slate that exhibit permeability and brittleness properties as described above. In alternative examples, the impermeable layer 116 may be deeper (e.g., further from the terranean surface 102) than the storage layer 118. In such alternative examples, the impermeable layer 116 may be composed of an igneous rock, such as granite.

Below the impermeable layer 116 is the storage layer 118. The storage layer 118, in this example, may be chosen as the landing for the horizontal portion 110, which stores the hazardous material, for several reasons. Relative to the impermeable layer 116 or other layers, the storage layer 118 may be thick, e.g., between about 100 and 200 feet of total vertical thickness. Thickness of the storage layer 118 may allow for easier landing and directional drilling, thereby allowing the horizontal portion 110 to be readily emplaced within the storage layer 118 during constructions (e.g., drilling). If formed through an approximate horizontal center of the storage layer 118, the horizontal portion 110 may be surrounded by about 50 to 100 feet of the geologic formation that comprises the storage layer 118. Further, the storage layer 118 may also have only immobile water, e.g., due to a very low permeability of the layer 118 (e.g., on the order of milli- or nanodarcys). In addition, the storage layer 118 may have sufficient ductility, such that a brittleness of the rock formation that comprises the layer 118 is between about 3 MPa and 10 MPa. Examples of rock formations of which the storage layer 118 may be composed include: shale and anhydrite. Further, in some aspects, hazardous material may be stored below the storage layer, even in a permeable formation such as sandstone or limestone, if the storage layer is of sufficient geologic properties to isolate the permeable layer from the mobile water layer 114.

In some examples implementations of the hazardous material storage repository system 100, the storage layer 118 (and/or the impermeable layer 116) is composed of shale. Shale, in some examples, may have properties that fit within those described above for the storage layer 118. For example, shale formations may be suitable for a long-term confinement of hazardous material (e.g., in the hazardous material canisters 126), and for their isolation from mobile water layer 114 (e.g., aquifers) and the terranean surface 102. Shale formations may be found relatively deep in the Earth, typically 3000 feet or greater, and placed in isolation below any fresh water aquifers. Other formations may include salt or other impermeable formation layer.

Shale formations (or salt or other impermeable formation layers), for instance, may include geologic properties that enhance the long-term (e.g., thousands of years) isolation of material. Such properties, for instance, have been illustrated through the long term storage (e.g., tens of millions of years) of hydrocarbon fluids (e.g., gas, liquid, mixed phase fluid) without escape of substantial fractions of such fluids into surrounding layers (e.g., mobile water layer 114). Indeed, shale has been shown to hold natural gas for millions of years or more, giving it a proven capability for long-term storage of hazardous material. Example shale formations (e.g., Marcellus, Eagle Ford, Barnett, and otherwise) has stratification that contains many redundant sealing layers that have been effective in preventing movement of water, oil, and gas for millions of years, lacks mobile water, and can be expected (e.g., based on geological considerations) to seal hazardous material (e.g., fluids or solids) for thousands of years after deposit.

In some aspects, the formation of the storage layer 118 and/or the impermeable layer 116 may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years. For example, the barrier layer of the storage layer 118 and/or impermeable layer 116 may be defined by a time constant for leakage of the hazardous material more than 10,000 years (such as between about 10,000 years and 1,000,000 years) based on such evidence of hydrocarbon or other fluid storage.

Shale (or salt or other impermeable layer) formations may also be at a suitable depth, e.g., between 3000 and 12,000 feet TVD. Such depths are typically below ground water aquifer (e.g., surface layer 112 and/or mobile water layer 114). Further, the presence of soluble elements in shale, including salt, and the absence of these same elements in aquifer layers, demonstrates a fluid isolation between shale and the aquifer layers.

Another particular quality of shale that may advantageously lend itself to hazardous material storage is its clay content, which, in some aspects, provides a measure of ductility greater than that found in other, impermeable rock formations (e.g., impermeable layer 116). For example, shale may be stratified, made up of thinly alternating layers of clays (e.g., between about 20-30% clay by volume) and other minerals. Such a composition may make shale less brittle and, thus less susceptible to fracturing (e.g., naturally or otherwise) as compared to rock formations in the impermeable layer (e.g., dolomite or otherwise). For example, rock formations in the impermeable layer 116 may have suitable permeability for the long term storage of hazardous material, but are too brittle and commonly are fractured. Thus, such formations may not have sufficient sealing qualities (as evidenced through their geologic properties) for the long term storage of hazardous material.

The present disclosure contemplates that there may be many other layers between or among the illustrated subterranean layers 112, 114, 116, and 118. For example, there may be repeating patterns (e.g., vertically), of one or more of the mobile water layer 114, impermeable layer 116, and storage layer 118. Further, in some instances, the storage layer 118 may be directly adjacent (e.g., vertically) the mobile water layer 114, i.e., without an intervening impermeable layer 116. In some examples, all or portions of the radiussed drillhole 108 and the horizontal drillhole 110 may be formed below the storage layer 118, such that the storage layer 118 (e.g., shale or other geologic formation with characteristics as described herein) is vertically positioned between the horizontal drillhole 110 and the mobile water layer 114.

In this example, the horizontal portion 110 of the drillhole 104 includes a storage area in a distal part of the portion 110 into which hazardous material may be retrievably placed for long-term storage. For example, a work string (e.g., tubing, coiled tubing, wireline, or otherwise) or other downhole conveyance (e.g., tractor) may be moved into the cased drillhole 104 to place one or more (three shown but there may be more or less) hazardous material canisters 126 into long term, but in some aspects, retrievable, storage in the portion 110.

Each canister 126 may enclose hazardous material (shown as material 145). Such hazardous material, in some examples, may be biological or chemical waste or other biological or chemical hazardous material. In some examples, the hazardous material may include nuclear material, such as spent nuclear fuel recovered from a nuclear reactor (e.g., commercial power or test reactor) or military nuclear material. Spent nuclear fuel, in the form of nuclear fuel pellets, may be taken from the reactor and not modified. Nuclear fuel pellet are solid, although they can contain and emit a variety of radioactive gases including tritium (13 year half-life), krypton-85 (10.8 year half-life), and carbon dioxide containing C-14 (5730 year half-life). Other hazardous material 145 may include, for example, radioactive liquid, such as radioactive water from a commercial power (or other) reactor.

In some aspects, the storage layer 118 should be able to contain any radioactive output (e.g., gases) within the layer 118, even if such output escapes the canisters 126. For example, the storage layer 118 may be selected based on diffusion times of radioactive output through the layer 118. For example, a minimum diffusion time of radioactive output escaping the storage layer 118 may be set at, for example, fifty times a half-life for any particular component of the nuclear fuel pellets. Fifty half-lives as a minimum diffusion time would reduce an amount of radioactive output by a factor of $1 \times 10^{-15}$. As another example, setting a minimum diffusion time to thirty half-lives would reduce an amount of radioactive output by a factor of one billion.

For example, plutonium-239 is often considered a dangerous waste product in spent nuclear fuel because of its long half-life of 24,100 years. For this isotope, 50 half-lives would be 1.2 million years. Plutonium-239 has low solubility in water, is not volatile, and as a solid. its diffusion time is exceedingly small (e.g., many millions of years) through a matrix of the rock formation that comprises the illustrated storage layer 118 (e.g., shale or other formation). The storage layer 118, for example comprised of shale, may offer the capability to have such isolation times (e.g., millions of years) as shown by the geological history of containing gaseous hydrocarbons (e.g., methane and otherwise) for several million years. In contrast, in conventional nuclear material storage methods, there was a danger that some plutonium might dissolve in a layer that comprised mobile ground water upon confinement escape.

In some aspects, the drillhole 104 may be formed for the primary purpose of long-term storage of hazardous materials. In alternative aspects, the drillhole 104 may have been previously formed for the primary purpose of hydrocarbon production (e.g., oil, gas). For example, storage layer 118 may be a hydrocarbon bearing formation from which hydrocarbons were produced into the drillhole 104 and to the terranean surface 102. In some aspects, the storage layer 118 may have been hydraulically fractured prior to hydrocarbon production. Further in some aspects, the production casing 122 may have been perforated prior to hydraulic fracturing. In such aspects, the production casing 122 may be patched (e.g., cemented) to repair any holes made from the perforating process prior to a deposit operation of hazardous material. In addition, any cracks or openings in the cement between the casing and the drillhole can also be filled at that time.

As further shown in FIG. 1, a backfill material 140 may be positioned or circulated into the drillhole 104. In this example, the backfill material 140 surrounds the canisters 126 and may have a level that extends uphole to at or near a drillhole seal 134 (e.g., permanent packer, plug, or other seal). In some aspects, the backfill material 140 may absorb radioactive energy (e.g., gamma rays or other energy). In some aspects, the backfill material 140 may have a relatively low thermal conductivity, thereby acting as an insulator between the canisters 126 and the casings.

As further shown in FIG. 1, another backfill material 150 may be positioned or placed within one or more of the canisters 126 to surround the hazardous material 145. In some aspects, the backfill material 150 may absorb radioactive energy (e.g., gamma rays or other energy). In some aspects, the backfill material 150 may have a relatively low thermal conductivity, thereby acting as an insulator between the hazardous material 145 and the canister 126. In some aspects, the backfill material 150 may also provide a stiffening attribute to the canister 126, e.g., reducing crushability, deformation, or other damage to the canister 126.

In some aspects, one or more of the previously described components of the system 100 may combine to form an engineered barrier of the hazardous waste material repository 100. For example, in some aspects, the engineered barrier is comprised of one, some, or all of the following components: the storage layer 118, the casing 130, the backfill material 140, the canister 126, the backfill material 150, the seal 134, and the hazardous material 145, itself. In some aspects, one or more of the engineered barrier components may act (or be engineered to act) to: prevent or reduce corrosion in the drillhole 104, prevent or reduce escape of the hazardous material 145; reduce or prevent thermal degradation of one or more of the other components; and other safety measures to ensure that the hazardous material 145 does not reach the mobile water layer 114 (or surface layer 112, including the terranean surface 102).

Figure 2:
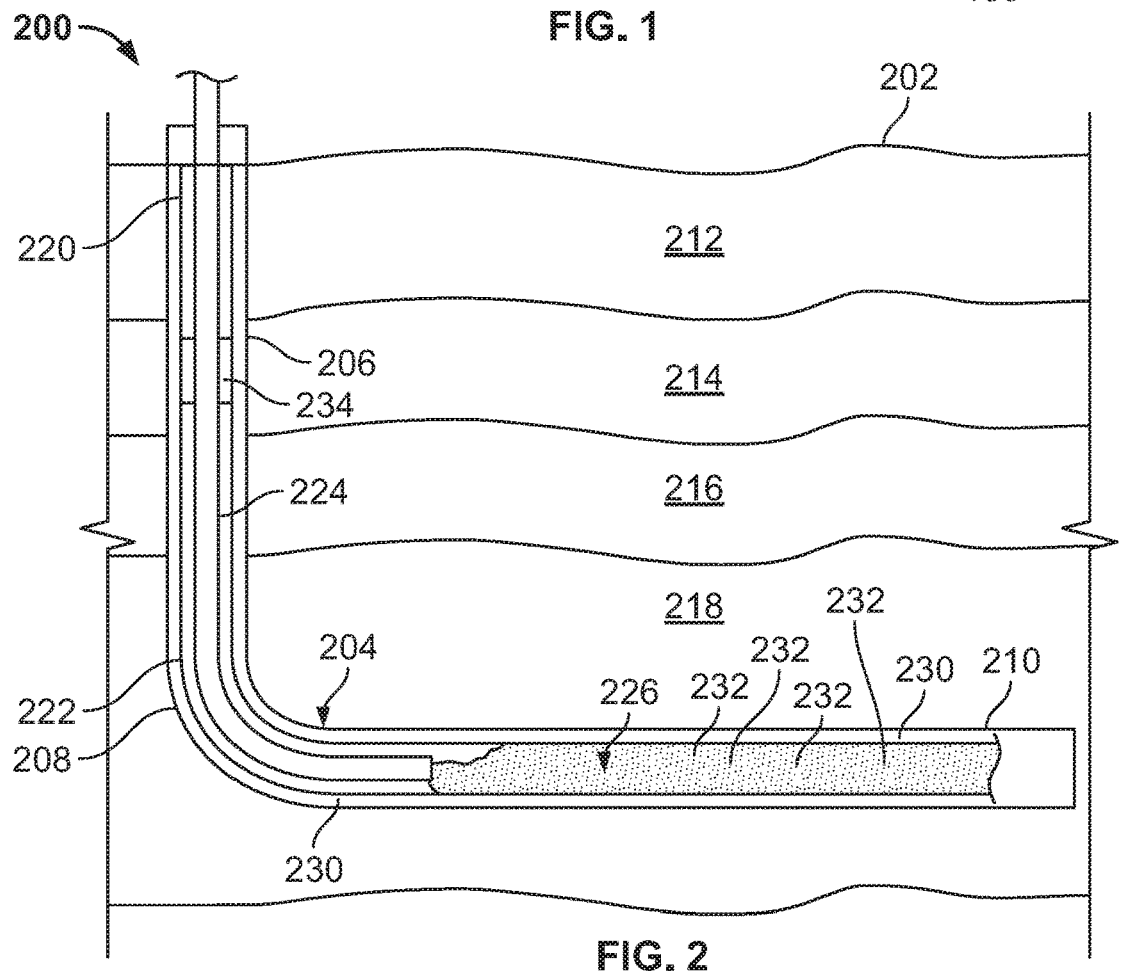
FIG. 2 is a schematic illustration of an example implementation of a hazardous material storage repository for radioactive liquid according to the present disclosure.

FIG. 2 is a schematic illustration of an example implementation of a hazardous material storage repository 200 for radioactive liquid. In some aspects, one or more components of repository 200 may be similar to components described in reference to the hazardous material repository 100. For example, this figure illustrates the example hazardous material storage repository system 200 once (or as) a volume of radioactive liquid 226 that includes hazardous material (e.g., radioactive solid material) 232 is provided to a horizontal portion 210 of a drillhole 204. As illustrated, the hazardous material storage repository system 200 includes the drillhole 204 formed (e.g., drilled or otherwise) from a terranean surface 202 and through multiple subterranean layers 212, 214, 216, and 218. Although the terranean surface 202 is illustrated as a land surface, terranean surface 202 may be a sub-sea or other underwater surface, such as a lake or an ocean floor or other surface under a body of water. Thus, the present disclosure contemplates that the drillhole 204 may be formed under a body of water from a drilling location on or proximate the body of water.

The illustrated drillhole 204 is a directional drillhole in this example of hazardous material storage repository system 200. For instance, the drillhole 204 includes a substantially vertical portion 206 coupled to a radiussed or curved portion 208, which in turn is coupled to a substantially horizontal portion 210. As illustrated in this example, the three portions of the drillhole 204—the vertical portion 206, the radiussed portion 208, and the horizontal portion 210—form a continuous drillhole 204 that extends into the Earth. As used in the present disclosure, the drillhole 204 (and drillhole portions described) may also be called wellbores. Thus, as used in the present disclosure, drillhole and wellbore are largely synonymous and refer to bores formed through one or more subterranean formations that are not suitable for human-occupancy (i.e., are too small in diameter for a human to fit therewithin).

The illustrated drillhole 204, in this example, has a surface casing 220 positioned and set around the drillhole 204 from the terranean surface 202 into a particular depth in the Earth. The surface casing 220 extends from the terranean surface through a surface layer 212. The surface layer 212, in this example, is a geologic layer comprised of one or more layered rock formations. In some aspects, the surface layer 212 in this example may or may not include freshwater aquifers, salt water or brine sources, or other sources of mobile water (e.g., water that moves through a geologic formation). In some aspects, the surface casing 220 may isolate the drillhole 204 from such mobile water, and may also provide a hanging location for other casing strings to be installed in the drillhole 204. Further, although not shown, a conductor casing may be set above the surface casing 220 (e.g., between the surface casing 220 and the surface 202 and within the surface layer 212) to prevent drilling fluids from escaping into the surface layer 212.

As illustrated, a production casing 222 is positioned and set within the drillhole 204 downhole of the surface casing 220. Although termed a "production" casing, in this example, the casing 222 may or may not have been subject to hydrocarbon production operations. Thus, the casing 222 refers to and includes any form of tubular member that is set (e.g., cemented) in the drillhole 204 downhole of the surface casing 220. In some examples of the hazardous material storage repository system 200, the production casing 222 may begin at an end of the radiussed portion 208 and extend throughout the inclined portion 210. The casing 222 could also extend into the radiussed portion 208 and into the vertical portion 206.

As shown, cement 230 is positioned (e.g., pumped) around the casings 220 and 222 in an annulus between the casings 220 and 222 and the drillhole 204. The cement 230, for example, may secure the casings 220 and 222 (and any other casings or liners of the drillhole 204) through the subterranean layers under the terranean surface 202. In some aspects, the cement 230 may be installed along the entire length of the casings (e.g., casings 220 and 222 and any other casings), or the cement 230 could be used along certain portions of the casings if adequate for a particular drillhole 202. The cement 230 can also provide an additional layer of confinement for the radioactive liquid 226. The drillhole 204 and associated casings 220 and 222 may be formed with various example dimensions and at various example depths (e.g., true vertical depth, or TVD).

As illustrated, the vertical portion 206 of the drillhole 204 extends through subterranean layers 212, 214, and 216, and, in this example, lands in a subterranean layer 218. As discussed above, the surface layer 212 may or may not include mobile water. In this example, a mobile water layer 214 is below the surface layer 212 (although surface layer 212 may also include one or more sources of mobile water or liquid). For instance, mobile water layer 214 may include one or more sources of mobile water, such as freshwater aquifers, salt water or brine, or other source of mobile water. In this example of hazardous material storage repository system 200, mobile water may be water that moves through a subterranean layer based on a pressure differential across all or a part of the subterranean layer. For example, the mobile water layer 214 may be a permeable geologic formation in which water freely moves (e.g., due to pressure differences or otherwise) within the layer 214. In some aspects, the mobile water layer 214 may be a primary source of human-consumable water in a particular geographic area. Examples of rock formations of which the mobile water layer 214 may be composed include porous sandstones and limestones, among other formations.

Other illustrated layers, such as the impermeable layer 216 and the storage layer 218, may include immobile water. Immobile water, in some aspects, is water (e.g., fresh, salt, brine), that is not fit for human or animal consumption, or both. Immobile water, in some aspects, may be water that, by its motion through the layers 216 or 218 (or both), cannot reach the mobile water layer 214, terranean surface 202, or both, within 10,000 years or more (such as to 1,000,000 years).

Below the mobile water layer 214, in this example implementation of hazardous material storage repository system 200, is an impermeable layer 216. The impermeable layer 216, in this example, may not allow mobile water to pass through. Thus, relative to the mobile water layer 214, the impermeable layer 216 may have low permeability, e.g., on the order of nanodarcy permeability. Additionally, in this example, the impermeable layer 216 may be a relatively non-ductile (i.e., brittle) geologic formation. One measure of non-ductility is brittleness, which is the ratio of compressive stress to tensile strength. In some examples, the brittleness of the impermeable layer 216 may be between about 20 MPa and 40 MPa.

As shown in this example, the impermeable layer 216 is shallower (e.g., closer to the terranean surface 202) than the storage layer 218. In this example rock formations of which the impermeable layer 216 may be composed include, for example, certain kinds of sandstone, mudstone, clay, and slate that exhibit permeability and brittleness properties as described above. In alternative examples, the impermeable layer 216 may be deeper (e.g., further from the terranean surface 202) than the storage layer 218. In such alternative examples, the impermeable layer 216 may be composed of an igneous rock, such as granite.

Below the impermeable layer 216 is the storage layer 218. The storage layer 218, in this example, may be chosen as the landing for the horizontal portion 210, which stores the hazardous material, for several reasons. Relative to the impermeable layer 216 or other layers, the storage layer 218 may be thick, e.g., between about 100 and 200 feet of total vertical thickness. Thickness of the storage layer 218 may allow for easier landing and directional drilling, thereby allowing the horizontal portion 210 to be readily emplaced within the storage layer 218 during constructions (e.g., drilling). If formed through an approximate horizontal center of the storage layer 218, the horizontal portion 210 may be surrounded by about 50 to 100 feet of the geologic formation that comprises the storage layer 218. Further, the storage layer 218 may also have only immobile water, e.g., due to a very low permeability of the layer 218 (e.g., on the order of milli- or nanodarcys). In addition, the storage layer 218 may have sufficient ductility, such that a brittleness of the rock formation that comprises the layer 218 is between about 3 MPa and 10 MPa. Examples of rock formations of which the storage layer 218 may be composed include: shale and anhydrite. Further, in some aspects, hazardous material may be stored below the storage layer, even in a permeable formation such as sandstone or limestone, if the storage layer is of sufficient geologic properties to isolate the permeable layer from the mobile water layer 214.

In some aspects, the formation of the storage layer 218 and/or the impermeable layer 216 may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years. For example, the barrier layer of the storage layer 218 and/or impermeable layer 216 may be defined by a time constant for leakage of the hazardous material more than 10,000 years (such as between about 10,000 years and 1,000,000 years) based on such evidence of hydrocarbon or other fluid storage.

The present disclosure contemplates that there may be many other layers between or among the illustrated subterranean layers 212, 214, 216, and 218. For example, there may be repeating patterns (e.g., vertically), of one or more of the mobile water layer 214, impermeable layer 216, and storage layer 218. Further, in some instances, the storage layer 218 may be directly adjacent (e.g., vertically) the mobile water layer 214, i.e., without an intervening impermeable layer 216. In some examples, all or portions of the radiussed drillhole 208 and the horizontal drillhole 210 may be formed below the storage layer 218, such that the storage layer 218 (e.g., shale or other geologic formation with characteristics as described herein) is vertically positioned between the horizontal drillhole 210 and the mobile water layer 214.

In this example, the horizontal portion 210 of the drillhole 204 includes a storage area in a distal part of the portion 210 into which hazardous material may be retrievably placed for long-term storage. For example, a work string or tubular 224 (e.g., tubing, coiled tubing, wireline, or otherwise) may be moved into the cased drillhole 204 to circulate (e.g., with a pump, not shown) the radioactive liquid 226 into long term (e.g., permanent) storage in the portion 210.

In some aspects, the drillhole 204 may be formed for the primary purpose of long-term storage of hazardous materials. In alternative aspects, the drillhole 204 may have been previously formed for the primary purpose of hydrocarbon production (e.g., oil, gas). For example, storage layer 218 may be a hydrocarbon bearing formation from which hydrocarbons were produced into the drillhole 204 and to the terranean surface 202. In some aspects, the storage layer 218 may have been hydraulically fractured prior to hydrocarbon production. Further in some aspects, the production casing 222 may have been perforated prior to hydraulic fracturing. In such aspects, the production casing 222 may be patched (e.g., cemented) to repair any holes made from the perforating process prior to a deposit operation of hazardous material. In addition, any cracks or openings in the cement between the casing and the drillhole can also be filled at that time.

As further shown in FIG. 2, a drillhole seal 234 (e.g., permanent packer, plug, or other seal) may be placed in the vertical portion 206 of the drillhole. In some aspects, the tubular 224 may extend through the drillhole seal 234 and, once the radioactive liquid 226 is emplaced, the tubular 224 may be withdrawn and the drillhole seal 234 closed (or another seal put in place) to fluidly isolate the drillhole 204 at the terranean surface 202 from the horizontal portion 210.

In some aspects, one or more of the previously described components of the system 200 may combine to form an engineered barrier of the hazardous waste material repository 200. For example, in some aspects, the engineered barrier is comprised of one, some, or all of the following components: the storage layer 218, the casing 230, and the seal 234. In some aspects, one or more of the engineered barrier components may act (or be engineered to act) to: prevent or reduce corrosion in the drillhole 204, prevent or reduce escape of the hazardous material 232; reduce or prevent thermal degradation of one or more of the other components; and other safety measures to ensure that the hazardous material 232 (within the radioactive liquid 226) does not reach the mobile water layer 214 (or surface layer 212, including the terranean surface 202).

Figure 3:
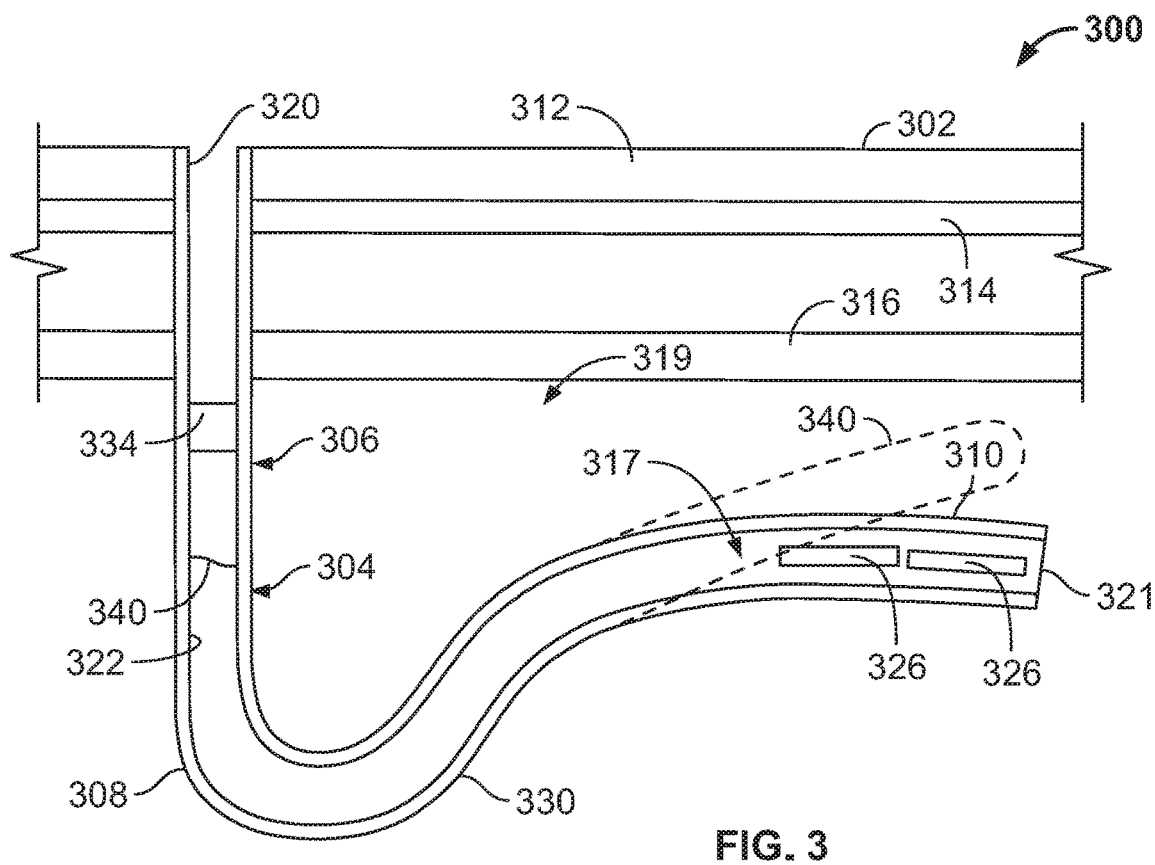
FIG. 3 is a schematic illustration of another example implementation of a hazardous material storage repository that includes an engineered barrier according to the present disclosure.

FIG. 3 is a schematic illustration of another example implementation of a hazardous material storage repository 300 that includes an engineered barrier. In some aspects, one or more components of repository 300 may be similar to components described in reference to the hazardous material repository 100. For example, this figure illustrates an example hazardous material storage repository system 300 after deployment of one or more canisters 326 of hazardous material in a subterranean formation. As illustrated, the hazardous material storage repository system 300 includes a drillhole 304 formed (e.g., drilled or otherwise) from a terranean surface 302 and through multiple subterranean layers 312, 314, and 316. Although the terranean surface 302 is illustrated as a land surface, terranean surface 302 may be a sub-sea or other underwater surface, such as a lake or an ocean floor or other surface under a body of water. Thus, the present disclosure contemplates that the drillhole 304 may be formed under a body of water from a drilling location on or proximate the body of water.

The illustrated drillhole 304 is a directional drillhole in this example of hazardous material storage repository system 300. For instance, the drillhole 304 includes a substantially vertical portion 306 coupled to a J-section portion 308, which in turn is coupled to a substantially horizontal portion 310. The J-section portion 308 as shown, has a shape that resembles the bottom portion of the letter "J" and may be shaped similar to a p-trap device used in a plumbing system that is used to prevent gasses from migrating from one side of the bend to the other side of the bend. As used in the present disclosure, "substantially" in the context of a drillhole orientation, refers to drillholes that may not be exactly vertical (e.g., exactly perpendicular to the terranean surface 302) or exactly horizontal (e.g., exactly parallel to the terranean surface 302), or exactly inclined at a particular incline angle relative to the terranean surface 302. In other words, vertical drillholes often undulate offset from a true vertical direction, that they might be drilled at an angle that deviates from true vertical, and horizontal drillholes often undulate offset from exactly horizontal. The J-section portion 308 is an example of an angled drillhole portion that, e.g., may prevent or help prevent migration of hazardous waste (or subterranean liquid in which leaked hazardous waste has been entrained) from the horizontal portion 310 to the vertical portion 306 of the drillhole 304. An "angled drillhole portion," in this example, is a portion of the drillhole 304 that is angled toward the terranean surface 202 between the vertical portion 306 and the horizontal portion 310 (or the inclined portion 340).

As illustrated in this example, the three portions of the drillhole 304—the vertical portion 306, the J-section portion 308, and the substantially horizontal portion 310—form a continuous drillhole 304 that extends into the Earth. As also shown in dashed line in FIG. 3, the J-section portion 308 may be coupled to an inclined portion 340 rather than (or in addition to) the substantially horizontal portion 310 of the drillhole 304.

The illustrated drillhole 304, in this example, has a surface casing 320 positioned and set around the drillhole 304 from the terranean surface 302 into a particular depth in the Earth. For example, the surface casing 320 may be a relatively large-diameter tubular member (or string of members) set (e.g., cemented) around the drillhole 304 in a shallow formation. In this implementation of the hazardous material storage repository system 300, the surface casing 320 extends from the terranean surface through a surface layer 312. The surface layer 312, in this example, is a geologic layer comprised of one or more layered rock formations. In some aspects, the surface layer 312 in this example may or may not include freshwater aquifers, salt water or brine sources, or other sources of mobile water (e.g., water that moves through a geologic formation). In some aspects, the surface casing 320 may isolate the drillhole 304 from such mobile water, and may also provide a hanging location for other casing strings to be installed in the drillhole 304. Further, although not shown, a conductor casing may be set above the surface casing 320 (e.g., between the surface casing 320 and the surface 302 and within the surface layer 312) to prevent drilling fluids from escaping into the surface layer 312.

As illustrated, a production casing 322 is positioned and set within the drillhole 304 downhole of the surface casing 320. The casing 322 refers to and includes any form of tubular member that is set (e.g., cemented) in the drillhole 304 downhole of the surface casing 320. In some examples of the hazardous material storage repository system 300, the production casing 322 may begin at an end of the J-section portion 308 and extend throughout the substantially horizontal portion 310. The casing 322 could also extend into the J-section portion 308 and into the vertical portion 306.

As shown, cement 330 is positioned (e.g., pumped) around the casings 320 and 322 in an annulus between the casings 320 and 322 and the drillhole 304. The cement 330, for example, may secure the casings 320 and 322 (and any other casings or liners of the drillhole 304) through the subterranean layers under the terranean surface 302. In some aspects, the cement 330 may be installed along the entire length of the casings (e.g., casings 320 and 322 and any other casings), or the cement 330 could be used along certain portions of the casings if adequate for a particular drillhole 302. The cement 330 can also provide an additional layer of confinement for the hazardous material in canisters 326.

The drillhole 304 and associated casings 320 and 322 may be formed with various example dimensions and at various example depths (e.g., true vertical depth, or TVD). For instance, a conductor casing (not shown) may extend down to about 120 feet TVD, with a diameter of between about 28 in. and 60 in. The surface casing 320 may extend down to about 2500 feet TVD, with a diameter of between about 22 in. and 48 in. An intermediate casing (not shown) between the surface casing 320 and production casing 322 may extend down to about 8000 feet TVD, with a diameter of between about 16 in. and 36 in. The production casing 322 may extend inclinedly (e.g., to case the substantially horizontal portion 310 and/or the inclined portion 340) with a diameter of between about 11 in. and 22 in. The foregoing dimensions are merely provided as examples and other dimensions (e.g., diameters, TVDs, lengths) are contemplated by the present disclosure.

As illustrated, the vertical portion 306 of the drillhole 304 extends through subterranean layers 312, 314, and 316, and, in this example, lands in a subterranean layer 319. As discussed above, the surface layer 312 may or may not include mobile water. Subterranean layer 314, which is below the surface layer 312, in this example, is a mobile water layer 314. For instance, mobile water layer 314 may include one or more sources of mobile water, such as freshwater aquifers. salt water or brine, or other source of mobile water. In this example of hazardous material storage repository system 300, mobile water may be water that moves through a subterranean layer based on a pressure differential across all or a part of the subterranean layer.

Other illustrated layers, such as the impermeable layer 316 and the storage layer 319, may include immobile water. Immobile water, in some aspects, is water (e.g., fresh, salt, brine), that is not fit for human or animal consumption, or both. Immobile water, in some aspects, may be water that, by its motion through the layers 316 or 319 (or both), cannot reach the mobile water layer 314, terranean surface 302, or both, within 10,000 years or more (such as to 1,000,000 years).

Below the mobile water layer 314, in this example implementation of hazardous material storage repository system 300, is an impermeable layer 316. The impermeable layer 316, in this example, may not allow mobile water to pass through. Thus, relative to the mobile water layer 314, the impermeable layer 316 may have low permeability, e.g., on the order of 0.01 millidarcy permeability. Additionally, in this example, the impermeable layer 316 may be a relatively non-ductile (i.e., brittle) geologic formation. One measure of non-ductility is brittleness, which is the ratio of compressive stress to tensile strength. In some examples, the brittleness of the impermeable layer 316 may be between about 20 MPa and 40 MPa.

As shown in this example, the impermeable layer 316 is shallower (e.g., closer to the terranean surface 302) than the storage layer 319. In this example rock formations of which the impermeable layer 316 may be composed include, for example, certain kinds of sandstone, mudstone, clay, and slate that exhibit permeability and brittleness properties as described above. In alternative examples, the impermeable layer 316 may be deeper (e.g., further from the terranean surface 302) than the storage layer 319. In such alternative examples, the impermeable layer 316 may be composed of an igneous rock, such as granite.

Below the impermeable layer 316 is the storage layer 319. The storage layer 319, in this example, may be chosen as the landing for the substantially horizontal portion 310, which stores the hazardous material, for several reasons. Relative to the impermeable layer 316 or other layers, the storage layer 319 may be thick, e.g., between about 100 and 200 feet of total vertical thickness. Thickness of the storage layer 319 may allow for easier landing and directional drilling, thereby allowing the substantially horizontal portion 310 to be readily emplaced within the storage layer 319 during constructions (e.g., drilling). If formed through an approximate horizontal center of the storage layer 319, the substantially horizontal portion 310 may be surrounded by about 50 to 100 feet of the geologic formation that comprises the storage layer 319. Further, the storage layer 319 may also have only immobile water, e.g., due to a very low permeability of the layer 319 (e.g., on the order of milli- or nanodarcys). In addition, the storage layer 319 may have sufficient ductility, such that a brittleness of the rock formation that comprises the layer 319 is between about 3 MPa and 10 MPa. Examples of rock formations of which the storage layer 319 may be composed include: shale and anhydrite. Further, in some aspects, hazardous material may be stored below the storage layer, even in a permeable formation such as sandstone or limestone, if the storage layer is of sufficient geologic properties to isolate the permeable layer from the mobile water layer 314. In some examples implementations of the hazardous material storage repository system 300, the storage layer 319 (and/or the impermeable layer 316) is composed of shale.

In some aspects, the formation of the storage layer 319 and/or the impermeable layer 316 may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years. For example, the barrier layer of the storage layer 319 and/or impermeable layer 316 may be defined by a time constant for leakage of the hazardous material of more than 10,000 years (such as between 10,000 years and 1,000,000 years) based on such evidence of hydrocarbon or other fluid storage.

The present disclosure contemplates that there may be many other layers between or among the illustrated subterranean layers 312, 314, 316, and 319. For example, there may be repeating patterns (e.g., vertically), of one or more of the mobile water layer 314, impermeable layer 316, and storage layer 319. Further, in some instances, the storage layer 319 may be directly adjacent (e.g., vertically) the mobile water layer 314, i.e., without an intervening impermeable layer 316. In some examples, all or portions of the J-section drillhole 308 and the substantially horizontal portion 310 (and/or the inclined portion 340) may be formed below the storage layer 319, such that the storage layer 319 (e.g., shale or other geologic formation with characteristics as described herein) is vertically positioned between the substantially horizontal portion 310 (and/or the inclined portion 340) and the mobile water layer 314.

As shown in this example, the substantially horizontal portion 310 of the drillhole 304 includes a storage area 317 in a distal part of the portion 310 into which hazardous material may be retrievably placed for long-term storage. For example, a work string (e.g., tubing, coiled tubing, wireline, or otherwise) or downhole tractor may be moved into the cased drillhole 304 to place one or more hazardous material canisters 326 into long term, but in some aspects, retrievable, storage in the portion 310.

Each canister 326 may enclose hazardous material, such as radioactive material. Examples of radioactive material include spent nuclear fuel and high level waste, e.g., in solid form, as well as radioactive liquid, such as radioactive water.

In some aspects, the storage layer 319 should be able to contain any radioactive output (e.g., gases) within the layer 319, even if such output escapes the canisters 326. For example, the storage layer 319 may be selected based on diffusion times of radioactive output through the layer 319. For example, a minimum diffusion time of radioactive output escaping the storage layer 319 may be set at, for example, fifty times a half-life for any particular component of the nuclear fuel pellets. Fifty half-lives as a minimum diffusion time would reduce an amount of radioactive output by a factor of $1 \times 10^{-15}$. As another example, setting a minimum diffusion time to thirty half-lives would reduce an amount of radioactive output by a factor of one billion.

As further shown in FIG. 3, the storage canisters 326 may be positioned for long term storage in the substantially horizontal portion 310, which, as shown, is coupled to the vertical portion 106 of the drillhole 104 through the J-section portion 308. As illustrated, the J-section portion 308 includes an upwardly directed portion angled toward the terranean surface 302. In some aspects, for example when there is radioactive hazardous material stored in the canisters 326, this inclination of the J-section portion 308 (and inclination of the inclined portion 340, if formed) may provide a further degree of safety and containment to prevent or impede the material, even if leaked from the canister 326, from reaching, e.g., the mobile water layer 314, the vertical portion 306 of the drillhole 304, the terranean surface 302, or a combination thereof. For example, radionuclides of concern in the hazardous material tend to be relatively buoyant or heavy (as compared to other components of the material). Buoyant radionuclides may be the greatest concern for leakage, since heavy elements and molecules tend to sink, and would not diffuse upward towards the terranean surface 302. Krypton gas, and particularly krypton-85, is a buoyant radioactive element that is heavier than air (as are most gases) but much lighter than water. Thus, should krypton-85 be introduced into a water bath, such gas would tend to float upward towards the terranean surface 302. Iodine, on the other hand, is denser than water, and would tend to diffuse downward if introduced into a water bath.

By including the J-section portion 308 of the drillhole 304, any such diffusion of radioactive material (e.g., even if leaked from a canister 326 and in the presence of water or other liquid in the drillhole 304 or otherwise) would be directed angularly upward toward the substantially horizontal portion 310, and more specifically, toward a distal end 321 of the substantially horizontal portion 310 and away from the J-section portion 308 (and the vertical portion 306) of the drillhole 304. Thus, leaked hazardous material, even in a diffusible gas form, would not be offered a path (e.g., directly) to the terranean surface 302 (or the mobile water layer 314) through the vertical portion 306 of the drillhole 310. For instance, the leaked hazardous material (especially in gaseous form) would be directed and gathered at the distal end 321 of the drillhole portion 310, or, generally, within the substantially horizontal portion 310 of the drillhole 304.

In some aspects, the drillhole 304 may be formed for the primary purpose of long-term storage of hazardous materials. In alternative aspects, the drillhole 304 may have been previously formed for the primary purpose of hydrocarbon production (e.g., oil, gas). For example, storage layer 319 may be a hydrocarbon bearing formation from which hydrocarbons were produced into the drillhole 304 and to the terranean surface 302. In some aspects, the storage layer 319 may have been hydraulically fractured prior to hydrocarbon production. Further in some aspects, the production casing 322 may have been perforated prior to hydraulic fracturing. In such aspects, the production casing 322 may be patched (e.g., cemented) to repair any holes made from the perforating process prior to a deposit operation of hazardous material. In addition, any cracks or openings in the cement between the casing and the drillhole can also be filled at that time.

As further shown in FIG. 3, a backfill material 340 may be positioned or circulated into the drillhole 304. In this example, the backfill material 340 surrounds the canisters 326 and may have a level that extends uphole to at or near a drillhole seal 334 (e.g., permanent packer, plug, or other seal). In some aspects, the backfill material 340 may absorb radioactive energy (e.g., gamma rays or other energy). In some aspects, the backfill material 340 may have a relatively low thermal conductivity, thereby acting as an insulator between the canisters 326 and the casings.

Another backfill material (such as material 150 shown in FIG. 1) may be positioned or placed within one or more of the canisters 326 to surround the hazardous material within the canisters. In some aspects. such a backfill material may absorb radioactive energy (e.g., gamma rays or other energy). In some aspects, such a backfill material may have a relatively low thermal conductivity, thereby acting as an insulator between the hazardous material and the canister 326. In some aspects, such a backfill material may also provide a stiffening attribute to the canister 326, e.g., reducing crushability, deformation, or other damage to the canister 326.

In some aspects, one or more of the previously described components of the system 100 may combine to form an engineered barrier of the hazardous waste material repository 300. For example, in some aspects, the engineered barrier is comprised of one, some, or all of the following components: the storage layer 319, the casing 330, the backfill material 340, the canister 326, the backfill material in canister 326, the seal 334, and the hazardous material within the canister 326, itself. In some aspects, one or more of the engineered barrier components may act (or be engineered to act) to: prevent or reduce corrosion in the drillhole 304, prevent or reduce escape of the hazardous material; reduce or prevent thermal degradation of one or more of the other components; and other safety measures to ensure that the hazardous material does not reach the mobile water layer 314 (or surface layer 312, including the terranean surface 302).

Figure 4:
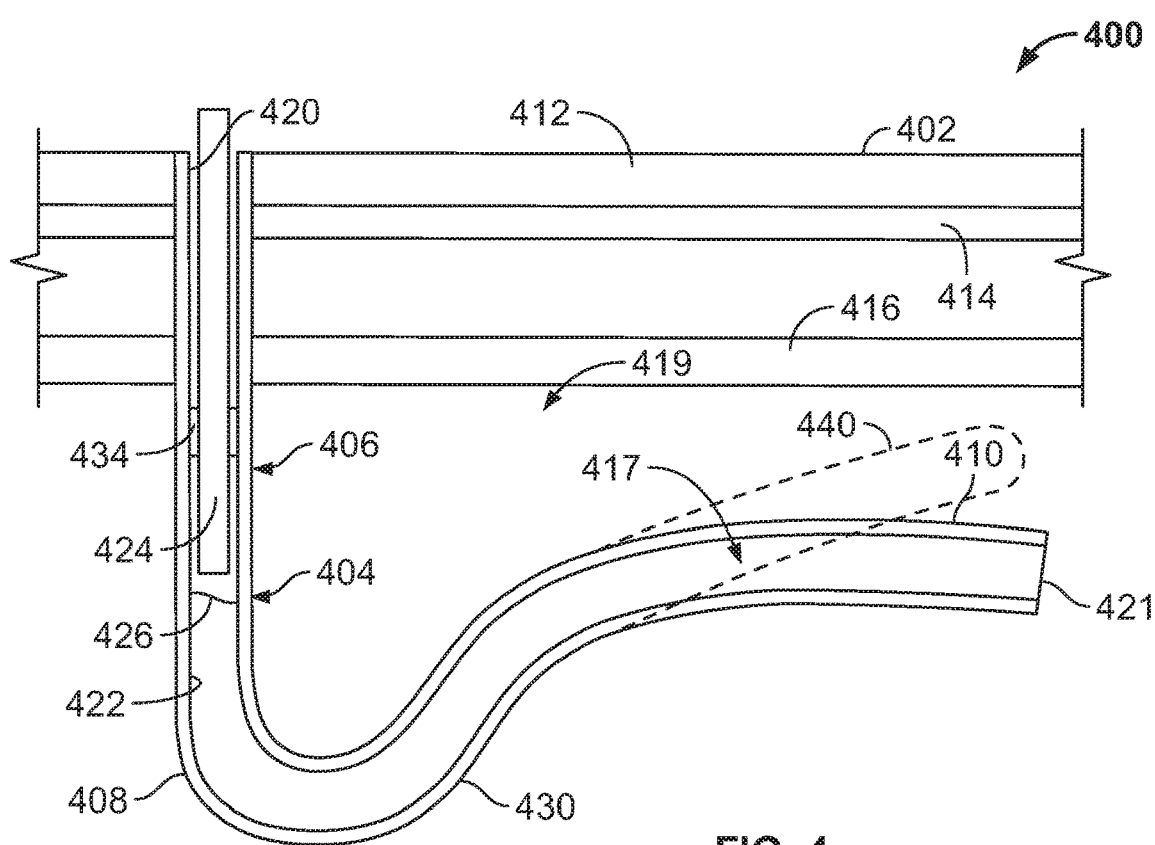
FIG. 4 is a schematic illustration of another example implementation of a hazardous material storage repository for radioactive liquid according to the present disclosure.

FIG. 4 is a schematic illustration of another example implementation of a hazardous material storage repository 400 for radioactive liquid. In some aspects, one or more components of repository 300 may be similar to components described in reference to the hazardous material repositories 200 and 300. For example, this figure illustrates the example hazardous material storage repository system 400 once (or as) a volume of radioactive liquid 426 that includes hazardous material (e.g., radioactive solid material, such as material 232 in FIG. 2) is provided to a horizontal portion 410 of a drillhole 404. As illustrated, the hazardous material storage repository system 400 includes the drillhole 404 formed (e.g., drilled or otherwise) from a terranean surface 402 and through multiple subterranean layers 412, 414, 416, and 419. Although the terranean surface 402 is illustrated as a land surface, terranean surface 402 may be a sub-sea or other underwater surface, such as a lake or an ocean floor or other surface under a body of water. Thus, the present disclosure contemplates that the drillhole 404 may be formed under a body of water from a drilling location on or proximate the body of water.

The illustrated drillhole 404 is a directional drillhole in this example of hazardous material storage repository system 400. For instance, the drillhole 404 includes a substantially vertical portion 406 coupled to a J-section portion 408, which in turn is coupled to a substantially horizontal portion 410. The J-section portion 408 as shown, has a shape that resembles the bottom portion of the letter "J" and may be shaped similar to a p-trap device used in a plumbing system that is used to prevent gasses from migrating from one side of the bend to the other side of the bend. The J-section portion 408 is an example of an angled drillhole portion that, e.g., may prevent or help prevent migration of hazardous waste (or subterranean liquid in which leaked hazardous waste has been entrained) from the horizontal portion 410 to the vertical portion 406 of the drillhole 404. An "angled drillhole portion," in this example, is a portion of the drillhole 404 that is angled toward the terranean surface 402 between the vertical portion 406 and the horizontal portion 410 (or the inclined portion 440).

As illustrated in this example, the three portions of the drillhole 404—the vertical portion 406, the J-section portion 408, and the substantially horizontal portion 410—form a continuous drillhole 404 that extends into the Earth. As also shown in dashed line in FIG. 4, the J-section portion 408 may be coupled to an inclined portion 440 rather than (or in addition to) the substantially horizontal portion 410 of the drillhole 404.

The illustrated drillhole 404, in this example, has a surface casing 420 positioned and set around the drillhole 404 from the terranean surface 402 into a particular depth in the Earth. For example, the surface casing 420 may be a relatively large-diameter tubular member (or string of members) set (e.g., cemented) around the drillhole 404 in a shallow formation. In this implementation of the hazardous material storage repository system 400, the surface casing 420 extends from the terranean surface through a surface layer 412. The surface layer 412, in this example, is a geologic layer comprised of one or more layered rock formations. In some aspects, the surface layer 412 in this example may or may not include freshwater aquifers, salt water or brine sources, or other sources of mobile water (e.g., water that moves through a geologic formation). In some aspects, the surface casing 420 may isolate the drillhole 404 from such mobile water, and may also provide a hanging location for other casing strings to be installed in the drillhole 404. Further, although not shown, a conductor casing may be set above the surface casing 420 (e.g., between the surface casing 420 and the surface 402 and within the surface layer 412) to prevent drilling fluids from escaping into the surface layer 412.

As illustrated, a production casing 422 is positioned and set within the drillhole 404 downhole of the surface casing 420. The casing 422 refers to and includes any form of tubular member that is set (e.g., cemented) in the drillhole 404 downhole of the surface casing 420. In some examples of the hazardous material storage repository system 400, the production casing 422 may begin at an end of the J-section portion 408 and extend throughout the substantially horizontal portion 410. The casing 422 could also extend into the J-section portion 408 and into the vertical portion 406.

As shown, cement 430 is positioned (e.g., pumped) around the casings 420 and 422 in an annulus between the casings 420 and 422 and the drillhole 404. The cement 430, for example, may secure the casings 420 and 422 (and any other casings or liners of the drillhole 404) through the subterranean layers under the terranean surface 402. In some aspects, the cement 430 may be installed along the entire length of the casings (e.g., casings 420 and 422 and any other casings), or the cement 430 could be used along certain portions of the casings if adequate for a particular drillhole 402. The cement 430 can also provide an additional layer of confinement for the radioactive liquid 426.

As illustrated, the vertical portion 406 of the drillhole 404 extends through subterranean layers 412, 414, and 416, and, in this example, lands in a subterranean layer 419. As discussed above, the surface layer 412 may or may not include mobile water. Subterranean layer 414, which is below the surface layer 412, in this example, is a mobile water layer 414. For instance, mobile water layer 414 may include one or more sources of mobile water, such as freshwater aquifers, salt water or brine, or other source of mobile water. In this example of hazardous material storage repository system 400, mobile water may be water that moves through a subterranean layer based on a pressure differential across all or a part of the subterranean layer.

Other illustrated layers, such as the impermeable layer 416 and the storage layer 419, may include immobile water. Immobile water, in some aspects, is water (e.g., fresh, salt, brine), that is not fit for human or animal consumption, or both. Immobile water, in some aspects, may be water that, by its motion through the layers 416 or 419 (or both), cannot reach the mobile water layer 414, terranean surface 402, or both, within 10,000 years or more (such as to 1,000,000 years).

Below the mobile water layer 414, in this example implementation of hazardous material storage repository system 400, is an impermeable layer 416. The impermeable layer 416, in this example, may not allow mobile water to pass through. Thus, relative to the mobile water layer 414, the impermeable layer 416 may have low permeability, e.g., on the order of 0.01 millidarcy permeability. Additionally, in this example, the impermeable layer 416 may be a relatively non-ductile (i.e., brittle) geologic formation. One measure of non-ductility is brittleness, which is the ratio of compressive stress to tensile strength. In some examples, the brittleness of the impermeable layer 416 may be between about 20 MPa and 40 MPa.

As shown in this example, the impermeable layer 416 is shallower (e.g., closer to the terranean surface 402) than the storage layer 419. In this example rock formations of which the impermeable layer 416 may be composed include, for example, certain kinds of sandstone, mudstone, clay, and slate that exhibit permeability and brittleness properties as described above. In alternative examples, the impermeable layer 416 may be deeper (e.g., further from the terranean surface 402) than the storage layer 419. In such alternative examples, the impermeable layer 416 may be composed of an igneous rock, such as granite.

Below the impermeable layer 416 is the storage layer 419. The storage layer 419, in this example, may be chosen as the landing for the substantially horizontal portion 410, which stores the hazardous material, for several reasons. Relative to the impermeable layer 416 or other layers, the storage layer 419 may be thick, e.g., between about 100 and 200 feet of total vertical thickness. Thickness of the storage layer 419 may allow for easier landing and directional drilling, thereby allowing the substantially horizontal portion 410 to be readily emplaced within the storage layer 419 during constructions (e.g., drilling). If formed through an approximate horizontal center of the storage layer 419, the substantially horizontal portion 410 may be surrounded by about 50 to 100 feet of the geologic formation that comprises the storage layer 419. Further, the storage layer 419 may also have only immobile water, e.g., due to a very low permeability of the layer 419 (e.g., on the order of milli- or nanodarcys). In addition, the storage layer 419 may have sufficient ductility, such that a brittleness of the rock formation that comprises the layer 419 is between about 3 MPa and 10 MPa. Examples of rock formations of which the storage layer 419 may be composed include: shale and anhydrite. Further, in some aspects, hazardous material may be stored below the storage layer, even in a permeable formation such as sandstone or limestone, if the storage layer is of sufficient geologic properties to isolate the permeable layer from the mobile water layer 414. In some examples implementations of the hazardous material storage repository system 400, the storage layer 419 (and/or the impermeable layer 416) is composed of shale.

In some aspects, the formation of the storage layer 419 and/or the impermeable layer 416 may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years. For example, the barrier layer of the storage layer 419 and/or impermeable layer 416 may be defined by a time constant for leakage of the hazardous material of more than 10,000 years (such as between 10,000 years and 1,000,000 years) based on such evidence of hydrocarbon or other fluid storage.

The present disclosure contemplates that there may be many other layers between or among the illustrated subterranean layers 412, 414, 416, and 419. For example, there may be repeating patterns (e.g., vertically), of one or more of the mobile water layer 414, impermeable layer 416, and storage layer 419. Further, in some instances, the storage layer 419 may be directly adjacent (e.g., vertically) the mobile water layer 414, i.e., without an intervening impermeable layer 416. In some examples, all or portions of the J-section drillhole 408 and the substantially horizontal portion 410 (and/or the inclined portion 440) may be formed below the storage layer 419, such that the storage layer 419 (e.g., shale or other geologic formation with characteristics as described herein) is vertically positioned between the substantially horizontal portion 410 (and/or the inclined portion 440) and the mobile water layer 414.

As shown in this example, the substantially horizontal portion 410 of the drillhole 404 includes a storage area 417 in a distal part 421 of the portion 410 into which hazardous material may be retrievably placed for long-term storage. For example, a work string or tubular 424 (e.g., tubing, coiled tubing, or otherwise) may be moved into the cased drillhole 404 circulate (e.g., with a pump, not shown) the radioactive liquid 426 into long term (e.g., permanent) storage in the portion 410.

In some aspects, the storage layer 419 should be able to contain any radioactive output (e.g., gases) within the layer 419. For example, the storage layer 419 may be selected based on diffusion times of radioactive output through the layer 419. For example, a minimum diffusion time of radioactive output escaping the storage layer 419 may be set at, for example, fifty times a half-life for any particular component of the nuclear fuel pellets. Fifty half-lives as a minimum diffusion time would reduce an amount of radioactive output by a factor of $1 \times 10^{-15}$. As another example, setting a minimum diffusion time to thirty half-lives would reduce an amount of radioactive output by a factor of one billion.

In some aspects, the drillhole 404 may be formed for the primary purpose of long-term storage of hazardous materials. In alternative aspects, the drillhole 404 may have been previously formed for the primary purpose of hydrocarbon production (e.g., oil, gas). For example, storage layer 419 may be a hydrocarbon bearing formation from which hydrocarbons were produced into the drillhole 404 and to the terranean surface 402. In some aspects, the storage layer 419 may have been hydraulically fractured prior to hydrocarbon production. Further in some aspects, the production casing 422 may have been perforated prior to hydraulic fracturing. In such aspects, the production casing 422 may be patched (e.g., cemented) to repair any holes made from the perforating process prior to a deposit operation of hazardous material. In addition, any cracks or openings in the cement between the casing and the drillhole can also be filled at that time.

As further shown in FIG. 4, a drillhole seal 434 (e.g., permanent packer, plug, or other seal) may be placed in the vertical portion 406 of the drillhole. In some aspects, the tubular 424 may extend through the drillhole seal 434 and, once the radioactive liquid 426 is emplaced, the tubular 424 may be withdrawn and the drillhole seal 434 closed (or another seal put in place) to fluidly isolate the drillhole 404 at the terranean surface 402 from the horizontal portion 410.

In some aspects, one or more of the previously described components of the system 400 may combine to form an engineered barrier of the hazardous waste material repository 400. For example, in some aspects, the engineered barrier is comprised of one, some, or all of the following components: the storage layer 419, the casing 422, the cement 430, and the seal 234. In some aspects, one or more of the engineered barrier components may act (or be engineered to act) to: prevent or reduce corrosion in the drillhole 404, prevent or reduce escape of the hazardous material within the radioactive liquid 426; reduce or prevent thermal degradation of one or more of the other components; and other safety measures to ensure that the hazardous material (within the radioactive liquid 426) does not reach the mobile water layer 414 (or surface layer 412, including the terranean surface 402).

In some aspects, one or more of the previously described components of the system 100 may combine to form an engineered barrier of the hazardous waste material repository 400. For example, in some aspects, the engineered barrier is comprised of one, some, or all of the following components: the storage layer 419, the casing 430, the backfill material 440, the canister 426, the backfill material in canister 426, the seal 434, and the hazardous material within the canister 426, itself. In some aspects, one or more of the engineered barrier components may act (or be engineered to act) to: prevent or reduce corrosion in the drillhole 404, prevent or reduce escape of the hazardous material; reduce or prevent thermal degradation of one or more of the other components; and other safety measures to ensure that the hazardous material does not reach the mobile water layer 414 (or surface layer 412, including the terranean surface 402).

Figure 5A:
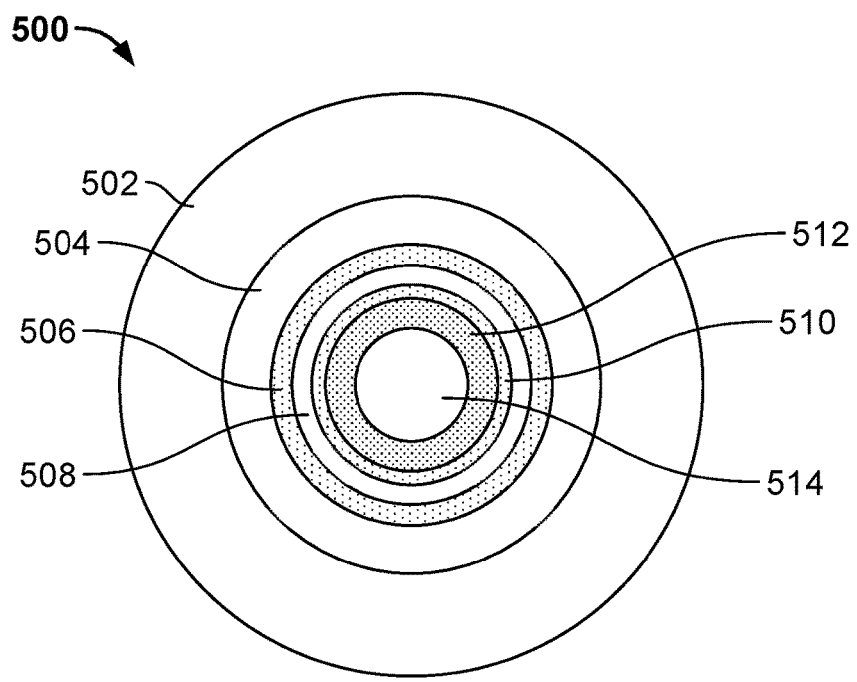
FIGS. 5A-5B are schematic cross-sectional illustrations of an engineered barrier for a hazardous material storage repository according to the present disclosure.

Turning briefly to FIG. 5A, this figures illustrates a radial cross-section of an example engineered barrier (or engineered barrier system) 500 for a radioactive (e.g., hazardous) material repository, such as, for example hazardous material repository 100. In this example, the engineered barrier system 500 includes a host rock formation 502. The host rock formation 502 (e.g., storage layer 118) may be selected due to, e.g., permeability, ductility, or other geological criteria that allows the formation 502 to fluidly isolate gasses or liquids from other formations. The engineered barrier system 500 also includes a cement 504 and casing 506. The cement 504 binds or helps bind the casing 506 (e.g., a steel casing or otherwise) to the rock formation 502. The example engineered barrier system 500 also includes a backfill material 508 (e.g., backfill material 140) that fills an annular space between the casing 506 and a canister housing 510. The canister housing 510 defines a volume in which hazardous material is enclosed and may be formed, for example, from a corrosion resistant material, such as a metal alloy. A canister backfill 512 is also part of this example engineered barrier system 500. The canister backfill 512 (like the backfill material 508) may, e.g., absorb or partly absorb radioactive energy (e.g., gamma rays) and be a non-conductive thermal material. Lastly, this example engineered barrier system 500 includes the radioactive material 514, which may be processed or formed to reduce or eliminate a possibility of escape or leakage from the canister housing 510.

Figure 5B:
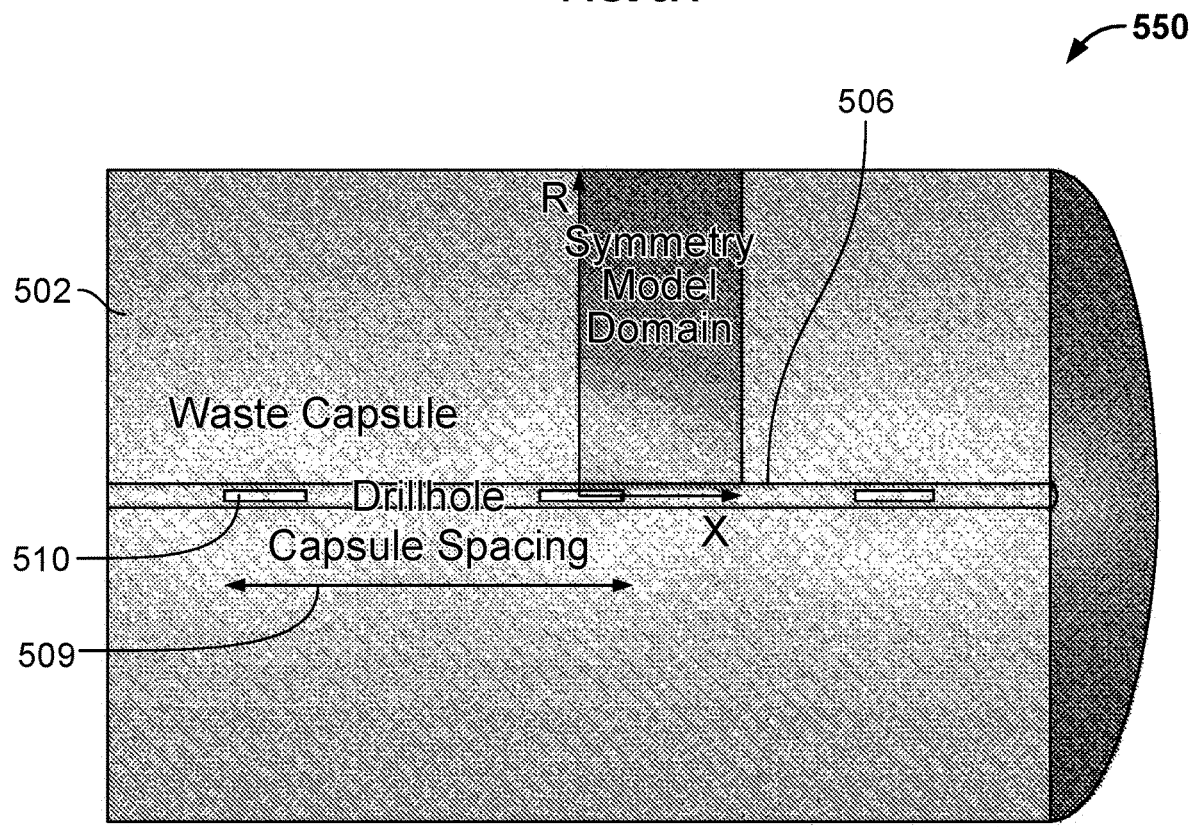

Turning briefly to FIG. 5B, this figure illustrates another view of a portion 550 of engineered barrier system 500. As shown in this example, canister housings 510 are spaced apart in a drillhole formed in the rock formation 502. The casing 506 separates the drillhole from the formation 502. As shown in this example, the canister housings 510 that enclose the radioactive material 514, such that heat from each canister housing 510 (due to thermal output from the radioactive material 514) is spread out along the drillhole.

Referring generally to the present disclosure, the example hazardous material storage repository systems (e.g., 100, 200, 300, and 400) may provide for multiple layers of containment as an engineered barrier system to ensure that a hazardous material (e.g., biological, chemical, nuclear) is sealingly stored in an appropriate subterranean layer. In some example implementations, there may be at least twelve layers of containment. In alternative implementations, a fewer or a greater number of containment layers may be employed.

First. using spent nuclear fuel as an example hazardous material, the fuel pellets are taken from the reactor and not modified. They may be made from sintered uranium dioxide ($UO_2$), a ceramic, and may remain solid and emit a variety of radioactive gases including tritium (13 year half-life), krypton-85 (10.8 year half-life), and carbon dioxide containing C-14 (5730 year half-life). Unless the pellets are exposed to extremely corrosive conditions or other effects that damage the multiple layers of containment, most of the radioisotopes (including the C-14, tritium or krypton-85) will be contained in the pellets.

Second, the fuel pellets are surrounded by the zircaloy tubes of the fuel rods, just as in the reactor. As described, the tubes could be mounted in the original fuel assemblies, or removed from those assemblies for tighter packing.

Third, the tubes are placed in the sealed housings of the hazardous material canister. The housing may be a unified structure or multi-panel structure, with the multiple panels (e.g., sides, top, bottom) mechanically fastened (e.g., screws, rivets, welds, and otherwise).

Fourth, a material (e.g., solid or fluid) may fill the hazardous material canister to provide a further buffer between the material and the exterior of the canister.

Fifth, the hazardous material canister(s) are positioned, in a drillhole that is lined with a steel or other sealing casing that extends, in some examples, throughout the entire drillhole (e.g., a substantially vertical portion, a radiussed portion, and a inclined portion). The casing is cemented in place, providing a relatively smooth surface (e.g., as compared to the drillhole wall) for the hazardous material canister to be moved through, thereby reducing the possibility of a leak or break during deposit or retrieval.

Sixth, the cement that holds or helps hold the casing in place, may also provide a sealing layer to contain the hazardous material should it escape the canister.

Seventh, the hazardous material canister is stored in a portion of the drillhole (e.g., the inclined portion) that is positioned within a thick (e.g., 100-200 feet) seam of a rock formation that comprises a storage layer. The storage layer may be chosen due at least in part to the geologic properties of the rock formation (e.g., only immobile water, low permeability, thick, appropriate ductility or non-brittleness). For example, in the case of shale as the rock formation of the storage layer, this type of rock may offers a level of containment since it is known that shale has been a seal for hydrocarbon gas for millions of years. The shale may contain brine, but that brine is demonstrably immobile, and not in communication with surface fresh water.

Eighth, in some aspects, the rock formation of the storage layer may have other unique geological properties that offer another level of containment. For example, shale rock often contains reactive components, such as iron sulfide, that reduce the likelihood that hazardous materials (e.g., spent nuclear fuel and its radioactive output) can migrate through the storage layer without reacting in ways that reduce the diffusion rate of such output even further. Further, the storage layer may include components, such as clay and organic matter, that typically have extremely low diffusivity. For example, shale may be stratified and composed of thinly alternating layers of clays and other minerals. Such a stratification of a rock formation in the storage layer, such as shale, may offer this additional layer of containment.

Ninth, the storage layer may be located deeper than, and under, an impermeable layer, which separates the storage layer (e.g., vertically) from a mobile water layer.

Tenth, the storage layer may be selected based on a depth (e.g., 3000 to 12,000 ft.) of such a layer within the subterranean layers. Such depths are typically far below any layers that contain mobile water, and thus, the sheer depth of the storage layer provides an additional layer of containment.

Eleventh, example implementations of the hazardous material storage repository system of the present disclosure facilitate monitoring of the stored hazardous material. For example, if monitored data indicates a leak or otherwise of the hazardous material (e.g., change in temperature, radioactivity, or otherwise), or even tampering or intrusion of the canister, the hazardous material canister may be retrieved for repair or inspection.

Twelfth, the one or more hazardous material canisters may be retrievable for periodic inspection, conditioning, or repair, as necessary (e.g., with or without monitoring). Thus, any problem with the canisters may be addressed without allowing hazardous material to leak or escape from the canisters unabated.

Thirteenth, even if hazardous material escaped from the canisters and no impermeable layer was located between the leaked hazardous material and the terranean surface, the leaked hazardous material may be contained within the drillhole at a location that has no upward path to the surface or to aquifers (e.g., mobile water layers) or to other zones that would be considered hazardous to humans. For example, the location, which may be a dead end of an inclined drillhole, a J-section drillhole, or peaks of a vertically undulating drillhole, may have no direct upward (e.g., toward the surface) path to a vertical portion of the drillhole.

Analysis of Engineered Barriers for Radioactive Material Repositories.

The present disclosure describes an analysis of engineered barriers (or, engineered barrier systems (EBS)) as part of one or more of the repositories 100, 200, 300 and 400. The present disclosure also describes EBS corrosion performance. EBS corrosion performance is analyzed for disposal of, e.g., spent nuclear fuel and other high-level nuclear waste in deep horizontal drillholes (such as drillhole 104), and aspects of the EBS design are related to corrosion performance. Time periods set duration and environmental conditions to follow the evolution of the environment over 10,000 years once the hazardous material (in the canister) has been emplaced. The first 20 years covers the heat-up to maximum temperature, start of cool-down and transition from moderately oxidizing the anaerobic conditions. An EBS may be designed to make it through the aggressive, initial period and enter the anaerobic period in a condition to survive for tens of thousands of years. In some aspects, the EBS is defined with a corrosion resistant Ni—Cr—Mo alloy as the canisters and carbon steel casing. Time-temperature behavior is from thermal simulation. Results include metal loss and time-to-perforation for canisters and casing along with amounts of hydrogen generated and metal oxide formed for each time period. Time for the first perforation of a canister with 9.5-mm wall is 45,000 years. The steel casing is a barrier between environment inside and outside of the casing for nearly 3,000 years. Volume of hydrogen and metal oxide formed track corrosion rate of the metals. Design considerations relate to favorable aspects of the environment: reducing environment, fully saturated rock, no boiling and no wet-dry-wet cycle.

The material, as described, is disposed in horizontal drillholes, e.g., in sedimentary rock that overlies basement rock, although metamorphic rock can also be used. The EBS in this example represents the engineered materials placed within the repository, including the hazardous material form, hazardous material canisters, buffer materials, backfill, and seals. The hazardous material is sealed in canisters that are emplaced along a steel casing in the horizontal drillhole. Canisters are a non-permeable, absolute barrier to radionuclide transport until they are breached. A steel casing aids in canister emplacement, provides structural support, and is a barrier to radionuclide transport until perforated.

Corrosion is a risk for perforation of the canister and controls the degradation of casing. Corrosion behaviors of canisters and casing are contributors to the performance of the engineered barrier system and the control of radionuclide transport. For safe and reliable performance, canisters may need to be made of highly corrosion resistant metal for long-term containment of the waste. For the example here, canisters are made of nickel-chromium-molybdenum (Ni—Cr—Mo) alloys, a family of alloys that have excellent corrosion resistance over a wide range of environments. In a reducing environment, the time-to-perforation for a Ni—Cr—Mo canister with a wall thickness 1-cm is 50,000 years. Casing may be made of carbon steel to aid in canister emplacement, provide structural strength, and separate the inside casing environment from the outside casing environment until the casing is perforated.

The objectives of this analysis are to analyze the corrosion performance of the EBS for a base case configuration and relate aspects of the EBS design to corrosion performance. The long-term corrosion behavior of canisters and casing from emplacement through 10,000 years was divided into five time periods to track evolution of the drillhole environment. Corrosion rates of metals were set for the drillhole environment of each period. Calculations were made for corrosion reactions of metal and water to form metal oxides and hydrogen. Results include metal loss and time-to-perforation for canisters and casing along with amounts of hydrogen generated and metal oxide formed for each time period and overall.

Nuclear waste disposal in deep horizontal drillholes is suitable for a variety of waste types, where canister size is designed to accommodate the specific fuel type. For disposal of cesium/strontium capsules (a form of legacy waste from the United States' nuclear defense programs), the canisters are on the order of 12-cm diameter and 60-cm long. For spent nuclear fuel assemblies, larger diameter and longer canisters each may hold one fuel assembly. The waste is placed within a metal cylinder with an end plate attached, and the other endplate is positioned and sealed. The sealed canister is lowered through the vertical drillhole section and emplaced in the casing along the horizontal disposal section.

Corrosion behavior is determined by the combination of corrosion resistance of the alloy and corrosivity of the environment. The mode of corrosion is general corrosion. The environment in fully saturated rock evolves from a transition stage with high temperature, moderately oxidizing waters to ambient temperature, highly reducing waters. The waters are brines and can have multiple dissolved species with a range of concentrations. Chloride brines are typical. Ambient temperature at the horizontal disposal section is higher than at the surface and depends upon the depth. Temperature rises from the residual decay heat emanating from the waste forms and then decreases as the waste decays. Heating to maximum temperature and start of cool down occurs within 5-10 years after canister emplacement. The maximum temperature of the canister wall is 170° C. A 40-year thermal heat-up and cool-down period is followed by a slow cool-down to the ambient temperature of 60° C. at 1 km drillhole depth.

An example case analyzed here is for disposal of cesium/strontium capsules. The case is hypothetical, but it is representative of the configuration of the EBS, arrangement of the drillhole and geology of the host rock for an actual disposal project. A short segment of the horizontal drillhole is analyzed. This segment can be scaled up for the full number of capsules for disposal and total length of the disposal section. Each waste capsule is sealed in a corrosion resistant alloy canister. The configuration comprises ten canisters, 0.6-m long×11.4-cm outer diameter×9.5 mm wall thickness. Canisters are emplaced along a steel casing, 12-m long×14-cm inner dimeter×12.5 mm wall thickness. The separation between canisters along the steel casing is 0.6-m. Outer diameter of the casing is 16.5 cm, and drillhole diameter is 21.6 cm. The depth of the horizontal section is at 1 km with ambient conditions of 10 MPa hydrostatic pressure and 60° C. temperature.

The metal canisters are made of highly corrosion-resistant Ni—Cr—Mo alloy. The Ni—Cr—Mo alloys have high strength, excellent fabricability along with outstanding corrosion resistance. These alloys are also highly resistant to localized corrosion processes. For analysis, Alloy 625 (UNS N06625) with composition of major elements of Ni-60 w/o, Cr-27 w/o and Mo-6 w/o represents the Ni—Cr—Mo family of alloys. The full composition in weight percent and atomic percent is presented in Table 1 as shown in FIG. 14A.

The casing is made of API-5CT L80 Casing Pipe which belongs to a steel grades group of corrosion resistant casing. The composition of L80 steel in weight percent and atomic percent is Fe-87 w/o and Cr-13 w/o and Fe-85 at/o and Cr-15 at/o, respectively.

Figure 5C:
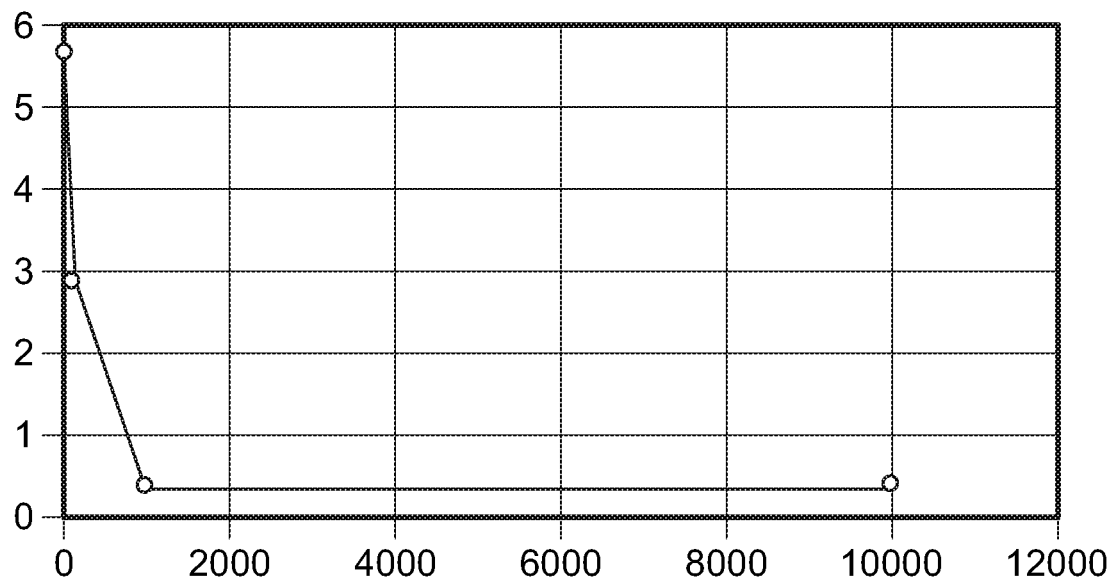
FIGS. 5C-5F are graphical representations of one or more metrics or criteria of an engineered barrier for a hazardous material storage repository according to the present disclosure.
Figure 5D:
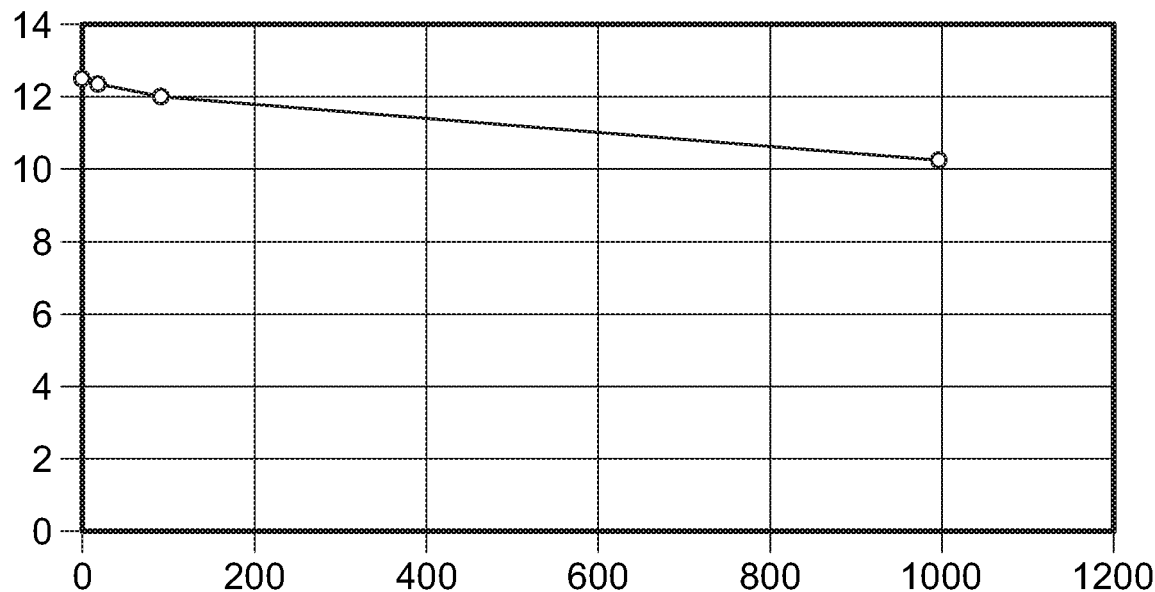

Metal loss and depth of penetration were calculated from corrosion rate and time of exposure. The product of corrosion rate and time of exposure determines the depth of metal penetration and remaining wall thickness. FIG. 5D shows graph 572 that relates casing wall thickness (millimeters, y-axis) over time (years, x-axis). The corrosion rate, time of exposure and surface area of the canisters determine the volume of metal corroded. The density of Alloy 625 is 8.44 g/cm$^3$ and of L80 steel is 7.44 g/cm$^3$. Note that values for corrosion rate in microns per year (µm/year) are equivalent to volume of metal loss (cm$^3$/m$^2$-year) and mols of metal loss (mols/m$^2$-year).

Hydrogen gas generation and oxide formation analysis was for metal to metal oxide reactions presented in Table 2 as shown in FIG. 14B.

The reactions are for metal reacting with water to form metal oxide and hydrogen gas. Hydrogen generated per mole of metal corroded was based on the mol fraction of elements in the metal and hydrogen generated per mole of each element. For Alloy 625, the mol fractions of iron, chromium, molybdenum and iron were 0.60, 0.27, 0.06, and 0.05 respectively. The hydrogen generated for Alloy 625 was 1.19 cm$^3$ of hydrogen per cm$^3$ of metal corroded. For L80 steel, the mol fractions of iron and chromium were 0.85 and 0.15, respectively. The hydrogen generated for L80 steel was 1.36 cm$^3$ of hydrogen per cm$^3$ of metal corroded. Volumes of hydrogen gas were calculated at Standard Temperature and Pressure (STP). Volumes at STP were then converted for pressure and temperature at the horizontal disposal section. The temperature/pressure factor is 0.016 for pressure of 10 MPa and temperature of 170° C. The volume of hydrogen gas is greatly reduced for conditions in the disposal zone.

During the corrosion process, metal oxides are generated. The metal oxides formed from Alloy 625 were NiO, $Cr_2O_3$, $MO_2$ and $Fe_3O_4$. and oxides for L80 steel were $Fe_3O_4$ and $Cr_2O_3$. Metal oxide formation per mole of alloy corroded was the sum of mol fraction times oxide formation per mol of each element. Volume expansion was that of oxides formed minus the volume of metal consumed. The oxide formation for Alloy 625 was 2.33 cm$^3$ of oxide per cm$^3$ of metal corroded. The oxide formation for L80 steel was 2.09 cm$^3$ of oxide per cm$^3$ of metal corroded.

The Ni—Cr—Mo alloys provide the highest level of corrosion resistance in a wide range of environments. Alloy 625 (UNS N06625) is used for its high strength, excellent fabricability, and outstanding corrosion resistance. It is used for subsea pipelines for conveying sour gas and oil, saltwater pipelines, process pipes in the chemical industry. Extremely corrosive conditions include concentrations of hydrogen sulphide higher than 35%, temperatures reaching 220° C. and well pressure nearing 150 MPa. In the nuclear field, Alloy 625 is used for reactor-core and control-rod components in nuclear reactors. Sea water applications often require high tensile strength and corrosion resistance and Alloy 625 is used as wire rope, propeller blades, submarine auxiliary propulsion motors. It is widely used for high temp, corrosive environments.

Passive metals have remarkably low corrosion rates. Measurable corrosion rate for Ni—Cr—Mo alloys is 0.1 μm/year in harsh environments. The corrosion resistance is provided by a self-forming, thin (e.g., nanometers thick) film. For Ni—Cr—Mo alloys, the passive film is a chromium rich oxide. Corrosion performance depends upon the stability/durability of this thin film. For Ni—Cr—Mo alloys, the passive film is not only remarkably stable, but the film is self-healing and reforms rapidly if damaged by mechanical or chemical action. These alloys have great resistance to localized corrosion in harsh environments, so the corrosion mode is general corrosion. The canisters will corrode extremely slowly, and the eventual perforation will be full-wall penetration in patches by general corrosion. For the base case here, the first perforation occurs at 45,000 years.

Designation of corrosion rates of the canister material in the environment for each time period is a fundamental aspect the analysis. The corrosion rate and duration of the time period determine the metal penetration, volume of metal corroded, hydrogen generated, and oxide formed. Corrosion rates for Ni—Cr—Mo alloys and carbon steel were gathered from the literature, technical reports, analysis of other repository systems for nuclear waste disposal and relevant industrial applications. The objective was to collect relevant data for the range of conditions and evolution of the environment in the EBS from, e.g., laboratory and field studies in support of nuclear waste repositories in a number of countries. Further, there is information for the corrosion performance of Ni—Cr—Mo alloys and carbon steel in industrial applications. Two major reviews address corrosion issues associated with the storage and disposal of nuclear waste and corrosion performance of nuclear waste containers. Corrosion rates for disposal in deep horizontal drillhole draw upon information in those reviews and their supporting references. The corrosion rates are for general corrosion of the metals in the passive condition. Although, both EBS metals have high localized corrosion resistance in reducing environments, localized corrosion is not within the scope of this paper.

The basis for designation of corrosion rates for Ni—Cr—Mo Alloys follow. Extensive studies of the corrosion behavior of Ni—Cr—Mo alloys were carried out in support of the *Yucca* Mountain repository. Electrochemical methods accurately determine corrosion rates to 0.01 μm/year and lower. For Ni—Cr—Mo alloys in high-temperature, oxidizing, chloride solutions measured corrosion rate in harsh environments, such as high temperature, high chloride aerated solution is 0.1 μm/year and less. These conditions are harsher than those in the first two time periods when the thermal pulse and transient oxidizing conditions occur and much harsher than those in the last three periods with anoxic environments. Expected rates for anaerobic environments are 0.01 μm/year. Designated corrosion rates for canisters in the base case are conservative, e.g., values above the expected values.

Carbon steels are widely used for their strength and ease of fabrication. Steel casing will be installed in the drillhole and cemented in place for structural support. L80 steel grades (API-5CT) have greater corrosion resistance than lower grades in H2S and CO2 service. Steel is passive in reducing environments with corrosion rates 1 μm/year or less. Until it is perforated, the casing also separates the environment inside the casing from the environment between the casing and drillhole. Perforation will be full-wall penetration in patches by general corrosion.

Corrosion of carbon steel in bentonite has been studied in a number of international nuclear repository programs and for oil field applications. Oxygen accelerates the corrosion of steel, And the level of oxygen is a key determinant of corrosion rates. Steel and bentonite in anaerobic conditions result in passive behavior. For carbon steel overpack in contact with compacted bentonite, corrosion rates on the order of 0.1 μm/year were measured. Corrosion rates in deaerated bentonite slurry were 1 μm/year or less. The corrosion rate measurements of Smart and co-workers appear to strongly and consistently support the suggestion that protective corrosion product films will develop on C-steel under anaerobic conditions and that long-term corrosion rates will be of the order of 0.1-1 μm/year.

The basis for corrosion rates of carbon steel follow. Short-term corrosion rates for steel are several μm/year and decrease to 1 μm/year or lower after several years. In alkaline cement pore water, the primary corrosion product is $Fe_3O_4$ and corrosion rates are of the order of 0.01 μm/year to 0.1 μm/year. Designated corrosion rates for casing in the base case are considered to be conservative, e.g., values above the expected values.

Evolution of the environment is a factor in analysis of corrosion behavior of materials in the EBS, and the composition of waters is an important determinant of corrosion performance. Typical pore waters in the rock are a chloride brine, and chloride concentration can range from dilute to concentrated levels. Other dissolved species can be present. The brines are anoxic and due to this lack of oxygen, the environment is highly reducing. The acidity/alkalinity ranges from near neutral to mildly alkaline, e.g., pH 6-10.

The horizontal drillhole is in fully saturated rock. There is a region of "disturbed" rock surrounding the drillhole. This rock has been cracked or otherwise affected by the drilling process. The disturbed zone typically extends beyond the drillhole wall to a distance equivalent to about one drillhole radius. For the base case, the disturbed zone is about 10-cm thick, and undisturbed rock extends outward from there. Process waters from drilling and placement of the casing and/or pore water from the surrounding rock fully saturate the disturbed rock.

In typical shale gas/oil operations, the annular space between the casing and rock is filled with cement. Although for waste storage in the horizontal drillholes such cement is may not be necessary, the base case includes cementing of the casing/drillhole annular space. With cement, the waters are moderately alkaline with pH 10-12. Steel corrosion rates in alkaline solution are low and remain so while alkaline species persist. The canister/casing annular space is filled with bentonite-based slurries. Alternate fillings in the EBS can be used.

When canisters containing nuclear waste are emplaced, the temperature in the rock initially rises, and then decreases as the short-lived radioisotopes decay and heat is conducted away. The rock is saturated and EBS is filled with liquid and solids with no vapor space. Due to hydrostatic pressure at depth, there is no boiling of water. Corrosion processes are for metal immersed in liquid. The aggressive conditions and complex behaviors of water droplets and films on hot metal surfaces, liquid/vapor interfaces and two-phase liquid/vapor processes do not pertain.

Corrosion processes in the EBS modify the environment. Corrosion of the steel casing is the primary process for reduction of residual oxygen in the drillhole. Hydrogen gas generation and metal oxide formation accompany the metal loss by corrosion in anaerobic conditions. Hydrogen generation beyond the solubility of hydrogen in the drillhole and rock waters produces a gas phase within the EBS. The high hydrostatic pressure at the depth of the drillhole greatly reduces the volume of gas. Hydrogen is a nutrient for microbiological activity that can affect the environment. The formation of metal oxides by the corrosion process can also alter the chemistry of the environment and can affect the sorption and transport of species. Volume expansion from metal going to metal oxide increases the pressure in EBS.

Temperature is also a characteristic of the environment for corrosion analysis. The horizontal disposal section goes through a heat-up and cool-down cycle. The decay of the radioisotopes generates heat in the fuel pellets, which is transferred to the canisters, the casing, and the rock. The result is that the temperature rises and then decreases as the radioactivity drops and the rock continues to conduct heat away. After emplacement of the canisters, the temperature in the horizontal disposal section rises from ambient to a maximum temperature and then slowly cools down to ambient.

The temperature-time behaviors from canister emplacement to 10,000 years or more have been computed by thermal modeling for a number of repository systems. The thermal evolution near heat-generating nuclear waste canisters disposed in horizontal drillholes has been analyzed by numerical simulations. The hypothetical case analyzed here draws representative values from these simulations. Heating to maximum temperature and start of cool down occurs within 5-10 years after canister emplacement. The maximum temperatures are: capsule, 182° C.; canister wall, 170° C.; casing, 165° C.; drillhole wall, 160° C.; and 1-m into the rock, 103° C. Heat up extends a few meters into the host rock. There is a 40-year thermal heat-up and cool-down period followed by a slow cool-down to the ambient temperature. The ambient temperature and pressure are determined by the depth of the horizontal section. For a drillhole at 1 km depth, representative values are temperature of 60° C. and hydrostatic pressure of 10 MPa. There is no boiling of water on metal surfaces within the EBS or the host rock due to hydrostatic pressure at depth. For 10 MPa hydrostatic pressure, the boiling point of water is 310° C.

For the analysis, five periods are defined, and conditions described to span time from canister emplacement through 10,000 years. The approach is useful to break the extremely long repository time frame into more manageable zones to track corrosion behavior, evolution of the environment and amount of cumulative damage. The objective is to relate corrosion performance to evolution of the environment over time. Corrosivity of the environment is more aggressive in the early times with the heat-up and cool-down cycle and much more benign in the later years with highly reducing, anoxic, lower temperatures conditions.

An initial period from 0-2 years covers an early transition period for change in corrosion resistance of the alloy and evolution of the environment toward reducing conditions. The exposure conditions are moderately oxidizing from oxygen introduced during the drilling, casing installation and canister emplacement. The initial heat-up has begun, and there are fresh metal surfaces on canisters and casing. During a second time period from 2-20 years, the highest canister surface temperature is reached, cool-down begins, and oxygen is consumed moving conditions to a highly reducing environment. The next two periods allow for consideration of temperature on corrosion behavior in highly reducing environment as temperature cools. For the third period from 20-100 years, the temperature has cooled from 120 to 80° C., and for the fourth period from 100-1000 years, the temperature cooled further to less than 80° C. At 1000 years, the temperature had cooled to 60° C. the ambient rock temperature, and remains steady for 10,000 years and beyond. Conditions during the fifth period from 1000 to 10,000 year are 60° C. and a highly reducing environment.

Corrosion rates during each period were set based on reported values for corrosion in the relevant environment for that period. A single corrosion rate was assigned for the period and for calculations presumed to remain constant. Amounts of corrosion, hydrogen generation and oxide formation were determined for the corrosion rate and duration of each period. The corrosion rates were set higher during initial periods and lower for periods after 100 years, due to lower corrosivity and temperatures in later periods. The corrosion rates were set at the upper range of reported rates for general corrosion of nickel-chromium-molybdenum alloys and carbon steel for conditions during each period.

For Alloy 625, the corrosion rate for the first 20 years was set at 2 μm/year to recognize higher temperatures and an early transition period from fresh metal surfaces and not fully anaerobic conditions. The rate for 20 to 100 years was set at 1 μm/year to recognize temperature above ambient. The baseline corrosion rate after 100 years was set at 0.1 μm/year which is above expected values for the benign environmental conditions that pertain. For carbon steel, the corrosion rate for years 0-2 was set at 20 μm/year for fresh metal surfaces in the moderately oxidizing environment. The rate decreased to 4 μm/year for years 2-20 due to transition toward fully anaerobic conditions. The rate was 2 μm/year for corrosion in high temperature, anoxic brines. After 100 years, the corrosion rate was 1 μm/year as temperature decreased and reached ambient conditions.

To demonstrate the impact of corrosion rate on the annual amounts of metal loss, hydrogen gas generation and metal oxide formation were determined for a range of corrosion rates. For each corrosion rates (μm/year), the annual weight loss (g/m2), mols of hydrogen generated (mols/m2), volume of oxide generated (cm3/m2) and volume expansion from oxide formation (cm3/m2) are presented.

Data for canisters made of Alloy 625 are presented in Table 3 (as shown in FIG. 14C) for corrosion rates varying from 0.01 to 10 μm/year.

Over the range of corrosion rates, the weight loss was from 0.084 to 84 g/m2-year. For Alloy 625, 1.19 mots of hydrogen gas are generated per mol of metal corroded, and gas generation ranged from 0.01 to 11.9 mols hydrogen per year per square meter of canister surface. There are 2.33 mols of metal oxide produced per mole of alloy 625 corroded, and the volume of metal oxide corrosion products ranged from 0.03 to 28 cm3/m2 of canister metal per year. The volume expansion of solids from the formation of these corrosion products ranged from 0.02 to 18 cm3/m2 of canister metal per year The corrosion behavior of the Alloy 625 canisters is presented in Table 4 (as shown in FIG. 14D) for time periods from the time of canister emplacement to 10,000 years.

The excellent corrosion resistance of the Ni—Cr—Mo alloy is reflected in the extremely low metal penetration rates. The metal losses are 0.12 mm at 100 years, 0.2 mm at 1000 years and only 1.1 mm after 10,000 years. The starting metal thickness of 9.25 mm is reduced to 9 mm after 1000 years, and wall thickness remains over 8-mm after 10,000.

While general corrosion is the mode of corrosion, the advancing corroded surface is not perfectly smooth but has some shallow hills and valleys. Also, mechanical strength of the canister decreases as a result of the metal loss. To account for these, a criterion for time-to-perforation of the canister wall was set to be the time to penetrate 50% of the 9.25 mm wall thickness. On that basis, the first perforation occurs at 45,000 years. Until that time, canister has remained an absolute, non-permeable barrier to the transport of radionuclides, and no waters from outside the canister enter and come in contact with the nuclear waste.

After the early years corrosion rates decrease dramatically for three primary reasons. The environment evolves from moderately oxidizing to highly reducing as residual oxygen in the drillhole is consumed and conditions are anoxic. The heat-up and cool-down period is nearly complete, and temperatures are at or near ambient conditions. The corrosion resistance of the alloy has become even greater. A self-forming, protective film on the Ni—Cr—Mo alloy provides the corrosion resistance, and the structure and composition of the air-formed film change on exposure to the environment. The aging film becomes more protective over the first months/years.

In oxygen-free, reducing waters, hydrogen gas generation and metal oxide formation are products of the metal corrosion process. The metal oxides formed from Alloy 625 were NiO, $Cr_2O_3$, $MO_2$ and $Fe_3O_4$. The reactions for metal reacting with water were presented in Table 3.

Volume of hydrogen gas was calculated at STP and converted to volume at the pressure and temperature at the depth of the horizontal drillhole. Values for hydrogen gas generation are presented in Table 5 (as shown in FIG. 14E) for each time period and for cumulative gas generation.

Cumulative gas generation at (STP) were 11 cm3, 114 $cm^3$, 341 $cm^3$, and 597 $cm^3$ at 2, 20, 100 and 1,000 years, respectively. The rates of gas generated decreased significantly with time. Values for the hydrogen generated per year are presented in FIG. 5C. FIG. 5C shows graph 570 that relates hydrogen generated (cubic centimeters, y-axis) over time (years, x-axis). Rates were highest at 5.7 $cm^3$/year during the initial transition period and then greatly reduced to 0.3 $cm^3$/year after 100 years.

Hydrogen is soluble in the drillhole and rock waters, and if the solubility limit is exceeded then hydrogen gas forms. The percent of volume expansion from gas generation within the casing and within the overall drillhole were calculated based on the volume of gas at temperature and pressure of the horizontal disposal section. Volume expansion from hydrogen gas is negligible, 0.001% at 100 years and 0.01% or less for all times less than 1000 years. This is due to the modest amounts of hydrogen generated and a reduction in the volume of gas by a factor of 100 due to hydrostatic pressure at the depth of the drillhole.

The amounts of metal oxide per period and cumulative volume expansion from the metal oxide generated are presented in Table 6 as shown in FIG. 14F.

The cumulative volume for oxide expansion is the net change in volume from the $cm^3$ of oxide generated minus the $cm^3$ of metal loss. Cumulative volume expansion at 100 and 1000 years was 668 $cm^3$ and 1169 $cm^3$ respectively. Metal oxides formed by the corrosion process build up a porous layer on the metal surface. Metal loss at 1000 years is 0.2 mm, and thickness of the corrosion product layer on top of the protective film at 1000 years is less than 0.5 mm.

The volume of metal oxide formed is 2.3 times that of the metal corroded, and volume expansion from metal going to metal oxide increases the pressure in the engineered barrier system. The volume of oxide expansion per year tracked the corrosion metal loss. Values of oxide expansion per year as a function of time after and emplacement of the canisters are presented in Table 7 as shown in FIG. 14G.

After the initial transition period of 100 years, the rates have decreased dramatically to 0.6 $cm^3$ per year. The percent volume expansion values from canister corrosion and oxide generation within the casing and within the overall drillhole show expansion at 1000 years is nearly 1% inside the casing and 0.3% for the total drillhole volume.

To demonstrate the impact of corrosion rate on the annual amounts of metal loss, hydrogen gas generation and metal oxide formation were determined for a range of corrosion rates. Data for L80 steel casing are presented in Table 8 (as shown in FIG. 14H) for corrosion rates varying from 0.01 to 100 μm/year.

Over the range of corrosion rates, the weight loss was from 0.78 to 784 $g/m^2$-year. For L80 steel, 1.36 mols of hydrogen gas are generated per mol of metal corroded, and gas generation ranged from 0.13 to 136 mols hydrogen per year per square meter of canister surface. There are 2.09 mols of metal oxide produced per mole of L80 steel corroded, and the volume of metal oxide corrosion products ranged from 0.21 to 209 $cm^3/m^2$ of canister metal per year. The volume expansion of solids from the formation of these corrosion products ranged from 0.11 to 109 $cm^3/m^2$ of canister metal per year. If the 12.5 mm thick steel casing corrodes at 10 μm/year, all of the steel would be consumed after 625 years.

The corrosion behavior of L80 steel casing is presented in Table 9 (as shown in FIG. 14I) for time periods from the time of canister emplacement to 10,000 years.

Corrosion rates are highest during the initial periods while residual oxygen is being consumed and higher temperatures are experienced. After 100 years, the environment is anaerobic, and corrosion proceeds slowly at the 1 μm/year rate. The metal loss at 100 years is 0.27 mm and at 1000 years is 1.2 mm. Remaining casing wall thickness is 12 mm and 10.2 mm at 100 years and 1000 years, respectively. The time to consume all of the steel is 6,078 years.

While general corrosion is the mode of corrosion, the advancing corroded surface is not perfectly smooth but has some shallow hills and valleys. Also, mechanical strength of the casing decreases as a result of the metal loss. A criterion for time-to-perforation of the casing wall was set to be the time to penetrate 50% of the 12.5 mm wall thickness. On that basis, the first perforation occurs at nearly 3,000 years. After the early years corrosion rates decrease dramatically. The environment evolves from moderately oxidizing to highly reducing as residual oxygen in the drillhole is consumed and conditions are anoxic. The heat-up and cool-down period is nearly complete, and temperatures are at or near ambient conditions.

In oxygen-free, reducing waters, hydrogen gas generation and metal oxide formation are products of the metal corrosion process. The metal oxides formed from L80 steel are $Fe_3O_4$ and $Cr_2O_3$. The reactions for metal reacting with water are presented in Table 3.

Volume of hydrogen gas was calculated at STP and converted to volume at the pressure and temperature at the depth of the horizontal drillhole. Values for hydrogen gas generation for each time period and cumulative gas generation are presented in Table 10 as shown in FIG. 14J.

Figure 5E:
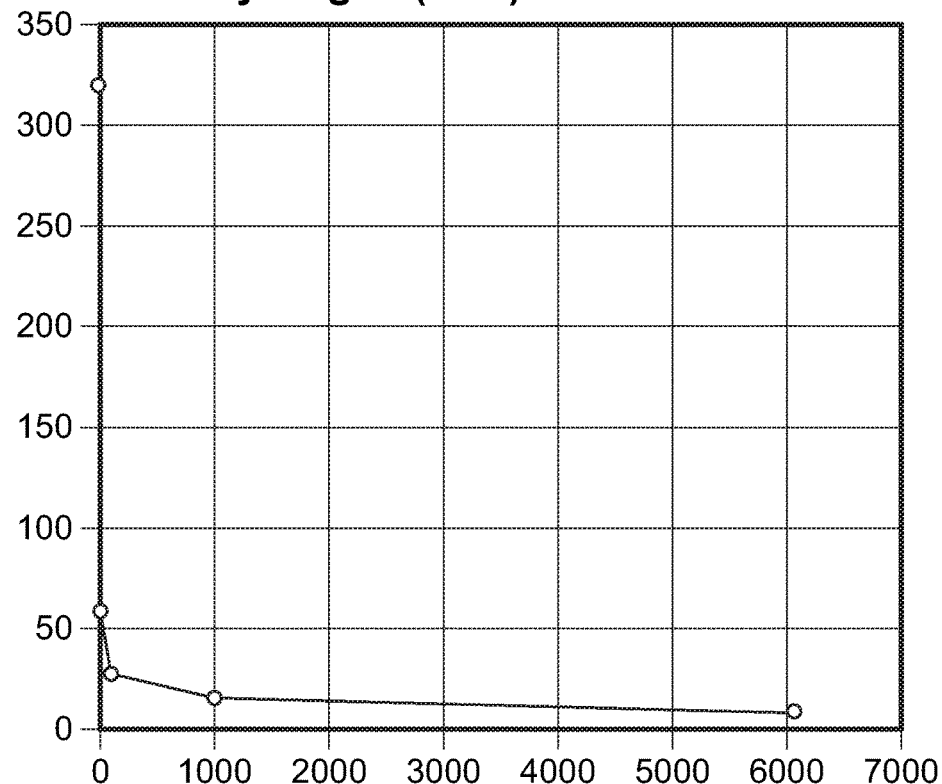

Cumulative gas generations at STP were 636 $cm^3$, 1780 $cm^3$, 3687 $cm^3$, and 16844 $cm^3$ at 2, 20, 100 and 1,000 years, respectively. The rates of gas generated decreased significantly with time. Values for the hydrogen generated per year are presented in FIG. 5E. FIG. 5E shows graph 576 that relates hydrogen generated (cubic centimeters, y-axis) over time (years, x-axis). Rates were highest at 318 cm$^3$/year during the initial transition period and then greatly reduced to 25 cm$^3$/year after 100 years.

Hydrogen is soluble in the drillhole and rock waters, and if the solubility limit is exceeded then hydrogen gas forms. The percent of volume expansion from gas generation within the casing and within the overall drillhole were calculated based on the volume of gas at temperature and pressure of the horizontal disposal section. Since, there is reduction in the volume of gas by a factor of 100 due to hydrostatic pressure at the depth of the drillhole, volume expansion from hydrogen gas is negligible, 0.015% at 100 years and 0.07% at 1000 years.

Volume metal oxide formed and volume expansion per period are presented in Table 11 as shown in FIG. 14K.

Figure 5F:
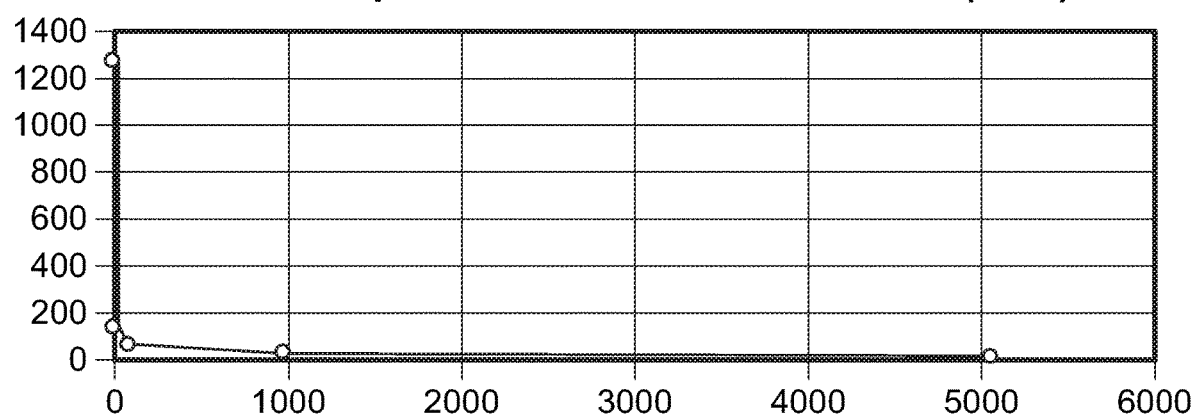

Each volume of metal consumed forms 2.09 volume of metal oxides, and the net volume expansion is volume of oxide formed minus volume metal corroded. Results are presented for oxide formation from the inner casing surface, the outer casing surface and total oxide formation within the drillhole. The inner surface area of the casing is 5.36 m$^2$ and outer surface area is 6.32 m$^2$. The volume of metal loss and oxide formation is greater on the outer surface of the casing than on the inner surface due to the surface area. Volume of oxide produced per period increases while the corrosion rate decreases due to longer duration of each subsequent period. The volume expansion per year for each subsequent period decreases. The total volume of oxide formation in the drillhole per year is shown in FIG. 5F. FIG. 5F shows graph 578 that relates a volume of oxide expansion (cubic centimeters, y-axis) over time (years, x-axis). The volume expansion drops from 254 cm$^3$ in the first two years to 51 cm$^3$ in the next 18 years and then continues to decrease for subsequent periods.

At 100 and 1000 years, the casing metal loss is 0.27-mm and 1.2-mm, respectively. Presuming a fully dense oxide with no porosity, the oxide formation thicknesses are 0.56-mm and 2.5-mm. The oxide thickness on inner and outer casing surfaces are approximately equal. When the casing is fully consumed, the 12.5-mm thick steel will have produced oxide equivalent to a layer 26-mm thick. Cumulative volume of oxide formed and volume expansion from the oxide are presented in Table 12 (as shown in FIG. 14L) for each period.

Total oxide expansion in the drillhole was 3,448 cm$^3$ and 14,858 cm$^3$ at 100 and 1000 years, respectively. Corresponding percent volume expansion was 0.9% and 3.87%. Total expansion after 6078 years when the steel casing was completely consumed is 12%.

Volume expansion from metal going to metal oxide increases the pressure in the engineered barrier system. Pressure increases independently inside and outside the casing until the casing is perforated and cumulatively in the drillhole perforation. Volume expansion of solids in the drillhole is equivalent to a volume reduction of waters. The coefficient of compressibility of water is 4.4E-10 1/Pa. One percent volume decrease of waters leads to a pressure increase of 22 MPa.

The ultimate goal is to design and construct a nuclear waste disposal system with a robust EBS to meet the long-term requirements for safe and reliable disposal. The analysis of the corrosion behavior of a base case for disposal in deep horizontal drill holes yields information on the performance of canisters and casing over 10,000 years and provides insights to design of the EBS. The analysis focused on the corrosion behavior of canisters and casing, since corrosion is the greatest risk for canister perforation, and the casing is an integral component of the engineered barrier system.

In summary, the canisters made of corrosion resistant, Ni—Cr—Mo alloy exhibited excellent performance. Metal loss was only 1.1 mm after 1,000 years and starting metal thickness of 9.25-mm remained over 8-mm thick after 10,000. For a criterion that first perforation of the canister wall is when 50% the wall thickness is consumed, the canister was an absolute barrier to water penetration into and radionuclide egress for 45.000 years. The L80 steel casing was reduced from 12.5 mm to 10.2 mm after 1000 years. The first perforation of casing occurred at nearly 3,000 years, and the time to consume all of the steel was 6,078 years. Until the casing is perforated, it is a barrier between the inner canister/casing environment and the outer casing/drillhole environment.

Hydrogen generation and metal oxide formation accompanied the metal corrosion. The amount of hydrogen and metal oxide formed tracked the corrosion rate of the metals. Both were higher for the corrosion of steel casing than for the corrosion resistant alloy canister. The calculated STP volume of hydrogen generated was reduced by a factor of 100 in the drillhole by the hydrostatic pressure at the depth. Molar volume of metal oxides formed is 2.3 and 2.09 times the metal molar volume of Alloy 625 and L80 steel, respectively. The volume expansion from metal oxide formation increases the pressure within the EBS. The hydrogen generation and metal oxide formation can affect the environment, transport, sorption and other processes. The analysis of these affects is beyond the scope of this paper.

Two factors for analysis of corrosion performance are the corrosion resistance of the metal and the corrosivity of the environment. The interaction between these two determines the corrosion modes of interest, the corrosion processes and rates, potential failure modes and performance assessment. A special feature of analysis of waste disposal is the extraordinarily long periods of performance with interest extending to 10,000 years and beyond. A useful tool is to define time periods with duration and environmental conditions to follow the evolution of the environment. Here, five periods were defined. The first two, 0-2 and 2-20 years, covered the heat-up to maximum temperature, start of cool-down and transition from moderately oxidizing the anaerobic conditions as residual oxygen was consumed. The remaining periods captured times to cool to 120° C., 80° C. and near ambient 60° C. These temperatures relate to thresholds for corrosion phenomena and availability of industrial experience and laboratory data and analysis.

The trajectories of corrosion, hydrogen generation and oxide formation over the 10,000 years are apparent from the results. Annual metal loss, hydrogen generated, and oxide formation dropped dramatically in the first 20 years. This is due primarily to the transition to anaerobic conditions. After this time, the environment is anoxic and remains essentially unchanged for the duration. After 100 years, the environment is has cooled to 80° C. and low corrosion rates prevail for canister and casing.

A challenge then is to design a system that makes it through the aggressive, initial period of 100 years and enters the anaerobic period in condition to survive for 10,000's of years. This focuses a 10,000-year analysis on the first 100 years when the thermal pulse has peaked, and temperature has decreased to 80° C. Analysis for 100 years is within the realm of traditional engineering and experience. Thus, there is a consideration of which alloy to select for canisters that will survive 10's of years at high temperature (170° C. in the base case here) in a moderately oxidizing environment with minimal damage. The greatest threat to passive metals for these conditions is susceptibility to localized corrosion processes. Hence, the selection of Ni—Cr—Mo alloy for the canisters. For reducing environments, Ni—Cr—Mo would be considered an overkill and less corrosion resistant metals at lower cost would be selected. However, a highly corrosion resistant alloy is required in lieu of the unprecedented needs for safe and reliable containment, survival through the aggressive transition period and the extraordinarily long time periods to follow. Ni—Cr—Mo alloys have both mechanical strength and corrosion resistance to meet these needs.

During the initial 20 to 100 years, aggressive corrosion conditions prevail from the high temperatures and moderately oxidizing environment. A number of passive alloys, e.g., those that form protective passive films, can be passive and have extremely low corrosion rates in this environment. However, the key issues are will the metal remain passive, and if the passive film is damaged will it reform spontaneously. If the passive film does not reform, then the metal is severely damaged and penetration rates are rapid. The Ni—Cr—Mo alloys are designed to have a durable protective (passive) film that is self-forming and will reform quickly if damaged mechanically or chemically. This is what distinguishes them from lesser corrosion resistant alloys.

The engineered barrier consists of several components at work in combination to prevent the transport of radionuclides from the EBS to the host rock for the regulated period of time period and beyond. An overall assessment of the EBS starts with the uranium dioxide spent fuel pellets and moves outward to the drillhole surface. The focus here is on corrosion performance of the EBS. The components of interest are the canister, filler between canister and casing, casing, and filler between casing and drill hole.

The strategy for corrosion mitigation is to select suitable materials for performance in the evolving environments over 10,000 years. Design considerations for materials and the environment are presented below along with some strategies to further enhance EBS performance.

In addition to the admirable corrosion resistance, Ni—Cr—Mo alloys have structural strength to elevated temperatures beyond those for deep isolation disposal. They are available in shapes and sizes required. Canisters can be manufactured by common industrial processes. Welding procedures are standardized as are inspection and quality procedures along a substantial history of industrial applications and extensive materials performance data. There is a wealth of data and analysis documenting the outstanding corrosion behavior of Ni—Cr—Mo alloys in hostile environments. In particular, comprehensive studies were carried out is support of the *Yucca* Mountain repository under conditions much harsher than those for deep horizontal drillhole disposal.

Carbon steel casing has the required structural strength, availability in shapes and sizes, and fabricability. These steels are widely used in the oil field and a broad range of other industrial applications. The casing is made of API-5CT L80 Casing Pipe which belongs to a steel grades group of corrosion resistant casing. It has greater corrosion resistance than plain carbon steels in environments that contain hydrogen sulfide and carbon dioxide. Several international programs for nuclear waste repositories have generated laboratory data and field test results for carbon steels in anaerobic environments. Corrosion rates are documented to be extremely low.

A number of design considerations relate to aspects of the environment. In addition to suitable location and favorable geology, site selection and environmental characteristics contribute to the high performance of the EBS.

Highly Reducing Environment: After a brief transition period, the initial moderately oxidizing environment is much less corrosive, and environmental conditions thereafter remain steady.

Uniformity of environment: Conditions along the horizontal drillhole are uniform. In comparison, vertical segments can go through a variety of layers with different aeration levels. Heterogeneous aeration/deaeration zones can result in localized corrosion or longline corrosion cells. Zones with carbon dioxide or hydrogen sulfide in waters can cause severe corrosion. This is a distinguishing factor for the long life of steel casing in the horizontal segment versus industrial experience for oil and gas wells where high corrosion rates and casing lives of 20-50 years are observed.

Fully Saturated Rock: The absence of two-phase gas/liquid solutions eliminates aggressive corrosion processes such as droplets on hot metal surfaces and thin films of moisture in the vapor phase. Full saturation in the rock simplifies the analysis and reduces uncertainty.

Hydrostatic pressure at depth: There is no boiling of waters at the canister surface or in the rock due to suppression of boiling by hydrostatic pressure. Unlike conditions for several other repository systems, there is no boiling on metal surfaces or in the rock and no wet-dry-wet cycle for these horizontal drillholes.

Environment between canisters and casing: Procedures are designed to minimize oxygen in waters and fluids for drilling, casing installation and canister emplacement. The canister/casing annular space is filled with bentonite-based slurries that are treated to minimize dissolved oxygen.

Environment between casing and drillhole: Cement fills this annular space and modulates pore waters to be moderately alkaline. Steel corrosion rates in alkaline solution are low. Alkalinity will not persist for repository times; however, reduction of corrosion is beneficial during the early transition period to anaerobic conditions.

Reduction of the thermal period and lower maximum temperatures would shorten exposure times to the harsh environment, lower corrosion rates and decrease risk for localized corrosion. Spacing of canisters along the drillhole allows control of the thermal load and temperatures. Controlled selection and spacing of canisters based on the heat load of contained waste can yield uniform temperatures and avoid hot spots. EBS design can enhance heat transfer to the rock. Means to quicken the transition to reducing conditions include reduction of residual oxygen in the drillhole and use scavenger species to consume or tie up oxygen.

The horizontal drill hole configuration and procedures for placement of casing and emplacement of canisters allows the use of "engineered" fillings for the canister/casing and casing/drillhole annular spaces. This provides the opportunity to control the environment within the casing from installation in the drillhole until the casing is perforated. In this analysis, casing perforation was at nearly 3000 years. Bentonite-based slurries or the like are infused with beneficial additives, such as oxygen scavengers, alkalinity modulators and antimicrobial treatments. Space between the casing and drillhole is filled with cementitious filler and it is feasible to include other beneficial additives. The mild alkalinity promotes passivity of the steel at the initial casing installation. The alkalinity and additives moderate corrosion during the retrieval period prior to sealing and during the transition time to anaerobic conditions.

Volume expansion from formation of iron corrosion products increases pressure inside and outside of the casing. The pressure could be moderated in the EBS by expansion absorbers, such as empty thin-walled components and expansion zones such as the capsule spacing 509 shown in FIG. 5B) included along the drillhole. Increasing the drillhole diameter increases volume for expansion and reduction of the amount of steel decreases the volume of metal oxide formed.

The objectives were to analyze the corrosion performance of the EBS for disposal of nuclear waste in deep horizontal drillholes and to relate aspects of the EBS design to corrosion performance. For analysis, time periods with defined duration and environmental conditions to follow the evolution of the environment over 10,000 years. The first 20 years, covered the heat-up to maximum temperature, start of cooldown and transition from moderately oxidizing the anaerobic conditions. Corrosion, hydrogen generation and oxide formation decreased drastically after this early transition period. The major challenge then is to design a system that makes it through the aggressive, initial period and enters the anaerobic period in condition to survive for 10,000's of years. Canisters of Ni—Cr—Mo meet this challenge extremely low corrosion rates and extraordinary resistance to localized corrosion in high temperature, moderately oxidizing environments.

Canisters of Ni—Cr—Mo alloy exhibited excellent performance. Metal loss at 1000 years was 0.2 mm and only 1.1 mm at 10,000 years. Time for the first perforation of a canister with 9.5-mm wall was 45,000 years. The L80 steel casing was reduced from 12.5 mm to 10.2 mm after 1000 years. The first perforation of casing occurred at nearly 3,000 years. The canister remained an absolute, non-permeable barrier to water entry and egress of radionuclides for 10,000's years, and the casing was a barrier between the inner canister/casing environment and the outer casing/drillhole environment for several 1000's years.

In design of the EBS, materials are selected for performance to meet repository requirements in the evolving environment over 10,000 years. Several aspects of deep horizontal drillholes are beneficial, the environment is highly reducing after the initial transition period and uniform along the length of the drillhole, the rock is fully saturated and hydrostatic pressure at depth suppresses boiling. In addition, the EBS configuration allows for use of "engineered" fillings for the canister/casing and casing/drillhole annular spaces. Thermal load and temperatures can be controlled by spacing and distribution of canisters based on heat load of the contained waste.

The deep horizontal drillhole waste disposal system has favorable attributes that contribute to a strong technical basis for long-term control of radionuclide transport and reduction of uncertainty in the supporting safety case. In part. because the horizontal drillhole disposal system avoids several phenomena and processes that pertain to other repository systems, complicate their analysis and increase uncertainty. Major complexities for analysis avoided by deep horizontal drillholes include: analysis of two-phase gas/liquid processes, determining the effects of boiling on metal surfaces and in surrounding rock, and dealing with a large thermal pulse from decay heat that results in a wet-dry-wet cycle over time.

Disposal of Radioactive Liquid in Directional Drillholes.

As described with reference to FIGS. 1-4, radioactive liquid, such as radioactive water, may be emplaced (in canisters or not) within a storage area of a hazardous waste repository, such as repositories 100, 200, 300, and 400. For example, at the Fukushima nuclear reactor site in Japan, water flowing underground past the melted radioactive waste became contaminated with tritium, the radioactive isotope of hydrogen. Tritium has a half-life of 12.3 years. This contaminated (e.g., tritiated) water at Fukushima had a total volume of nearly a million cubic meters and is currently stored in large 1000 cubic meter tanks above ground at the site. It has been proposed that the water could be discharged into the sea, but that approach has been strongly opposed by the Japanese public. The Japanese government has also considered placing the tritiated water in a concrete pit at a relatively shallow depth (less than 10 meters below the surface). This underground burial is too shallow to have any substantial advantage from geologic isolation. An alternative method proposed for the disposal of the tritiated water of Fukushima is "geosphere injection." Three different variations were considered: with no pre-treatment, with dilution, and with separation. The fundamental barrier is that suitable underground formations may not exist, and a regulatory barrier that disposal of radioactive waste in liquid form is prohibited by the Nuclear Regulation Authority of Japan unless severely diluted (by a factor of 70 or more).

Example implementations of the present disclosure describe disposing radioactive water in deep, human-unoccupiable, directional drillholes formed into one or more subterranean formations as described with reference to FIGS. 1-4. In some aspects, a subterranean formation (layers 118, 218, 319, and 419 and other suitable formations) into which the deep, directional drillholes are formed contain stagnant water (e.g., stagnant brine). In some aspects, the stagnant water can be shown to be sufficiently old that by the time any of the stagnant water can reach surface water (e.g., potable or human-consumable water from surface water surfaces), the tritium will have decayed to natural levels. Since the half-life of tritium is 12.3 years, that means that after 123 years, the radioactivity is reduced by a factor of $(1/2)10=0.001$. After 250 years, the level is reduced to $(1/2)20=0.000001=1$ millionth of its original level.

In some aspects, the stagnant water can be tested (e.g., by using radioisotopic methods) to determine whether the age of the stagnant water is sufficiently old (and thus the mobility is sufficiently slow toward a terranean surface). For example, the sufficiency of the age (and/or mobility) of the stagnant water can be determined using measurements of natural tritium and carbon-14 that exist in the brines stored in the proposed disposal subterranean formation. If the presence of these radioisotopes is low compared to the levels in the surface waters, then isolation for required times can be demonstrated. The subterranean formation, based on the successful testing, may be suitable as a hazardous waste repository for the long term (e.g., tens, hundreds, or thousands of years) storage of hazardous waste, such as radioactive water.

In the example implementations of hazardous waste repositories 100, 200, 300, and 400, radioactive water can be stored in long horizontal or nearly-horizontal drillholes at depths from a few hundred meters to several kilometers below the Earth's surface. The depth may be chosen as one that through measurements of tritium and/or carbon-14, satisfies the isolation requirements previously described. In alternative implementations, vertical drillholes may be used, although such vertical or nearly vertical drillholes (e.g., with no directional or horizontal portion) may provide less disposal volume per drillhole than can be obtained by directional or horizontal drillholes.

As described with reference to FIGS. 1-4. a vertical or nearly vertical access drillhole is drilled from the surface.

Before the drillhole reaches the disposal formation, the direction of the drillhole is curved so that when it reaches the disposal formation, the drillhole is horizontal or nearly horizontal. In some aspects, the drillhole is made that can hold an 8-inch diameter canister. An 8" hole has area of 0.033 square meters=1/30 square meters. For 3 km, the volume of the drillhole is 100 cubic meters. For 1,000,000 cubic meters of tritiated (e.g., radioactive) water, 10,000 such drillholes would be required. The drillhole could be drilled with a larger diameter than 8 inches. If, for example, the drillhole has a 16-inch bore, then only 2,500 drillholes need be drilled. A drillhole with a 16-inch hole might be more cost efficient for disposal than would be an 8-inch well.

In some aspects, the vertical portion and curved portion of the drillhole are "access" portions in that no radioactive water is stored in these portions (and only stored in the horizontal drillhole portion). The access portions are used to convey the radioactive liquid (inside of canisters or not) to the horizontal or nearly horizontal disposal drillhole portion. After disposal, the access portions may be sealed.

In some example implementations, a single access section (e.g., a single vertical portion) can be used to access several horizontal or nearly horizontal disposal drillhole portions (e.g., several multilateral drillhole portions). In disposal of spent nuclear fuel assemblies, the use of multilateral disposal is sometimes avoided because recovery of the assemblies may be made more difficult. However, if there is no perceived value in the recovery of the waste, then there may be cost-saving advantages to using multilateral disposal drillhole portions for the long-term storage of tritiated (e.g., radioactive) water.

As described in FIGS. 1-4, all or portions of the directional drillhole may include a casing (e.g., tubular pipe sections secured into place with cement to the drillhole). Alternatively, all or portions of the directional drillhole may not include any casing or cement. For example, the casing may not provide an advantage if no retrieval of waste is required. Also, the absence of casing and cement may increase a volume available for disposal of the radioactive water.

In some aspects, the directional drillhole may first be drained of any brine that has entered it, and then filled with the radioactive water. The access hole would then be sealed (e.g., with a wellbore plug or packer, or cement, bentonite, gravel and rock). In some aspects, there may be multiple seals (e.g., at a junction between the horizontal drillhole portion and access portion, and in the vertical access portion). In some aspects, the radioactive water may be circulated (e.g., pumped) into the directional drillhole portion, which is then sealed.

In some aspects, the radioactive water may be mixed with cement, such as the cement used to secure the casing to the drillhole or another batch of cement that is then pumped into the drillhole (or both). Since cement can be made that contains 70% or more water by volume, the required drillhole length at depth could be increased by about 43%. In other aspects, the radioactive water may be mixed with a gel such as sodium polyacrylate, and the gel could then be pumped into the hole. Sodium polyacrylate creates a gel that is more than 99% water, so no additional drilling would be needed.

In some aspects, the radioactive water mixed with either gel or cement can be place in sealed canisters (as described with reference to FIGS. 1 and 3), and these can be moved into the horizontal drillhole section. For example, the canisters may be moved into the drillhole with a wireline tractor or by coiled tubing or drillpipe. In some aspects, canisters containing tritiated water (or radioactive water mixed with cement or gel) may be lighter in weight than canisters that contain spent nuclear fuel assemblies. This is because water is much less dense than the uranium dioxide that makes up the spent nuclear fuel assembly. If canisters are used, they can be made of CRA (corrosion-resistant alloy). CRAs include Alloy-22 and Alloy-625, both made of nickel/molybdenum/chrome. There are other CRAs that may be used for the canisters. The canisters could be made of non CRA if the chemistry at depth indicates that corrosion will not breach the canister walls within 125 to 250 years, at which time the tritium will have decayed. However, if other radioisotope such as Sr-90 and Cs-137 are present in the water at significantly high levels, a CRA might be preferred. The half-life of Sr-90 and Cs-137 are both about 30 years, so ten half-lives would possibly require a 300-year CRA.

In some aspects, after emplacement of the radioactive water (in canisters or not), the disposed water can be monitored. Monitoring can be done by placing a wire or fiber optic in the access hole and one (or part of the same one) in the disposal drillhole. The wire or fiber can have a radiation sensor at the end or at locations along its length. One possible radiation sensor would be a phosphor coating on a fiber cable. When tritium decays it emits a short-range beta particle (an electron). If that beta particle enters a phosphor, it causes a pulse of light to be emitted.

If the tritiated water is placed in canisters, and the sensor is outside, then the presence of light pulses with the magnitude expected for tritium would be an indicator that tritium has escaped the canister. If no canister is used, then the radiation sensor should show a steady rate of light pulses dropping in rate with a half-life of 12.3 years. That drop begins immediately, and in 1 month the drop would be 0.5%, a change that is readily detectable. If canisters are not used, then any additional drop in rate could be due to increased saturation of the gel by brine or a loss of tritium by flow into the rock. The fact that a measurable change is expected from tritium decay helps assure that the monitoring method is functional.

The tritium detector could also be used to detect gamma radiation from Cs-137 or beta decay and gamma radiation from Sr-90. These rays would be distinguished from the tritium beta rays by the larger flash of light they would produce. These rates might be too low to be detected by the tritium detector, and if a separate monitor for them is required, a larger scintillation detector connected by a fiber optic cable could be included. This Cs/Sr detector would be surrounded by a metal shield that would prevent the low energy beta rays from tritium to enter can cause the scintillator to flash.

Thermal Test Process for Determination of Suitability of a Subterranean Formation as a Hazardous Waste Repository.

FIGS. 6A-6D are schematic illustrations of a thermal property testing system 600 for a hazardous material storage repository. For example, the disposal of spent nuclear fuel and high-level radioactive waste in horizontal holes drilled into deep, low-permeable geologic formations using directional drilling technology is described herein (e.g., with reference to FIGS. 1-4). Residual decay heat emanating from these waste forms leads to temperature increases within the drillhole and the surrounding host rock. The spacing of waste canisters and the configuration of the various barrier components within the horizontal drillhole can be designed such that the maximum temperatures remain below limits that are set for each element of the engineered and natural repository system. The present disclosure includes design calculations that examine the thermal evolution around heat-generating waste for a wide range of material properties and disposal configurations. Moreover, the present disclosure describes alternative layouts of a monitoring system to be part of an in situ heater test that helps determine the thermal properties of the as-built repository system. A data-worth analysis is performed to ensure that sufficient information will be collected during the heater test so that subsequent model predictions of the thermal evolution around horizontal deposition holes will reliably estimate the maximum temperatures in the drillhole. The simulations demonstrate that the proposed drillhole disposal strategy can be flexibly designed to ensure dissipation of the heat generated by decaying nuclear waste. The present disclosure thus describes an in situ heater test can provide the relevant data needed to develop a reliable prediction model of repository performance under as-built conditions, thereby providing a determination that a subterranean formation is suitable (or not) as a hazardous waste repository, such as any one of repositories 100, 200, 300, and 400.

Figure 6A:
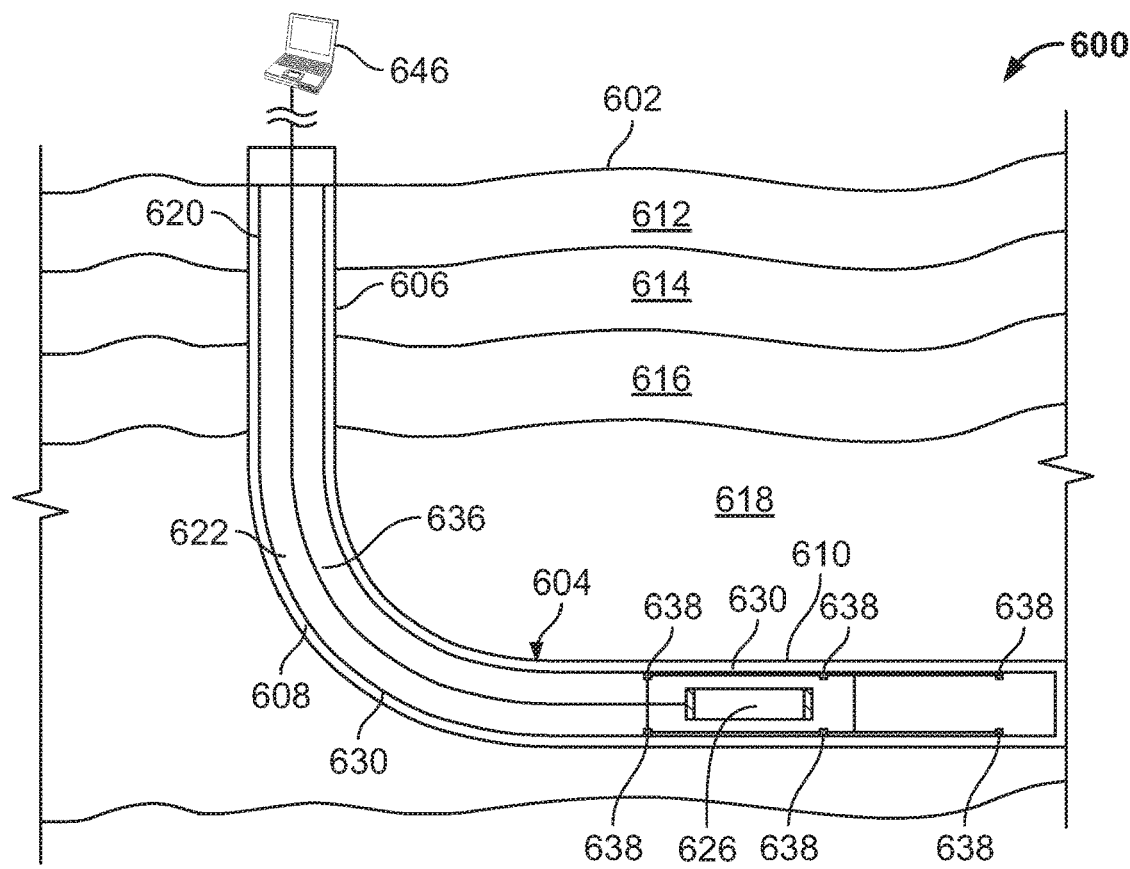
FIGS. 6A-6D are schematic illustrations of a thermal property testing system for a hazardous material storage repository according to the present disclosure.

FIG. 6A illustrates an example thermal property testing system 600 for a hazardous material storage repository. In this example of FIG. 6A, the thermal property testing system includes one or more sensors 638 placed in the drillhole 604 (e.g., within the substantially horizontal portion 610) and communicably coupled to a monitoring control system 646 through a cable 636 (e.g., electrical, optical, hydraulic, or otherwise). A downhole heater 626 is positioned in a substantially horizontal portion 610 of the wellbore 604. The substantially horizontal portion 610 is coupled to a radiussed portion 608, which in turn is coupled to a substantially vertical portion 606 of the drillhole 604, which is formed through subterranean layers 612, 614, 616 and into subterranean layer 618. In this example, the drillhole 604 includes casing portions 620 and 622 (e.g., surface or conductor casing and production casing) which are held in place by cement 630.

Although illustrated as within drillhole 602 (e.g., inside of the casings), the sensors 638 may be placed outside of the casings, or even built into the casings before the casings are installed in the drillhole 602. Sensors 638 could also be placed outside the casing (e.g., casings 620 and/or 622), or outside the fluid control casing 634.

The downhole heater 626, as shown, is placed within the drillhole 610, and in this example, within a storage area for hazardous waste, such as spent nuclear fuel or other radioactive material. The downhole heater 626 may be emplaced in the drillhole 610 through, e.g., a downhole conveyance (e.g., work string or wireline) or downhole tractor. As shown in this example, the downhole heater 626 is controlled by the cable 636 to provide a controllable amount of heat within the drillhole portion 610. The downhole heater 626 may be, for example, an electric resistance heater, a microwave or laser heater, or a downhole combustion heater.

As shown, the sensors 638 may monitor temperature within the drillhole portion 610 (and other places, such as the subterranean layer 618) during operation of the downhole heater 626. Temperature data may be transmitted along the cable 636 to the monitoring control system 646. The monitoring control system 646, in turn, may record the data, determine trends in the data (e.g., rise of temperature and other data). In some aspects, there may be a single sensor 638. In alternative aspects, there may be multiple sensors 638.

Figure 6B:
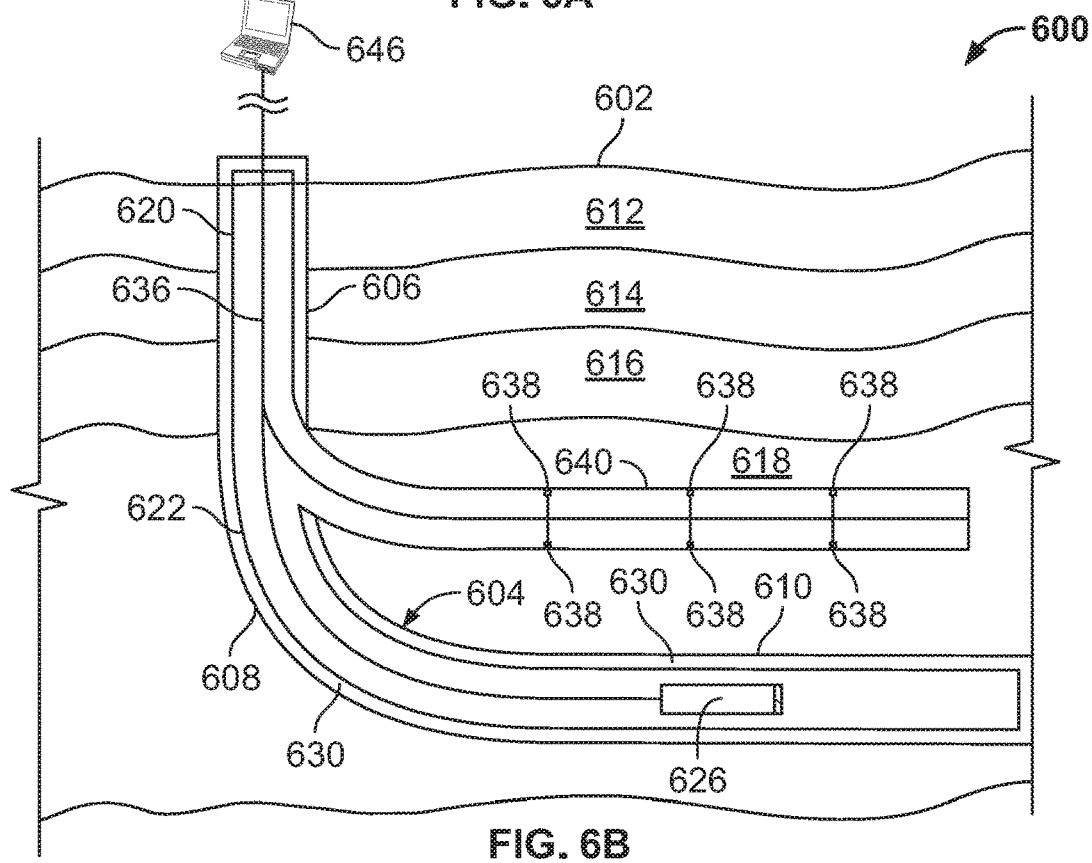

FIG. 6B shows another example implementation of thermal property testing system 600. In this example, sensors 638 are positioned within a secondary horizontal drillhole 640 that is formed separately from the substantially vertical portion 606. The secondary horizontal drillhole 640 may be an uncased drillhole, through which the cable 636 may extend between the monitoring control system 646 and the sensors 638. In this example, the secondary horizontal drillhole 640 is formed above the substantially horizontal portion 610 but within the storage layer 618. Thus, the sensors 638 may record the temperature data of the storage layer 618. In alternative aspects, the secondary horizontal drillhole 640 may be formed below the storage layer 618, above the storage layer in the impermeable layer 616, or in other layers. Further, although FIG. 6B shows the secondary horizontal drillhole 640 formed from the same substantially vertical portion 606 as the substantially horizontal portion 610, the secondary horizontal drillhole 640 may be formed from a separate vertical drillhole and radiussed drillhole.

Figure 6C:
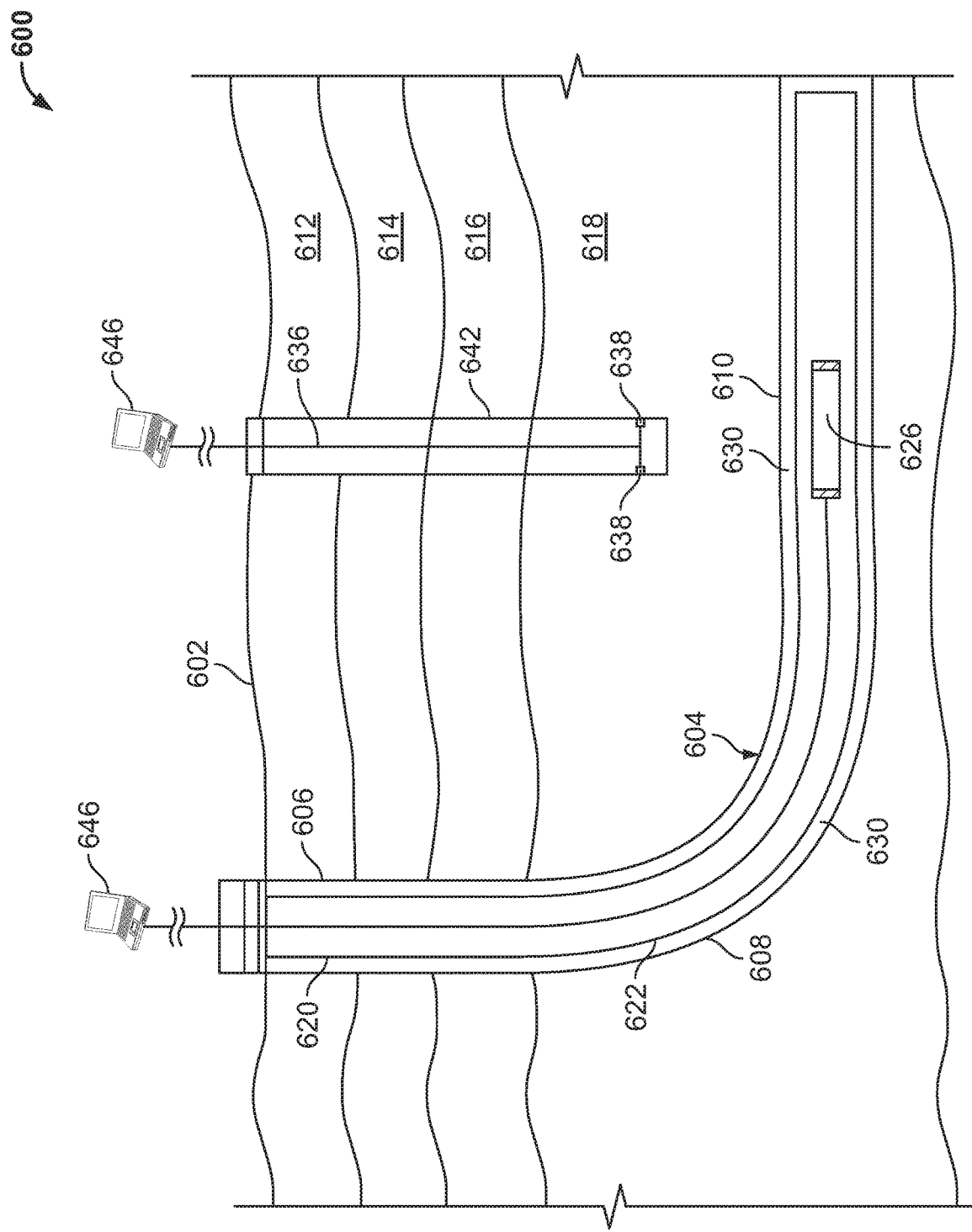

FIG. 6C shows another example implementation of the thermal property testing system 600. In this example, sensors 638 are positioned within a secondary vertical drillhole 642 that is formed separately from the drillhole 604. The secondary vertical drillhole 642 may be a cased or an uncased drillhole, through which the cable 636 may extend between the monitoring control system 646 and the sensors 638. In this example, the secondary vertical drillhole 642 bottoms out above the substantially horizontal portion 610 but within the storage layer 618. Thus, the sensors 638 may record the temperature data of the storage layer 618. In alternative aspects, the secondary vertical drillhole 640 may bottom out below the storage layer 618, above the storage layer in the impermeable layer 616, or in other layers. Further, although shown placed in the secondary vertical drillhole 642 at a level adjacent the storage layer 618, sensors 638 may be placed anywhere within the secondary vertical drillhole 642. Alternatively, the secondary vertical drillhole 642 may, in some aspects, be constructed prior to drillhole 602, thereby permitting monitoring by installed sensors 638 during construction of the drillhole 602. Also, the monitoring borehole 642 could be sealed to prevent the possibility that material that leaks into borehole 642 would have a path to the terranean surface 602.

Figure 6D:
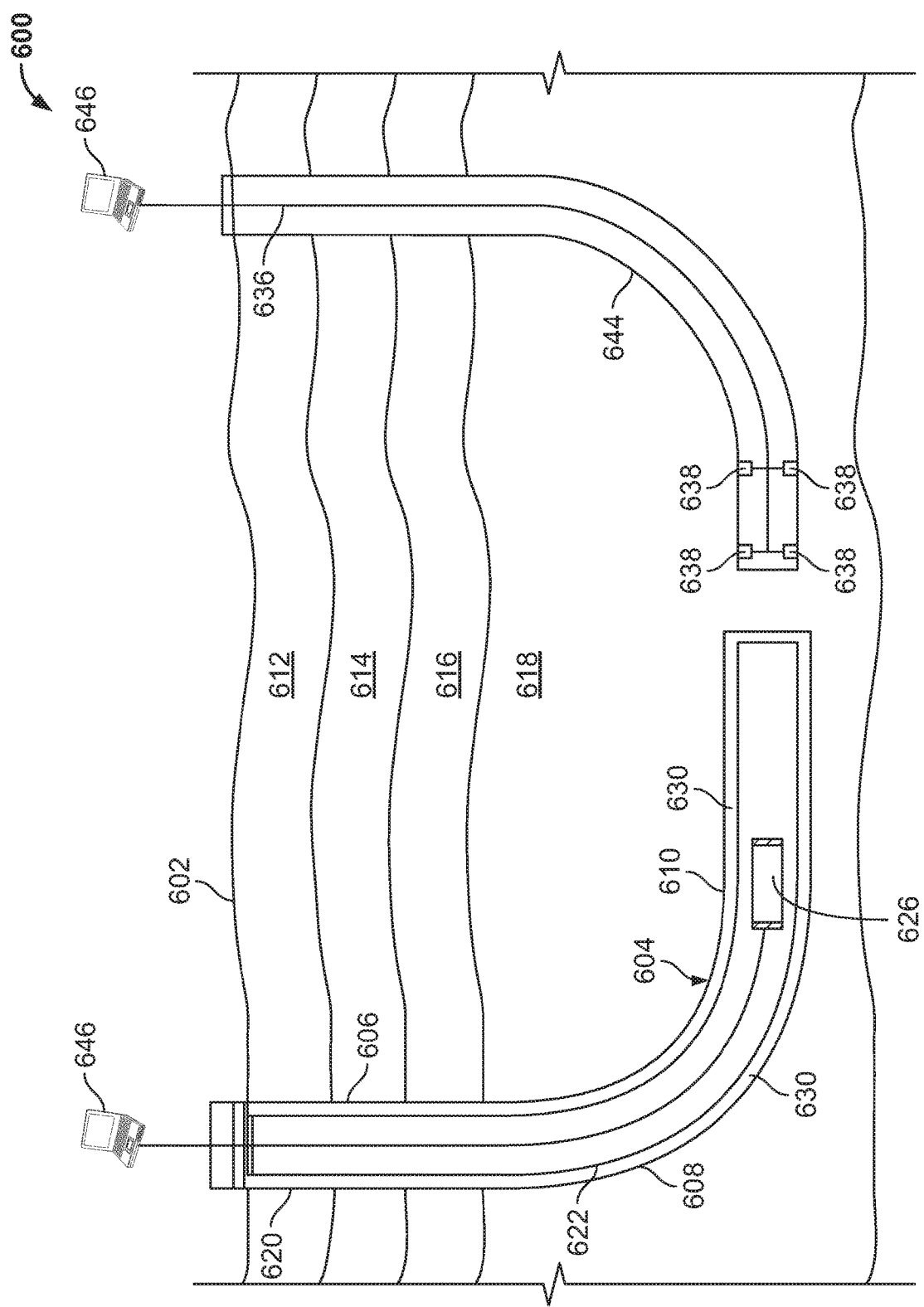

FIG. 6D shows another example implementation of the thermal property testing system 600. In this example, sensors 638 are positioned within a secondary directional drillhole 644 that is formed separately from the drillhole 604. The secondary directional drillhole 644 may be an uncased drillhole, through which the cable 636 may extend between the monitoring control system 646 and the sensors 638. In this example, the secondary directional drillhole 644 lands adjacent the substantially horizontal portion 610 and within the storage layer 618. Thus, the sensors 638 may record temperature data of the storage layer 618. In alternative aspects, the secondary directional drillhole 644 may land below the storage layer 618, above the storage layer in the impermeable layer 616, or in other layers. Further, although shown placed in the secondary directional drillhole 644 at a level adjacent the storage layer 618, sensors 638 may be placed anywhere within the secondary directional drillhole 644.

The example implementations of the thermal property testing system 600 provide a descriptive basis of the components used to determine the suitability of a subterranean formation as a hazardous waste repository from a thermal perspective. An example analysis of the system 600 and operation thereof is provided. For example, the geologic disposal of spent nuclear fuel (SNF) and high-level radioactive waste (HLW) using corrosion-resistant canisters placed in deep, sub-horizontal, small-diameter holes drilled in suitable hydrostratigraphic units that safely and securely isolate the waste from the accessible environment are analyzed. A vertical access hole cased with steel pipe is drilled preferably at or near the site where nuclear waste is currently stored in surface facilities. At the kickoff point (slightly above the targeted repository depth), the drillhole gradually curves until it is nearly horizontal, with a slight upward tilt. The diameter of the drillhole varies from 9 to 30 inches (0.23 to 0.76 m) depending on the waste type and canister dimensions. Canisters containing the waste are lowered into the vertical access hole and pushed into the horizontal disposal section; they are emplaced end-to-end (potentially spaced apart by a separation distance that is one of the design parameters investigated in the current analysis) in a casing that lines the drillhole. The disposal section and vertical access hole are eventually sealed.

As for any other geologic disposal concept (such as mined repositories or deep vertical borehole disposal), the performance of the engineered and natural barrier systems must be assessed for the specific repository design and the conditions expected during the regulatory compliance period. Focus here is on the thermal aspects of such an assessment and how they impact design decisions.

Nuclear waste releases heat due to the decay of radionuclides, elevating temperatures within the canister. The heat then dissipates into the nearby repository engineered structures and the host formation. Predicting the temperature evolution within the disposal section of the drillhole and the surrounding host rock is necessary as it may alter the properties of the multi-barrier system and potentially lead to driving forces that affect the migration of radionuclides in the near field of the repository. Heat-driven degradation mechanisms may also make the retrievability of the waste canisters more difficult. The maximum temperature and temperature-time profile of components of the engineered barrier system are primary determinants of performance, and specifically, the corrosion performance of corrosion-resistant alloy canisters and steel casing. The maximum allowable temperature which needs to be determined by analyzing the acceptable impact on barrier functions, and which may eventually be set by the regulator is thus an important design variable for a geological repository, because it determines interim storage time as well as canister loading, canister spacing, and the minimum distance between disposal drillholes. All these factors affect the configuration and length—and thus cost—of the drillholes for a given amount of waste.

The decay heat is time-dependent and determined by (a) the radionuclide inventory of the waste (itself a function of waste type and—in the case of SNF—initial enrichment and burnup percentage), and (b) the duration of post-reactor cooling. The initial temperature rise and subsequent cooling period are referred to as the heat pulse, which typically lasts a few decades to a few hundred years, until temperatures approach their ambient values prior to waste emplacement.

The temperature evolution during the heat pulse has been extensively studied for various disposal systems using both laboratory and field experiments as well as numerical analyses. Large-scale, long-term heater tests for mined repositories in the saturated zone have been conducted in underground rock laboratories dedicated to nuclear waste research. Data collected during these experiments were analyzed using advanced simulators to predict and reproduce the observed thermal, hydrological, geomechanical, and geochemical evolution of various buffer materials and the surrounding formation. These studies reveal the importance of heat generation as it induces coupled thermal-hydrologic (TH) effects. Strong thermal perturbations also affect the geochemical conditions as well as the geomechanical properties and stress state of the repository components, with complex feedback mechanisms to thermal and hydrologic processes. Several heater tests were also conducted and numerically analyzed as part of the *Yucca* Mountain project. The unsaturated, highly fractured volcanic rocks at *Yucca* Mountain and the arrangement of waste packages in open disposal drifts lead to conditions that are significantly different from those encountered in repositories that store waste in backfilled deposition holes located in the saturated zone. Since the latter configuration is more akin to that encountered in deep horizontal drillhole disposal, thermal testing and modelling at *Yucca* Mountain are not discussed further here. Finally, thermal effects arising from the disposal of high-level radioactive waste in vertical boreholes drilled deep into crystalline basement rocks of the continental crust were investigated using semi-analytical and numerical models. Some of these analyses also examined fluid flow induced by thermal expansion of the rocks and the pore fluids, and considered very high temperature cases designed to partially melt and recrystallize the granitic host rock for additional borehole sealing.

The concept of disposing nuclear waste in horizontal drillholes has some favorable attributes. In addition to operational advantages, there are a number of beneficial factors. For example, the reducing environment of the fully saturated host rock further prolongs the longevity of the canisters that are made of corrosion-resistant alloy. The linear arrangement of heat-generating nuclear waste in a drillhole makes thermal management considerably less challenging, as will be discussed below. Boiling of water at depth can be avoided, reducing the complexities of multi-phase flow processes. Moreover, relatively minor temperature changes lead to weaker thermal-mechanical stresses, helping to preserve the integrity of the engineered barriers and reducing the disturbance to the host formation. These attributes considerably reduce uncertainties that need to be propagated through performance assessment, and strengthen the technical basis for the safety case.

The goal of the present analysis is to examine the impact of (a) design parameters and (b) uncertainty in host-rock thermal properties on temperatures in and around a horizontal disposal drillhole. Response surfaces are generated based on numerical simulations of heat dissipation in such a system. Moreover, sensitivity and data-worth analyses are performed to help design an in situ heater experiment that can reduce the uncertainty in subsequent model predictions.

The analyses show that the temperature evolution in a horizontal drillhole containing heat-generating nuclear waste can be managed by adjusting a few design parameters. The thermal properties of the host formation have a dominant influence on the temperature evolution; these properties thus must be determined with sufficiently low estimation uncertainty, which can be accomplished by appropriate drillhole characterization methods and the collection of sensitive data during a short-term heater test.

Conceptual and Numerical Model Development

Waste emplacement geometry and the configuration of the engineered barriers within the horizontal drillhole need to be designed such that the maximum temperatures remain below certain limits that are set for each component of the engineered and natural repository system. The design calculations presented below are based on numerical simulations. The sophistication of the conceptual model to be developed and the level of detail with which features and processes must be represented are given by the specific purpose of the model, which in this case is to examine the thermal evolution around heat-generating waste canisters for a wide range of material properties and disposal configurations. Such scoping calculations typically have lower requirements regarding fidelity and accuracy than detailed studies in support of the safety case and performance assessment for a nuclear waste repository. Nevertheless, the simplifying assumptions made during model development must be transparent and justified in the context of the ultimate analysis to be done once the fully detailed configuration is known. The assumptions and model choices made for the current general design calculations are described in the following subsections.

System Description

The deep horizontal drillhole disposal concept targets a variety of waste forms, ranging from nuclear waste from the U.S. defense program to spent nuclear fuel (SNF) assemblies from different reactor types to vitrified high level waste (HLW). While design calculations must accommodate the specifics of each waste type (especially canister geometry and heat output characteristics), the method described here is general and can thus be illustrated using a single waste type. The disposal of capsules that contain primarily short-lived cesium-137 (137Cs) and strontium-90 (90Sr) extracted in the form of cesium chloride (CsCl) and strontium fluoride (SrF2) during the chemical processing of defense fuel are considered here. The capsules, fabricated from 316L stainless steel, are typically 20.775 inches (0.528 m) long, 2.6 inches (0.066 m) in diameter and weigh less than 10 kg. Currently, there are 1,335 cesium and 601 strontium capsules stored underwater at the Hanford Waste Encapsulation and Storage Facility; the present disclosure describes an analysis of the permanent disposal of these capsules in deep horizontal drillholes.

The analysis examines a proposal to insert one or several such capsules into a canister made of a corrosion-resistant alloy (e.g., Alloy 625); the canister will have an outer diameter of approximately 4.5 inches (0.114 m). The space between the capsule and canister is filled with an appropriate backfill material (such as quartz sand) for mechanical stability and to provide sufficient conductivity for heat dissipation. The canister is placed in a liner or casing, which has an inner diameter of 5.5 inches (0.140 m). The space between the canister and the casing (and axially between individual canisters) may be filled with drilling fluid, a slurry or a suitable buffer material (such as bentonite). The casing is likely to be cemented into an 8.5 inch (0.216 m) diameter, horizontal drillhole, which is the disposal section of the repository. The disposal section is completed in a host rock that not only exhibits favorable hydrogeological, geochemical and geomechanical properties, but is also protected by low-permeable overlaying strata (such as shales, claystones and mudstones) and has been isolated from surface waters and aquifers for very long times, as demonstrated, for example. by isotopic age determination of the resident brines. While drilling may damage the rock around the hole, the thickness of such a skin or excavation disturbed zone is expected to be small with minor impacts on the rock's thermal properties. It is further assumed that the various components are perfect cylindrical shells that are centered on the drillhole axis. The impact of an off-centered configuration on the temperature distribution has been examined and was determined to be insignificant for the purpose of these scoping calculations.

FIG. 5A shows a schematic 500 of the various components in a vertical cross section along and perpendicular to the drillhole axis (i.e., an engineered barrier system). It is assumed that waste capsule spacing is constant, that the heat source is distributed uniformly among and within waste capsules, and that gravity effects can be ignored in and around the horizontal drillhole. Under these conditions, a two-dimensional, radial model can be developed with symmetry planes perpendicular to the drillhole axis at the center of a capsule and in the midpoint between two capsules (e.g., as shown in FIG. 5B). The capsule spacing is an adjustable design parameter. The outer model radius is large enough to avoid boundary effects.

The average power output of a Sr and Cs capsule may be 193.2 W and 143.6 W, respectively. The heat output from Sr capsules is substantially more variable than that of Cs capsules, with standard deviations of 101.0 W and 14.1 W, and a maximum output of 504.6 W and 195.4 W, respectively. Nevertheless, the resulting temperature evolution for conduction-dominated heat transfer depends approximately linearly on the heat output, i.e., results calculated for a reference heat generation rate of 100 W per capsule can readily be scaled to capsules with a different initial radioactivity and a different cooling period.

As heat generation is directly related to radioactive decay, the time-dependent rate follows the exponential decay curve of the respective isotope, i.e., $$Q_H(t) = Q_{H0} \cdot e^{-\lambda_\kappa t}, \tag{1}$$

where $Q_{H0}$ is the initial heat generation rate, $\lambda_\kappa$ is the decay constant of isotope κ, which is related to the half-life $T_{1/2}$ by $\lambda_\kappa = (\ln 2)/T_{1/2}$, and t is time. The half-lives of cesium and strontium are, respectively, 30.17 and 28.79 years.

Heat generation will be assigned exclusively to the capsule itself, i.e., no heating of the other components of the drillhole or the host rock due to radiation is considered. This is justified by the fact that $^{90}$Sr (and its decay products) undergo a beta-decay, whereby the emitted electron is absorbed within the capsule. For $^{137}$Cs, about 22% of the decay energy is released by short-range electrons; the remaining 78% of the energy released by gamma rays is effectively attenuated in CsCl and Alloy 625, with only a very small fraction being deposited in the casing, and virtually none in the host rock.

Physical Processes

The dissipation of thermal energy in engineered and natural materials is mainly driven by heat conduction, and to a much smaller degree through convection by moving fluids (liquids or gases) and radiative heat transport. Latent heat effects during phase transitions and contributions from changes in the gravity potential also impact the temperature distribution. Many thermal and hydrological processes are strongly coupled, specifically if phase changes occur. Mechanical effects are triggered by thermal stresses, and the geochemistry of pore fluids and the mineral composition of the rocks are affected by temperature. While feedback mechanisms that affect temperature due to chemical reactions and stress changes do exist, they are typically much weaker than coupled thermal-hydrological effects.

For the deep horizontal drillhole system of interest, conduction is the dominant heat transfer mechanism. This is undoubtedly the case for the hydraulically impermeable, but thermally highly conductive metals of the engineered barrier system, but also for the porous backfill materials and the host rock, which—by design—are of low permeability and porosity and are located in a low hydraulic gradient environment. Radiative heat transfer is negligible for the expected temperatures and in the absence of large open space, or is included in the experimentally determined thermal conductivity value. The gravitational potential is irrelevant in the horizontal disposal section of the drillhole, and of no significance in the vertical section, specifically in the absence of flow.

Figure 7:
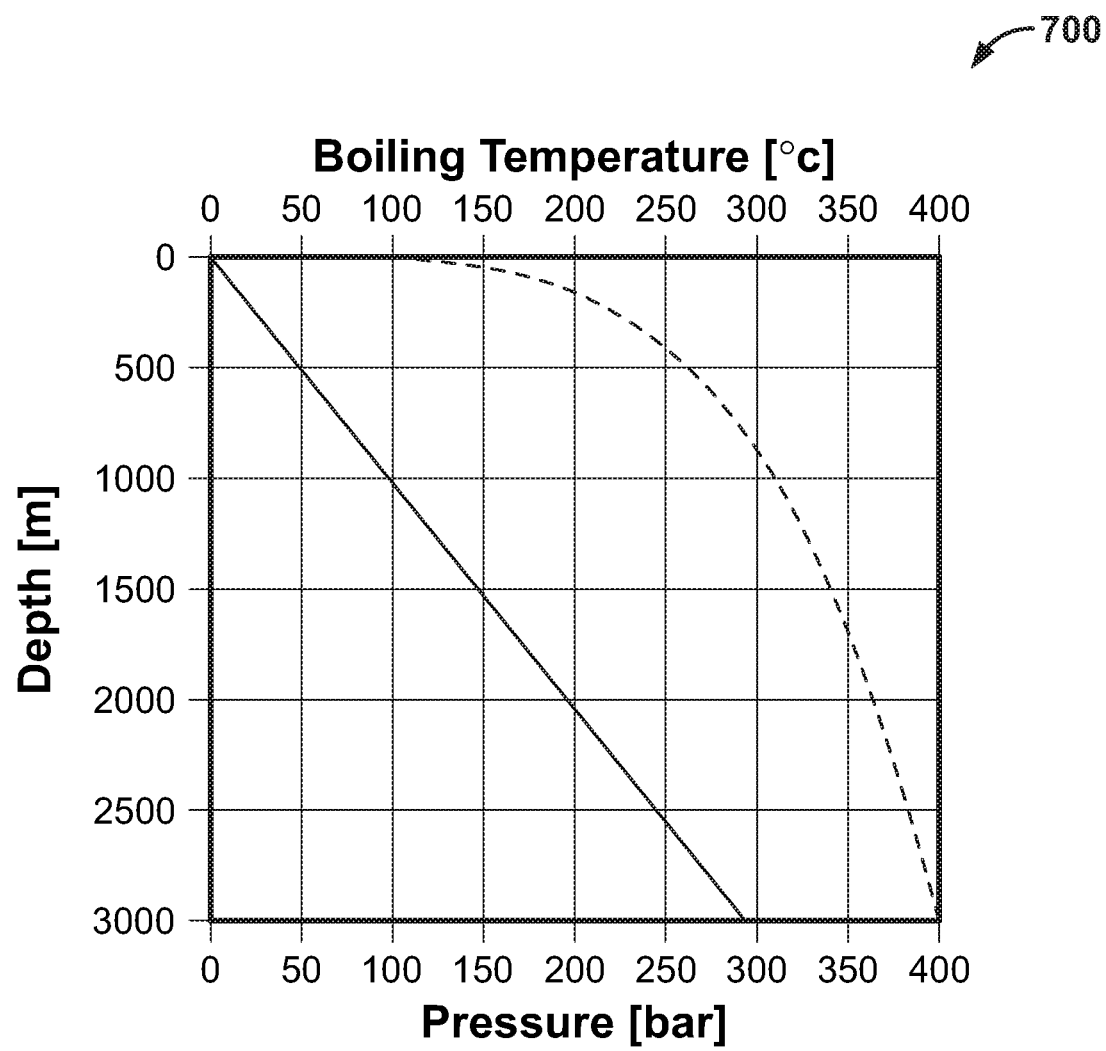

Latent heat effects are not expected in a deep drillhole repository, where ambient fluid pressures are close to hydrostatic and thus likely above the saturated vapor pressure, preventing boiling even for relatively high temperatures. FIG. 7 includes graph 700 that shows the boiling temperature (in ° C.) as a function of pressure (in bar), which is correlated to depth (in meters, m) assuming a hydrostatic pressure profile. For example, for a repository depth of 1 km, temperatures below 300° C. will not lead to boiling. Finally, latent heat effects due to melting and recrystallization of the host rock are not relevant for the temperature range considered in this study.

To avoid the complexity of coupled thermal-hydrological-geochemical processes, which are exacerbated if a steam phase evolves, it is recommended that the maximum allowable temperature in the repository be below the boiling temperature curve shown in FIG. 7. Note that a lower maximum temperature criterion may be advisable for other reasons, such as expansion and associated thermal stresses or undesirable mineralogical alterations of the buffer material or host rock. Avoiding steam also improves the corrosion performance of engineered barrier components, particularly that of canister materials.

Having heat conduction identified as the dominant heat transfer mechanism, it is helpful that the material properties appearing as coefficients in the heat conduction equation are known with an acceptable level of uncertainty, as they are likely the most influential parameters for temperature predictions. Heat conduction is a diffusive process governed by a parameter group referred to as thermal diffusivity, (K/ρc), where K is the thermal conductivity, p is the density, and c is the specific heat. These are all effective parameters for the bulk material, which consists of multiple components and phases. While density and specific heat can be calculated reasonably well as the volume average of each of the material's components, the thermal conductivity of a composite porous medium depends to a large degree on the connectivity between its more conductive and more resistive components. The arrangement and contact of particles and the connectivity of fluids in the pore space of a backfill material or geologic formation is complex and prevents an easy calculation of thermal conductivity from the properties of its components, resulting in a considerable range of values even for similar rock types. Nevertheless, effective thermal conductivities can be experimentally determined with good accuracy. The parameters are also temperature dependent, with generally decreasing thermal conductivity and increasing heat capacity as temperature increases, partially compensating each other's influence on thermal diffusivity and thus overall effect on temperature. For the design calculations discussed below, thermal conductivity is isotropic and constant, and good thermal contact is assumed at material interfaces. Note that even a small gap between two materials (filled by a liquid or gas) has the effect of an insulator, which can either be modeled explicitly or accounted for by adjusting the effective thermal conductivity.

The thermal properties of water are well known and only weakly dependent on salinity. Should a special drilling fluid, mud, or slurry be used, their thermal (and hydraulic) properties need to be measured and included in the simulations, specifically if no porous backfill material is used or convection within the drillhole or in the formation becomes significant.

While fluid flow and associated heat conduction is expected to be a minor contributor to heat transfer, it will be accounted for in the simulations. However, it is assumed that the sole driving force for fluid flow is that triggered by the thermal expansion of the fluids and pore space. Note that thermal pore expansivity partly compensates for fluid expansion, and the resulting pressure change is further mediated by elastic deformation of the pores, which in the model is assumed to depend on the pore pressure rather than effective stress.

As discussed above, a time-dependent heat source is specified, which follows the decay curve of the radionuclides in the waste. The heat source is assumed to be uniformly distributed within the volume representing the waste capsule. While the waste is not necessarily uniform, the high thermal conductivity of the capsule is likely to homogenize the temperatures and heat release to the engineered barrier system. It should be noted that while the heat-driven coupled processed outlined above are inherently complex, the horizontal drillhole concept, which promotes heat dissipation, reduces the thermal stresses and thus the challenge to predict their impacts on repository performance.

Mathematical and Numerical Model

A mathematical model of the physical processes discussed in the previous subsection is implemented in the TOUGH2 numerical simulator, which calculates non-isothermal, multiphase, multicomponent fluid flow in fractured porous media. TOUGH2 solves mass- and energy-balance equations formulated in a general, integral form. A simplified version (assuming single-phase liquid conditions with water being the only component) of the time-dependent energy balance equation can be written for an arbitrary subdomain $V_n$, which is bounded by the closed surface $\Gamma_n$ as:

$$\frac{d}{dt}\int_{V_n} [(1-\phi)\rho_s c_s T + \phi \rho_w u_w] dV_n = \int_{\Gamma_n} [-K\nabla T + hF] \cdot n d\Gamma_n + \int_{V_n} q dV_n. \quad (2)$$

The energy accumulation during time interval dt on the left-hand side of Equation (2) contains contributions from the solid and liquid phases, where $\phi$ is porosity, $\rho_s$ and $\rho_w$ are, respectively, the grain and water densities, T is temperature, $c_s$ is the solid specific heat, and $u_w$ is the specific internal energy of liquid water. The first term on the right-hand side is the heat flux across the volume boundary, which includes conductive and convective components. Here, K is the effective thermal conductivity discussed above, h is the specific enthalpy of liquid water, and n is a normal vector on the surface element $d\Gamma_n$, pointing inward into $V_n$. The liquid mass flux F is given by Darcy's law, $$F = \rho_w u = -k\frac{\rho_w}{\mu_w}(\nabla P - \rho_w g), \quad (3)$$

where u is the Darcy velocity, k is absolute permeability, $\mu_w$ is the dynamic viscosity of liquid water, P is fluid pressure, and g is the vector of gravitational acceleration. All thermophysical fluid properties are a function of pressure and temperature, accurately calculated based on the IAPWS-95 formulation. Finally, the specific source term, q in Equation (2), is proportional to the time-dependent decay heat curve of Equation (1).

TOUGH2 uses a finite volume formulation, where space discretization is made directly from the integral form of the governing conservation equations, without converting them into partial differential equations. Time is discretized fully implicitly as a first-order backward finite difference. The resulting coupled, nonlinear algebraic equations (with pressure and temperature in each grid block as the unknown primary variables), are solved simultaneously using Newton-Raphson iterations. The elements of the Jacobian matrix are calculated numerically. At each iteration, the set of linear residual equations is inverted using a preconditioned conjugate gradient solver. All analyses discussed in the following subsections are performed within the iTOUGH2 simulation-optimization framework, which performs forward simulations, solves the inverse problem, and conducts sensitivity, uncertainty, and data-worth analyses.

Model Setup

The coupled fluid flow and heat transfer processes is simulated within the two-dimensional, radial model domain shown in FIG. 5A. The model domain is discretized into cylindrical shell elements, each with an axial length of 0.5 inches (0.0127 m). The total length of the model domain in axial direction is adjustable between 12.0 inches (0.3048 m) and 84.0 inches (2.1336 m) to accommodate different separation distances between waste capsules. In radial direction, the first 100 shells have a constant thickness of 0.125 inches (0.003175 m) up to a radius of 12.5 inches (0.3175 m), after which the shell thicknesses increase logarithmically until the outer model domain radius of 3600 inches (91.44 m) is reached. The model has a total of 22,008 elements and 43,717 connections between them. Three equations (for the three primary variables pressure, saturation, and temperature) are solved at each point in space.

No-flow boundaries are specified at the symmetry planes. At the outer model domain radius, a Dirichlet boundary condition is specified with a pressure of 100 bar and a temperature of 40° C., representative of a horizontal waste disposal section at a depth of 1 km. The same values are used as initial conditions throughout the model domain. As heat transfer is only mildly impacted by the absolute pressure and temperature values, results are reported as temperature changes with respect to the initial temperature of 40° C.

A transient simulation for a duration of 30 years is performed with automatic time-step adjustment based on the convergence behavior of the Newton-Raphson iterations. The temperature change is extracted at the center of the waste capsule (X=0.0; as shown in FIG. 5B) and for select radial distances, each representing a component of the engineered barrier system. Response surfaces are created for the maximum temperature change, which is extracted by fitting a polynomial through the three highest points of the discrete time series, and setting its derivative to zero.

The key material properties are summarized in Table 13 as shown in FIG. 14M. These are reference material properties that will be adjusted over a considerable range to account for different selections of backfill materials and potential host rocks.

In Table 13, the "Range" refers to lower and upper bounds of parameters, defining the range examined by global sensitivity analysis and response surfaces; n/a: not applicable, i.e., parameter is fixed. Also, "backfill" refers to backfill of canister, casing, and annulus; each may consist of a different material, e.g., quartz sand, bentonite, drilling mud, or cement; properties to be selected based on chosen backfill material. Finally, "host rock" refers to various host rocks that can be considered, including sedimentary, magmatic, and metamorphic rocks; properties to be selected based on site-specific host rock.

Local and Global Sensitivity Analyses

In addition to calculating the temperature evaluation for the reference parameter set of Table 13 and some discrete variants, this analysis also includes extensive local and global sensitivity analyses and a data-worth analysis. Local sensitivity coefficients are needed to calculate composite sensitivity measures, and to calculate estimation and prediction uncertainties. The local sensitivity coefficients are the partial derivatives of an output variable $z_i$ with respect to an input parameter $p_j$, evaluated at the reference parameter set $p^*$:

$$S_{ij} = \frac{\partial z_i}{\partial p_j}|_{p^*}. \tag{4}$$

Because $S_{ij}$ has units of the model output over the units of the parameter, these sensitivity coefficients cannot be readily compared to each other if inputs and outputs of different types are involved. A scaled, dimensionless local sensitivity coefficient is introduced:

$$\overline{S}_{ij} = S_{ij} \cdot \frac{\sigma_{p_j}}{\sigma_{z_i}}, \tag{5}$$

where $\sigma_p$ is the input- or parameter-scaling factor, and $\sigma_z$ is the output- or observation-scaling factor. In the context of a sensitivity analysis, $\sigma_p$ is the expected parameter variation, and $\sigma_z$ denotes the threshold at which a change in the model prediction is considered significant. In the context of a data-worth analysis (as described later), $\sigma_p$ is interpreted as the acceptable parameter uncertainty, and $\sigma_z$ is the expected mean residual obtained after the inversion, or the acceptable prediction uncertainty of the target predictions.

A local sensitivity analysis indicates the relative influence of each of the unknown, uncertain, or variable parameters on the target predictions. which in in this example are the maximum temperatures at specific points within the repository system. However, if the model is nonlinear, the sensitivity coefficients depend on the parameter set, which varies considerably during the early design stages of a project. A global sensitivity analysis method is employed to identify the overall most influential parameters. As any global method, the Morris one-at-a-time (MOAT) elementary effects method examines many parameter combinations within the range of acceptable values. The MOAT method subdivides each axis of the parameter hypercube into r−1 intervals for a total of $r^n$ grid points, where n is the number of parameters. A perturbation A is then calculated for each parameter j, $$\Delta_j = \frac{r}{2(r-1)} \cdot (p_{j,max} - p_{j,min}). \tag{6}$$

A random grid point in the parameter space is selected, the model is run, and the performance measure z is evaluated. Then—one at a time and in random order—each parameter $p_j$ is perturbed by $\Delta_j$, the model is run to recalculate z, and the corresponding impact on the output (referred to as elementary effect, $EE_j$) is computed as $$EE_j = \frac{z(p_1, p_2, \ldots, p_j + \Delta_j, \ldots, p_n) - z(p_1, p_2, \ldots, p_n)}{\Delta_j}. \quad (7)$$

The procedure is repeated for multiple, randomly selected starting points of a path in the parameter space that consists of n+1 simulation runs for the evaluation of the elementary effect in the vicinity of this point. After completion of a number of such paths, the mean and standard deviation of the absolute elementary effects are calculated (denoted by $\overline{EE}$ and $\sigma_{EE}$, respectively). The mean assesses the overall influence of the respective parameter on the output; the standard deviation indicates whether the effects are linear and additive or nonlinear, or whether interactions among the parameters are involved. Response surfaces for pairs of the most important design factors identified by the global sensitivity analysis are created.

Data-Worth Analysis

Finally, a data-worth analysis is performed to help design an experiment in which the key parameters affecting maximum temperatures can be determined with sufficient accuracy. A data-worth analysis identifies and ranks the contribution that each (potential or existing) data point makes to the solution of an inverse problem (e.g., for the estimation of thermal properties) and a subsequent predictive simulation (e.g., of maximum repository temperatures). It is based on sensitivity coefficients, a linear estimation error analysis (to obtain the uncertainty in the estimated parameters given the available data and their uncertainties), and a linear uncertainty propagation analysis (to obtain the prediction uncertainty given uncertainty in the estimated parameters).

This analysis denotes n as the number of uncertain parameters that will be estimated based on in discrete measurements, i.e., n is the length of the parameter vector p, and m is the length of the observation vector z. Note that m changes during a data-worth analysis, as individual data points (or entire data sets) are either removed from the reference data set or added as potential observations. The covariance matrix of the estimated parameters, $C_{pp}$, is calculated as $$C_{pp} = (J^T C_{zz}^{-1} J)^{-1}. \quad (8)$$

Here, J is the m×n Jacobian matrix, holding the sensitivity coefficients $S_{ij}$; $C_{zz}$ is the m×m observation covariance matrix, containing the variances $\sigma_z^2$ on its diagonal.

A linear uncertainty propagation analysis is performed to yield the covariance matrix of the model predictions:

$$C_{\hat{z}\hat{z}} = \hat{J} C_{pp} \hat{J}^T. \quad (9)$$

Here, the Jacobian matrix $\hat{J}$ holds sensitivity coefficients of the prediction of interest with respect to the parameters p, whose uncertainty is described by $C_{pp}$ calculated using Equation (8).

In a data-worth analysis, the estimation and prediction uncertainty matrices, $C_{pp}$ and $C_{\hat{z}\hat{z}}$, respectively, are re-evaluated for different calibration data sets. The data worth, $\omega_{\pm k}$, is then defined as the relative increase in the prediction uncertainty (measured by the trace of $C_{\hat{z}\hat{z}}$) caused by the removal of data, or the relative decrease in the prediction uncertainty gained by the addition of data. Starting with reference data, the uncertainty analyses of Equations (8) and (9) determine whether the estimation or prediction uncertainties are sufficiently low, i.e., acceptable for the intended purpose of the model. If so, the data-worth analysis indicates which data could be removed to arrive at a less complex and less expensive design with minimal impact on the quality of the estimated parameters and without substantially increasing prediction uncertainty. If uncertainties are unacceptably high, the data-worth analysis suggests which potential data could be added to the reference data set to effectively reduce the estimation and prediction uncertainty.

Temperature Evolution

Figures 8E, 8F:
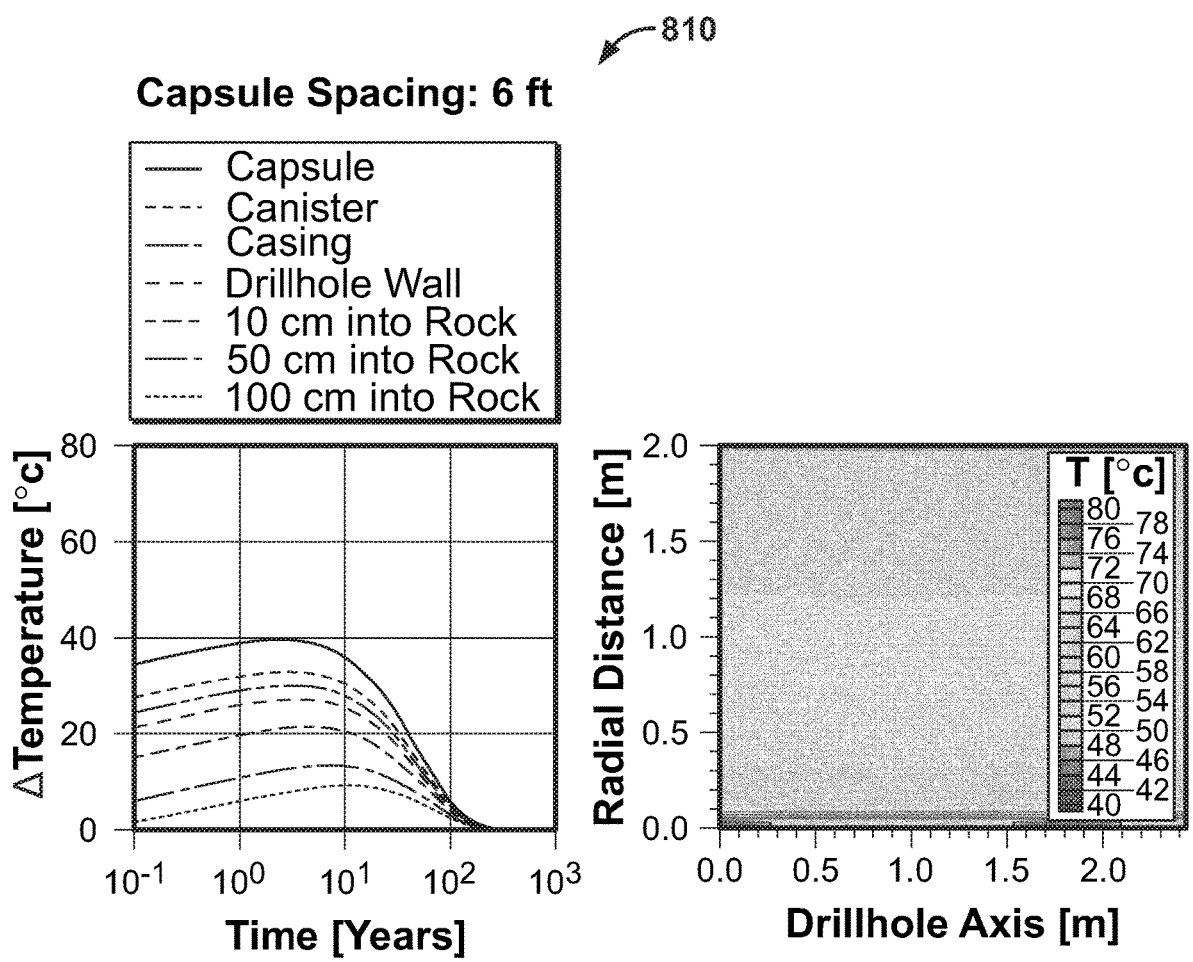

The temperature evolution at various radial distances from the center of the capsule (representing different components of the system) is shown in the graphs 800(a), 805(a), and 810(a) in FIG. 8 for three different capsule spacings; the simulated temperature distribution three years after the emplacement of heat-generating waste capsules is shown in the right column. Generally, FIG. 8 shows graphs that illustrate evolution of temperature change ((a) graphs) and temperature distribution after 3 years ((b) graphs) for an initial heat release of 100 W per waste capsule with capsule spacings of (graphs 800) 2 ft (0.6096 m); (graphs 805) 4 ft (1.219 m); and (graphs 810) 6 ft (1.829 m).

In this example, temperatures are higher if waste capsules are emplaced end-to-end with very little separation distance, and maximum temperature changes are reduced if the capsules are spaced farther apart. However, the cooling effect becomes smaller for larger separation distances, as the heat dissipation regime transitions from cylindrical (FIG. 8, graphs 800(a) and 800(b)) to approximately spherical (FIGS. 8, 810(a) and 810(b)). As a result, only irrelevant benefits regarding maximum temperature can be gained by spacing capsules by more than about 2 m.

For an initial heat output of 100 W per capsule, a dense capsule emplacement configuration with a spacing of 2 ft (0.6096 m) leads to maximum temperature increases of about 73° C. for the capsule itself, and about 60° C. at the drillhole wall. Recall that these temperature increases are proportional to the heat output. To avoid boiling in the backfill material between the canister and the casing, the initial heat output must be limited to about 360 W within a drillhole that is at a depth of 1 km at an ambient temperature of 40° C., as inferred from the boiling curve of FIG. 7 and the maximum temperature increase shown in FIG. 8 (graphs 800(a), 805(a), and 810(a)). Note that none of the cesium capsules and only a small fraction of the strontium capsules generate heat in excess of 360 W. These capsules can be stored at the surface for a longer period, or placed in the horizontal drillhole with an appropriately increased separation distance to their neighbors. In general, a slightly broadened emplacement pattern should be used to account for uncertainties in heat output, in ambient temperature and pressure, and in the thermal properties of the various materials, in particular the host rock, whose heat conductivity is most uncertain, most variable, and at the same time most influential, as demonstrated in the following sensitivity analyses.

Sensitivity Analyses

This analysis includes local and global sensitivity analyses to obtain insights into the system behavior and to identify influential and non-influential parameters. This analysis also mapped out maximum temperature changes over a wide range of the most influential parameters, creating response surfaces as a convenient design tool.

For the drillhole disposal concept, heat dissipation is almost exclusively in the radial direction, passing through different materials that are arranged in concentric, cylindrical shells. Because of this configuration, the components are encountered in series, and, consequently, heat flow is controlled by the components of relatively low thermal diffusivity. The metallic elements with a high thermal conductivity and small shell thickness (i.e., the canister and casing)

are expected to have an insignificant impact on the spatial and temporal temperature distribution. This is confirmed by a local sensitivity analysis, which is performed for a capsule spacing of 48 inches (1.22 m). A composite sensitivity measure—defined as the sum of the absolute values of the scaled sensitivity coefficients (Equation 5) for each column and row of the sensitivity matrix—is calculated for each thermal parameter (columns of S) and the maximum temperature at select locations (rows of S). This analysis also evaluated the impact of a 10% change in the heat output on the maximum temperature.

Table 14 (as shown in FIG. 14N) indicates that the heat conductivity of the host rock is the most influential parameter, followed by the strength of the heat source.

In Table 14, the parameter scaling factor for thermal conductivities and heat output are $\sigma_K=1.0$ and $\sigma_Q=10.0$, respectively; subscripts back1 and back2 refer to the backfill material between the capsule and the canister, and between the canister and the casing, respectively; the sensitivity coefficient for heat capacity and material densities are significantly smaller and are thus not tabulated. Also, observations ("Obs.") of interest are the maximum temperatures encountered during the repository lifetime; $T_{rock \times m}$ is the maximum temperature in the rock×m from the drillhole wall; as only temperatures are considered, the observation scaling factor is irrelevant—it is set to $\sigma_T=1.0$.

As expected, a 10% change in rock thermal conductivity has about the same impact as a 10% change in heat output. The conductivity of the canister backfill material has some effect on the capsule temperature, but not on the temperatures outside the canister. The thermal properties of the capsule, canister and casing are essentially irrelevant if fabricated of highly conductive material. As heat dissipates in a radially outward direction, the composite sensitivity measures for the observations generally decline with radial distance from the drillhole axis. The thermal conductivity of the host rock has its maximum influence at the drillhole wall, where the observation is collocated within the domain to which the parameter refers. These general insights are quite robust with respect to the somewhat subjective choice of the parameter scaling factor, i.e., even if the uncertainties in thermal conductivity vary between materials, this does not substantially affect the qualitative statements made above.

The local sensitivity analysis is contingent on the chosen reference parameter set (e.g., Table 13). Therefore, a Morris global sensitivity analysis is performed to examine the validity of the simple local sensitivity analysis and to examine nonlinearity and interaction effects. The parameters involved in this global sensitivity analysis and their upper and lower bounds (defining the parameter hypercube) are listed in Table 13 above. The 12-dimensional parameter hypercube is subdivided into r−1=5 intervals and examined along $n_p=40$ paths, as described in Section 2.6.

Figure 9:
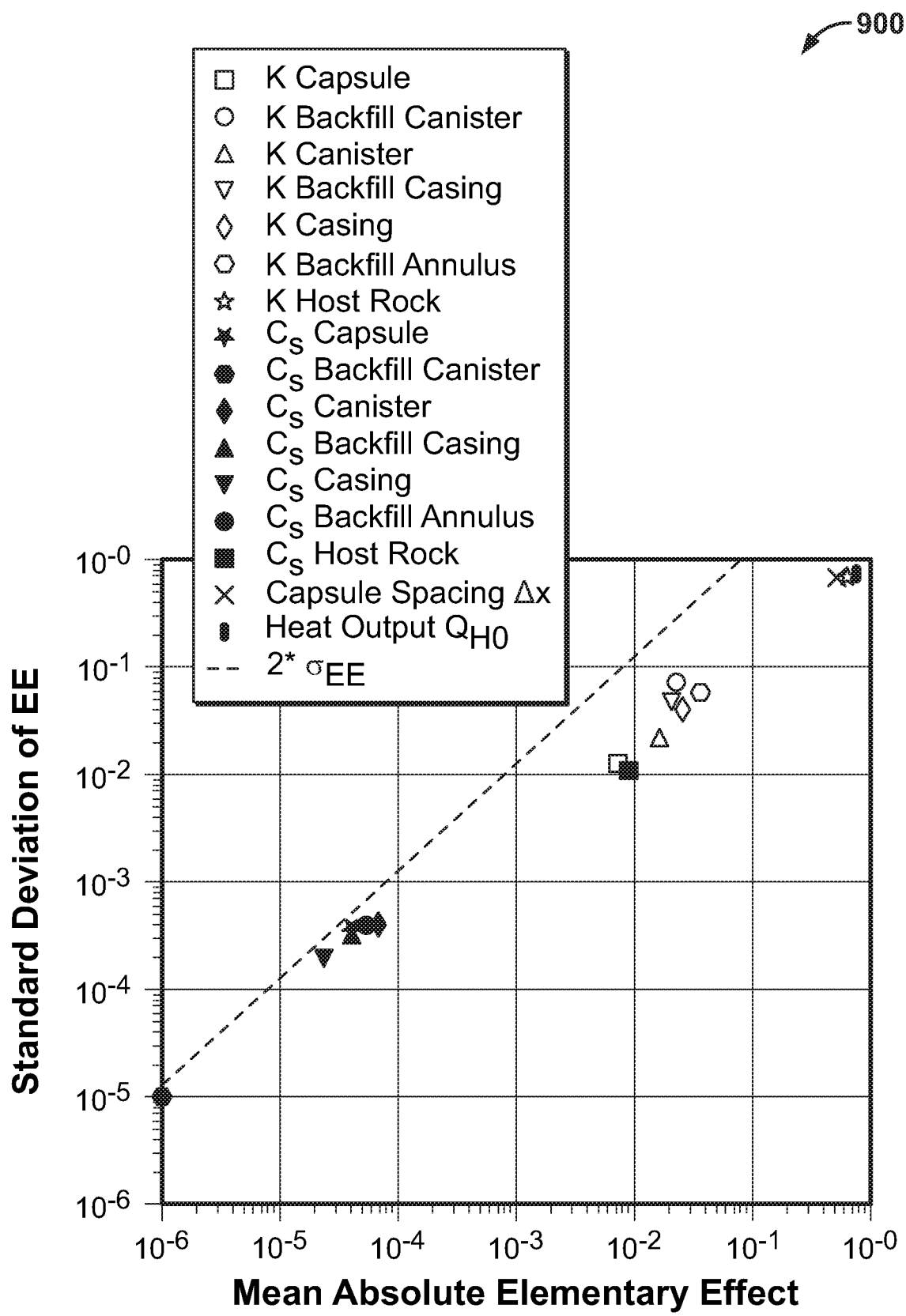

FIG. 9 shows a graph 900 that is cross-plot between the mean and standard deviation of the absolute elementary effect (EE; Equation 7) of the Morris global sensitivity analysis. The dashed line represents $|EE|=2 \cdot \sigma_{\overline{EE}}=\sigma EE/\sqrt{n_p}$ is the standard error of the mean of the elementary effect. All the parameters are below the dashed line, indicating that their non-zero impacts are statistically significant. By far the most influential parameters are the heat output (circle), the host rock's thermal conductivity (diamond), and the capsule spacing (X). With the exception of the host rock's heat capacity (triangle), thermal conductivities (diamonds) are considerably more influential than the heat capacities (triangles) for all other components. Properties that are closer to the drillhole axis (dark colors) are less influential than those further out (light colors), with the exception of the capsule's heat capacity (triangle), which influences the maximum temperature of the waste capsule. The parameters also have considerable non-zero standard deviations, indicating that they exhibit interaction effects. This is expected as the temperature is essentially determined by a weighted harmonic average of all thermal diffusivities.

The global sensitivity analysis corroborates the parameter ranking previously obtained by the local, composite sensitivity measures. While the capsule spacing is an adjustable design parameter, and the heat output of the waste capsule is well known, the host rock's heat conductivity is the main parameter that needs to be accurately determined. Any unacceptably high estimation uncertainty in this influential parameter will be propagated to high uncertainties in the predicted maximum repository temperatures. This will be addressed by the data-worth analysis, which helps reduce the estimation uncertainties of the parameters that are most influential on the model prediction of interest.

Response Surfaces

FIG. 10 (graphs (a) through (e)) shows two-dimensional response surfaces of the maximum temperature increase at select radial locations as a function of thermal conductivity of the host rock and capsule spacing. More specifically, as shown, response surfaces of maximum temperature increase as a function of host-rock thermal conductivity and capsule spacing for a 100 W initial heat output for the following repository components: (graph (a)) Waste capsule; (graph (b)) Canister; (graph (c)) Casing; (graph (d)) Drillhole wall; and (graph (e)) Host rock 1 m from the drillhole wall. Host-rock conductivity is chosen because it is the most influential property that may also vary over a considerable range depending on the rock type and spatial heterogeneity. Capsule spacing is selected as the main design parameter that can be adjusted for effective temperature control.

To obtain the actual temperature for a given combination of host-rock thermal conductivity and capsule spacing, the value from the response surface must be multiplied by the heat output factor $f_H=Q_{H0}/100$ W, and the result added to the ambient temperature at the depths of the disposal zone. Parameter combinations in the white corners of the response surfaces would lead to boiling if waste capsules with a heat output of 200 W were disposed in a horizontal drillhole at a depth of 1 km. (Recall that thermal criteria other than the boiling temperature may be relevant.) These response surfaces can be directly used to determine an appropriate capsule spacing given the relevant maximum temperature criterion for each of the repository components and the in-situ thermal conductivity of the host rock.

Figure 11A:
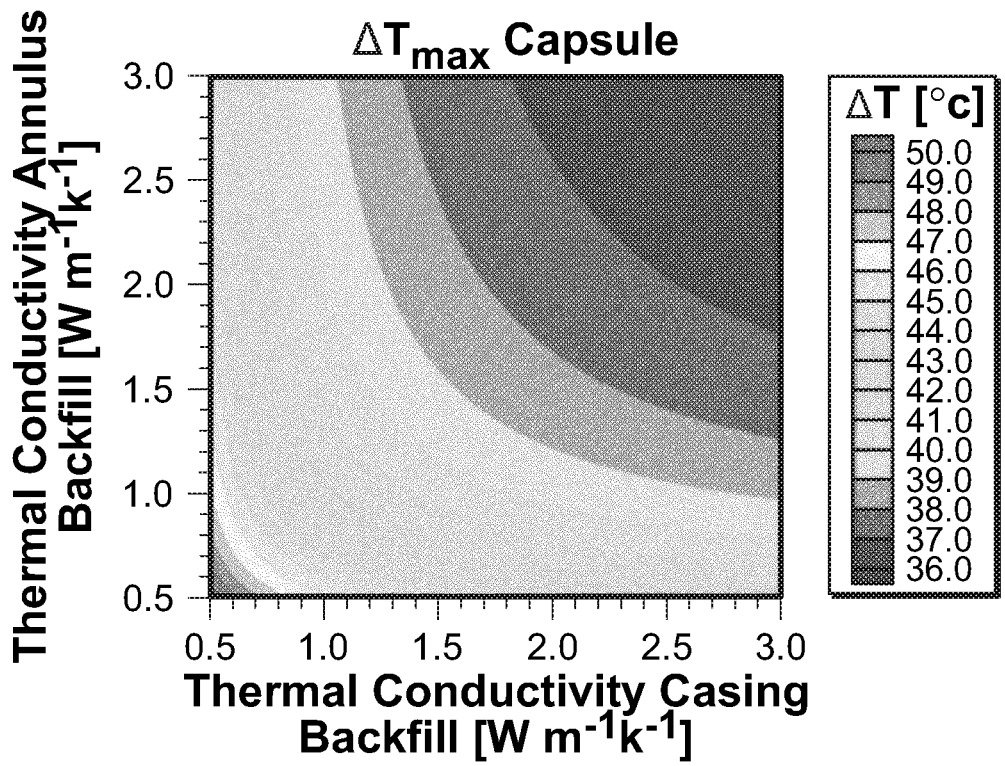
Figure 11B:
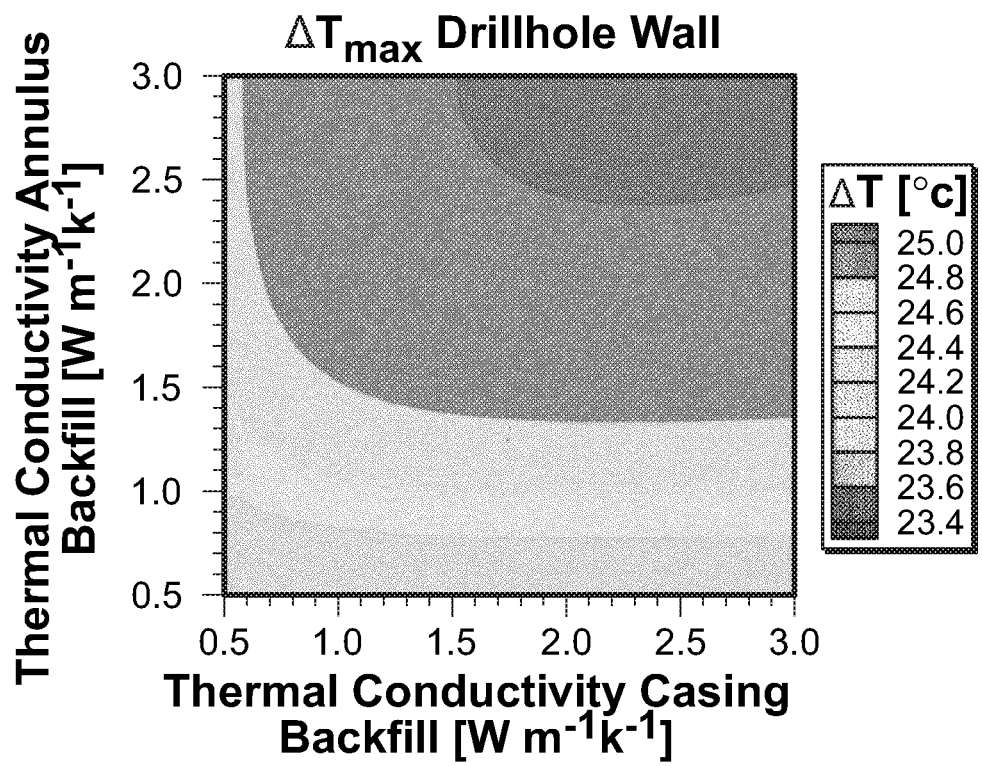

FIG. 11 shows the impact of backfill thermal conductivities on the maximum capsule and drillhole wall temperatures. More specifically, FIG. 11 shows response surfaces of maximum temperature increase as a function of casing-backfill and annulus thermal conductivities for a 100 W initial heat output for the following repository components: (graph (a)) Waste capsule; and (graph (b)) Drillhole wall.

The backfill between the canister and the casing may be a drilling mud, a slurry, sand, bentonite, cement, or another suitable material; the annulus backfill (between the casing and the drillhole wall) is, e.g., either drilling mud or cement. The lower bound of the thermal conductivity range examined in these response surfaces represents a slurry or accounts for the presence of a fluid-filled gap. Only if backfill conductivities approach these lower bounds does temperature increase slightly relative to the reference case. Note that the temperature ranges in the two response surfaces of FIG. 11 are much smaller compared to those shown in FIG. 10, confirming the lower influence of these two parameters. For thermal conductivities above about 1.5 W m$^{-1}$ K$^{-1}$, the sensitivity of the capsule temperature becomes small and essentially disappears for the drillhole wall temperature. Note that increasing thermal conductivities of the backfill materials leads to faster heat dissipation away from the capsule, thus cooling it down, while speeding up the outward propagation of the heat pulse, thus leading to increased maximum temperatures at the drillhole wall.

Data-Worth Analysis

The purpose of the data-worth analysis is to design an in situ heater test (e.g., as shown in FIGS. 6A-6D) that determines influential thermal properties with sufficient accuracy so that the maximum temperature throughout the drillhole and the adjacent host rock can be predicted with acceptable uncertainty and suitability of the host rock as a hazardous waste repository. The basic idea is to insert a capsule containing an electrical heater into the disposal section of the drillhole, backfill the test section according to the design specifications, then start releasing heat at a controlled wattage. Next, the temperature evolution data are recorded by a distributed temperature sensor (DTS). A DTS system uses a laser backscattering technique to measure temperatures continuously along an optical sensor cable, resulting in data with high spatial and temporal resolution. The temperature data are inverted to determine key properties, specifically the host rock thermal conductivity. Once the thermal properties are identified, the response surfaces of FIG. 10 can be used to determine the appropriate spacing of the actual waste capsules.

The data-worth analysis provides quantitative measures that help determine the number and location of the temperature sensors and the duration of the heating experiment. Two models—referred to as the calibration and prediction models—need to be developed and run sequentially. The calibration model simulates the heater test data, whereas the prediction model simulates the maximum temperatures induced by the disposal of heat-generating nuclear waste. The calibration model covers the short duration of the heater test; the prediction model covers the much longer duration of the thermal period.

For the reference test, a single heater of the size of an actual waste capsule, heating at a constant output of 200 W for up to 30 days is analyzed. This analysis measures temperature at a DTS sensor attached to the casing. These temperature data can be matched by the calibration model with an average residual of 1° C. This standard deviation is chosen larger than the measurement accuracy of DTS of about 0.1° C. to account for model simplifications. Should such measurements be insufficient, a temperature measurement at the surface of the heater, as well as potential DTS sensors attached to the drillhole wall can be considered. Moreover, this analysis includes some prior information about the thermal conductivities and heat capacities, reflecting independent property measurements on engineered materials (metals and backfill) as well as retrieved drill core samples or cutting fragments of the host rock. However, there is not reliance on this information to be very accurate; it is mainly used to stabilize the solution of the notional inverse problem (Equation 8). Uncertainty in the heater output is also considered by estimating it during the inversion, with a standard deviation of 20° C. assigned to its prior information value.

Figure 12:
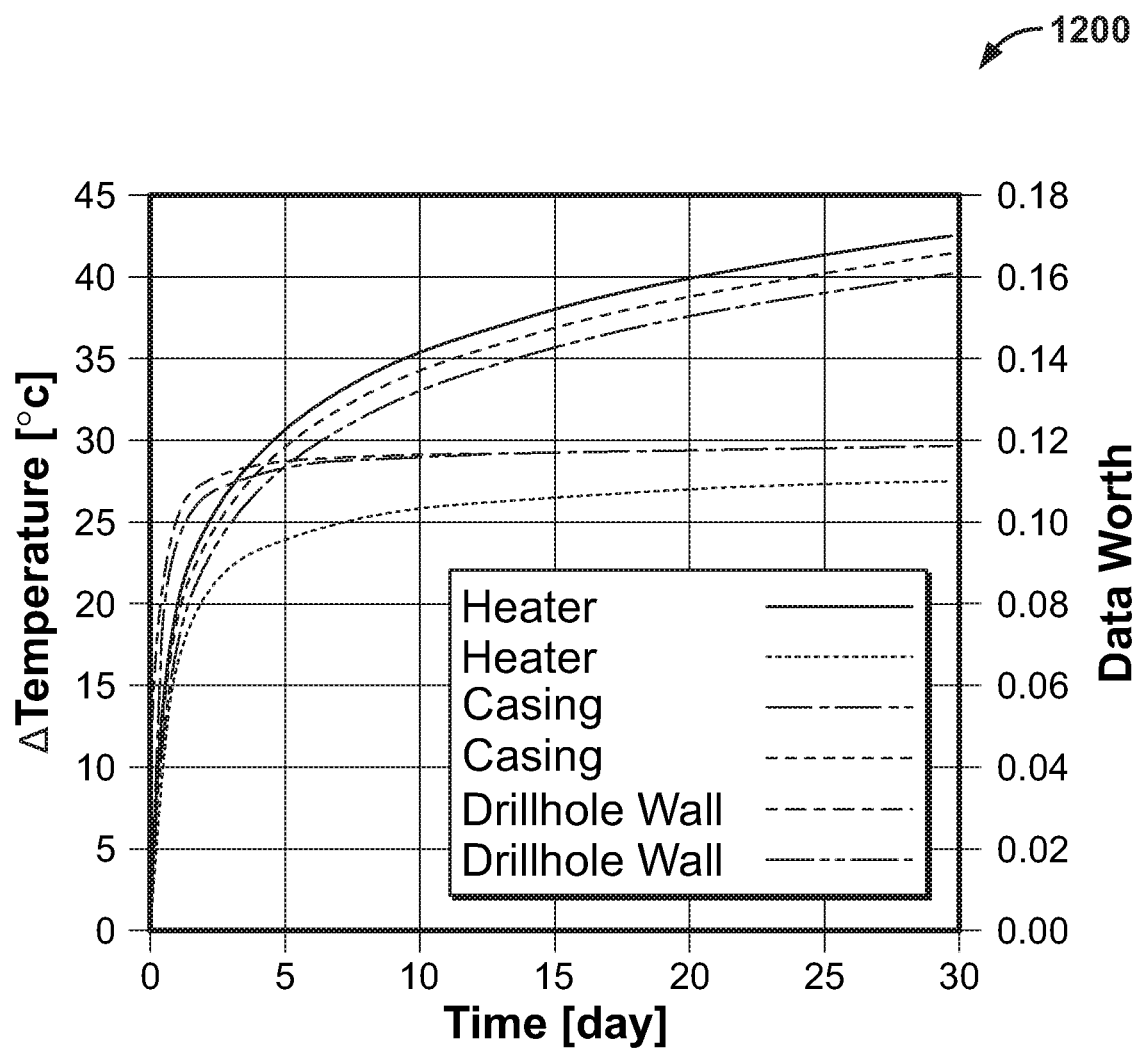

FIG. 12 shows a graph 1200 that shows the temperature increase and the data-worth metric as a function of heating time. The temperature increase exceeds 20° C. after less than 2 days, and reaches 40° C. after 30 days of heating, with only slightly higher temperatures at the heater compared to the drillhole wall. The dimensionless data-worth metric measures the relative reduction in uncertainty of the predicted maximum repository temperatures as data are added. Data worth increases sharply during the initial days of heating. At later times the data worth, which accounts for parameter correlations and redundancies of closely spaced data points, approaches a constant value. This indicates that the information content of the DTS data initially grows quickly, but is reduced to a constant rate as the heater test is prolonged. Accurately measuring temperatures at early times is most beneficial, with later data providing additional, albeit less important information. The test can be terminated once the acceptable prediction uncertainty is achieved.

In some aspects, no significant benefits can be gained by moving the DTS from the casing to the drillhole wall or towards the heater. Installation of the DTS fiber-optic cable by clamping it to the outside of the casing is not only most practical, but also desirable as it avoids interference of the cable with waste emplacement operations. Thus in some aspects, focus is only on the DTS data collected along the casing, discarding the use of additional sensors.

The results of the notional inversion are first discussed, which is simply the evaluation of Equation (8) with the assumption that the match to the (still non-existent) data is consistent with the prior observation covariance matrix, $C_{zz}$. The resulting covariance matrix of the estimated parameters, $C_{pp}$, reveals that performing the heater test mainly helps determine the thermal conductivity of the host rock.

Table 15 (as shown in FIG. 14O) shows the estimation and prediction uncertainties for different testing durations. Without conducting an in situ heater test, the uncertainty in the predicted maximum temperature is high. For example, on the 95% confidence level, the prediction of the maximum temperature change at the drillhole wall would read $\Delta T_{wall}=34\pm30°$ C. Even granted that the normality and linearity assumptions underlying the uncertainty analysis of Equation (9) are violated, this large uncertainty renders the prediction essentially not very useful.

In Table 15, the "Prediction" refers to uncertainty of predicted maximum component temperature during repository life time.

Performing a one-day long heater test, the estimation uncertainty of the most influential parameter, the host rock thermal conductivity, is reduced from its prior value of 1.0 to less than 0.3 W m$^{-1}$ K$^{-1}$. An even lower uncertainty can be achieved if the heater output is controlled accurately, a result of the fact that these two parameters are strongly correlated. Combined with uncertainty reductions in the other parameters that are concurrently estimated with $K_{rock}$ leads to considerably improved temperature predictions. Specifically, the maximum temperature at the drillhole wall now reads $\Delta T_{wall}=34\pm6°$ C. Whether such a prediction uncertainty is acceptable depends on its use for repository design and performance assessment. The uncertainties can be further reduced by prolonging the heater test, albeit with diminishing added value for the later times. If testing lasts for 10 days or longer, the uncertainty of the model-predicted maximum temperature experienced by the host rock at the drillhole wall is less than 1° C.

The temperature evolution in the disposal section of a horizontal drillhole was simulated for a wide range of thermal properties of engineered and natural materials. For example, this analysis specifically examined the maximum temperatures encountered during the thermal pulse period at selected locations within the drillhole and the near-field host rock. The sensitivity analyses indicate that the key factors affecting maximum temperatures are the thermal conductivity of the host rock, the spacing between waste capsules, and the wattage of the heat-generating waste. The global sensitivity analysis demonstrate that the identification of the most influential parameters is robust even if the reference property values are uncertain or variable over a wide range. Of these three influential parameters, only the heat conductivity of the host rock cannot be adjusted and needs to be determined for in situ conditions at the selected disposal site. Should its value turn out to be too low (leading to excessive temperatures in the repository), a different layer needs to be chosen, or an altogether different site explored. The heat output of the waste can be partly controlled by extending the post-reactor cooling period. Finally, the spacing of waste within the drillhole is the main, readily adjustable design parameter used for thermal management of the repository.

The thermal properties of the backfill material have a much smaller impact on the maximum temperatures. Temperatures increase somewhat if backfill conductivities approach very small values. Such small values may only occur if a relatively wide, fluid-filled gap develops over the entire circumference of the canister, casing, or drillhole wall, acting as an insulator. Despite this possibility, it can be recommended that a suitable backfill material should be selected mainly based on its ability to fulfill a specific barrier function rather than because of its thermal properties.

This analysis also examined the possibility to perform an in situ heater test to determine the thermal performance of the as-built repository system. From an operational point of view, the proposed heater test is well integrated into the site development and characterization process. After completion of the drillhole, the heater (which has the same dimensions as the waste capsule) is pushed to the end of the disposal section, testing the integrity of the drillhole and the absence of obstructions, confirming that emplacement of actual waste capsules is possible. The short testing section is then instrumented and backfilled according to the design specifications, testing the corresponding procedures. Heating and data collection begins. While the heater experiment is running, the entire drillhole is available for logging, characterization and disposal preparation. Temperature data are analyzed in real time by performing inversions using a calibration model that will be set up in advance. Once sufficient data are collected such that the site-specific thermal properties are determined with the desired level of accuracy, the heater test can be terminated, and waste emplacement may commence. If there are indications of considerable heterogeneities along the drillhole, the heater test may be repeated at selected locations. Finally, the DTS sensors can be used to observe the thermal evolution along the disposal section as part of performance confirmation monitoring. The design of the heater experiment (including the way power is supplied) should be further optimized and tested in a pilot drillhole. If the main goal is only to determine the host rock's thermal conductivity under in situ conditions (i.e., without testing the thermal performance of the as-built engineered barrier system), a less intrusive approach using a combination of DTS and a borehole-length electrical resistance heater (a system referred to as distributed thermal perturbation sensor) could be considered.

The maximum temperature expected within a horizontal drillhole and the surrounding host formation is an important factor that mainly affects our ability to robustly predict repository performance. These temperatures need to be simulated with acceptably low prediction uncertainty in order to provide a defensible basis for the demonstration that they are below regulatory thermal limits. While such thermal limits are not discussed or proposed in this study, it is recommended that repository temperatures remain below the boiling temperature under in situ conditions at all times to avoid the significant complexities arising from phase changes and the related coupled processes.

In general, the linear arrangement of waste capsules or spent nuclear fuel assemblies in a long horizontal drillhole leads to relatively large specific surface areas available for heat dissipation. Thermal management for a drillhole repository is thus less challenging compared to that in other repository concepts, where relatively large volumes of heat-generating waste are densely packed in mined caverns or large-diameter deposition holes. For a moderate capsule spacing of about 2 m, thermal interference is very small; denser loading of the disposal section of the drillhole can be justified using the design approach outlined here. The simulations show that waste spacing is a very effective design parameter to manage temperatures in the disposal section of the drillhole.

The design calculations presented here were done for the disposal of relatively small, but thermally hot cesium and strontium capsules. The maximum temperatures for a cesium capsule, which typically generates about 100 W at the time it is emplaced in the drillhole, are less than 100° C. above the ambient temperature, i.e., far below the in situ boiling temperature. Only a small fraction of the strontium capsules have high enough heat output to considerably raise the temperatures, but these cases can be readily managed by increasing the capsule spacing. The thermal maximum is reached after less than 10 years, i.e., a time much shorter than that predicted for a large, mined repository. Note that deep nuclear waste isolation in horizontal drillholes is considered feasible also for other waste forms, specifically SNF assemblies. The thermal analyses discussed in this paper need to be adapted for the specific geometry and heat output of these other waste forms.

While predominantly conductive heat transfer is appropriately captured by focusing on the local behavior in a short section of the repository, other processes (e.g., corrosion gas migration, regional fluid flow, radionuclide transport) may require that the entire drillhole (including the vertical access section) be modeled. Nevertheless, an overall approach similar to the one presented here can be used to examine such processes in support of repository design, uncertainty quantification, and performance assessment.

Parameters that are both influential and uncertain need to be carefully assessed prior to performing design calculations and uncertainty analyses. This analysis demonstrates through a data-worth analysis that a short-term in situ heater test is a viable approach to robustly identify the key factors affecting the temperature evolution in the repository. The main conceptual idea is to run a test that (a) uses the as-built configuration under in situ conditions (thus testing the actual disposal system), (b) examines the system at the actual scale (thus avoiding the need for upscaling), (c) perturbs the system using thermal stresses (thus invoking the relevant process), and (d) collects (temperature) data that are identical to the prediction variable of interest (thus avoiding the need for indirect inferences). A well-designed heater test, which can readily be integrated into the operation of a horizontal drillhole waste repository, is an effective, defensible way to obtain confidence in the thermal system behavior, and to improve the ability to make robust predictions about the suitability of a rock formation as a hazardous waste repository.

Figure 13:
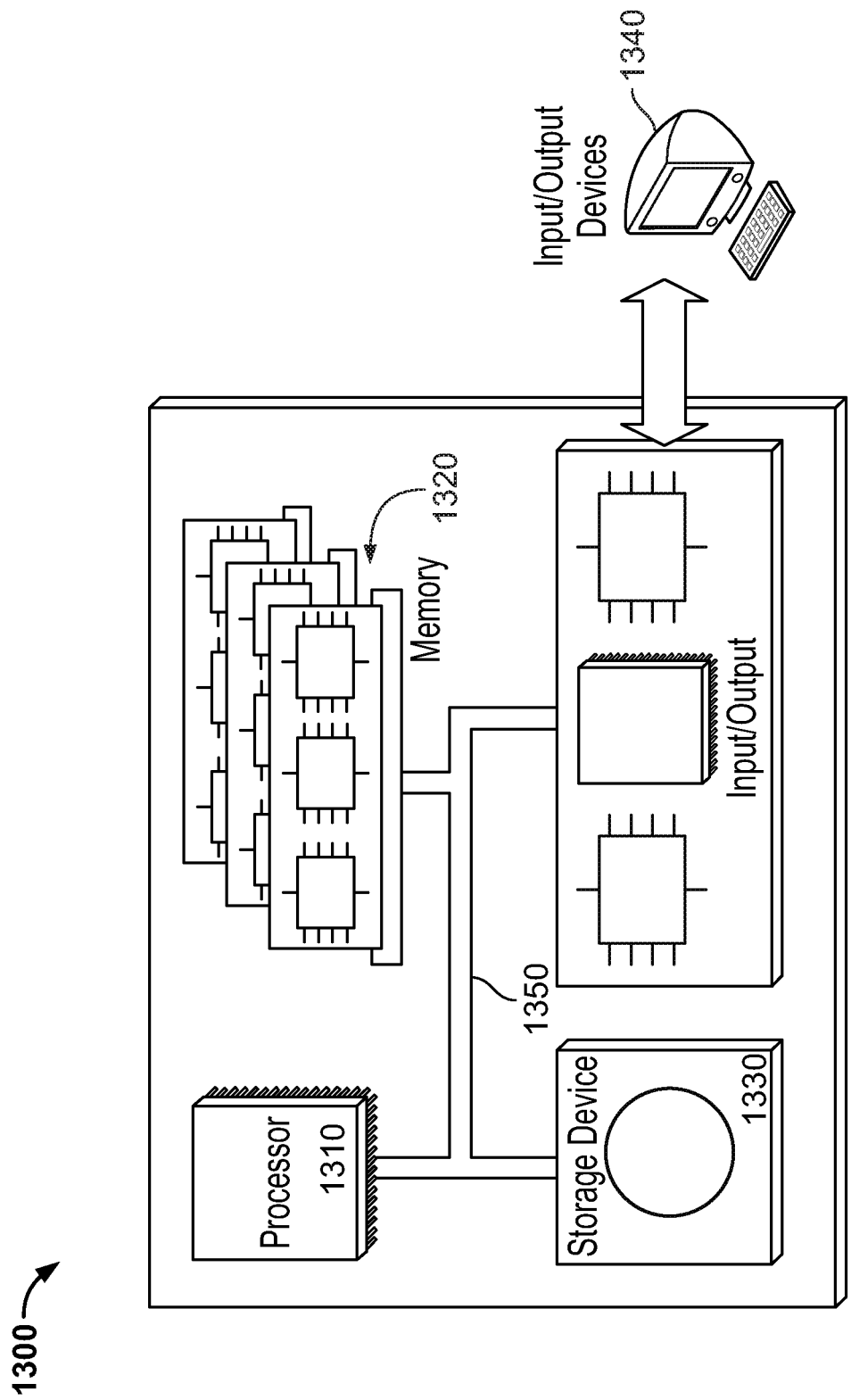
FIG. 13 is a schematic illustration of a controller (or control system) according to the present disclosure.

FIG. 13 is a schematic illustration of a controller (or control system) 1300 according to the present disclosure. For example, the controller 1300 can be used for the operations described previously, for example as or as part of the heating and monitoring control system 646. For example, the controller 1300 may be communicably coupled with, or as a part of, a hazardous material repository as described herein.

The controller 1300 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 1300 includes a processor 1310, a memory 1320, a storage device 1330, and an input/output device 1340. Each of the components 1310, 1320, 1330, and 1340 are interconnected using a system bus 1350. The processor 1310 is capable of processing instructions for execution within the controller 1300. The processor may be designed using any of a number of architectures. For example, the processor 1310 may be a CISC (Complex Instruction Set Computers) processor, a RISC (Reduced Instruction Set Computer) processor, or a MISC (Minimal Instruction Set Computer) processor.

In one implementation, the processor 1310 is a single-threaded processor. In another implementation, the processor 1310 is a multi-threaded processor. The processor 1310 is capable of processing instructions stored in the memory 1320 or on the storage device 1330 to display graphical information for a user interface on the input/output device 1340.

The memory 1320 stores information within the controller 1300. In one implementation, the memory 1320 is a computer-readable medium. In one implementation, the memory 1320 is a volatile memory unit. In another implementation, the memory 1320 is a non-volatile memory unit.

The storage device 1330 is capable of providing mass storage for the controller 1300. In one implementation, the storage device 1330 is a computer-readable medium. In various different implementations, the storage device 1330 may be a floppy disk device, a hard disk device, an optical disk device, a tape device, flash memory, a solid state device (SSD), or a combination thereof.

The input/output device 1340 provides input/output operations for the controller 1300. In one implementation, the input/output device 1340 includes a keyboard and/or pointing device. In another implementation, the input/output device 1340 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, solid state drives (SSDs), and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

A first example implementation according to the present disclosure includes a method for testing a hazardous waste repository site. The method includes running a heating unit into a drillhole that is formed from a terranean surface into or under a subterranean zone that includes a rock formation. The drillhole includes a vertical portion formed from the terranean surface and a non-vertical portion coupled to the vertical portion that is formed in or under the subterranean zone. The non-vertical portion includes a hazardous material repository portion configured to store one or more canisters configured to enclose hazardous material. The method further includes positioning the heating unit in the hazardous material repository portion of the non-vertical portion of the drillhole; operating the heating unit to generate heat in the hazardous material repository portion for a specified time duration; monitoring a temperature in or near the hazardous material repository portion of the drillhole during the specified time duration; and based on the monitored temperature, determining one or more thermal properties of at least one of the rock formation or the hazardous material repository portion of the drillhole.

In an aspect combinable with the first example implementation, the rock formation includes at least one of a sedimentary, an igneous, or a metamorphic rock formation, such as at least one of shale, claystones, or mudstones.

In another aspect combinable with any of the previous aspects of the first example implementation, the hazardous material includes nuclear material waste.

In another aspect combinable with any of the previous aspects of the first example implementation, the nuclear waste includes spent nuclear fuel.

In another aspect combinable with any of the previous aspects of the first example implementation, the heating unit is a similar size of one of the one or more canisters.

In another aspect combinable with any of the previous aspects of the first example implementation, the heating unit is configured to output between 50 and 500 watts of heat for the time duration.

In another aspect combinable with any of the previous aspects of the first example implementation, monitoring the temperature includes measuring the temperature with a temperature sensor positioned on a casing positioned in the drillhole.

In another aspect combinable with any of the previous aspects of the first example implementation, the temperature sensor includes a distributed temperature sensor (DTS) that includes an fiber-optical sensor cable.

In another aspect combinable with any of the previous aspects of the first example implementation, the one or more thermal properties includes thermal diffusivity of the rock formation.

Another aspect combinable with any of the previous aspects of the first example implementation further includes aggregating a plurality of the monitored temperatures during the time duration.

Another aspect combinable with any of the previous aspects of the first example implementation further includes determining a change of temperature in or near the hazardous material repository portion of the drillhole based on the plurality of the monitored temperatures during the time duration.

Another aspect combinable with any of the previous aspects of the first example implementation further includes calculating a data-worth metric based on the plurality of the monitored temperatures during the time duration, the data-worth metric including a relative reduction in uncertainty of a relevant performance measure such as maximum temperature predicted in or near the hazardous material repository portion of the drillhole.

Another aspect combinable with any of the previous aspects of the first example implementation further includes determining an uncertainty of the thermal diffusivity of the rock formation based on the temperature monitored in or near the hazardous material repository portion of the drillhole during the time duration.

Another aspect combinable with any of the previous aspects of the first example implementation further includes stopping operation of the heating unit based on at least one of the uncertainty of the thermal diffusivity of the rock formation or the uncertainty of the predicted performance measure being less than a threshold value.

Another aspect combinable with any of the previous aspects of the first example implementation further includes determining a portion of the one or more thermal properties of at least one of the rock formation or the hazardous material repository portion of the drillhole based on the determined thermal diffusivity of the rock formation.

In another aspect combinable with any of the previous aspects of the first example implementation, the portion of the one or more thermal properties of at least one of the rock formation or the hazardous material repository portion of the drillhole includes at least one of a spacing distance between adjacent canisters placed in the hazardous material repository portion; a maximum allowable heat output of the hazardous material; a minimum allowable range of a thermal diffusivity of a backfill material positioned in the one or more canisters; a minimum allowable range of a thermal diffusivity of a backfill material positioned in drillhole; a minimum allowable range of a thermal diffusivity of the casing; or a minimum allowable range of a thermal diffusivity of a canister material.

Another aspect combinable with any of the previous aspects of the first example implementation further includes determining a suitability of the hazardous material repository portion of the non-vertical portion of the drillhole formed in or under the subterranean zone based on the determined thermal diffusivity of the rock formation.

Another aspect combinable with any of the previous aspects of the first example implementation further includes, based on the determined suitability, moving the one or more canisters from the terranean surface, through the vertical portion of the drillhole, through the non-vertical portion of the drillhole, and into the hazardous material repository portion.

Another aspect combinable with any of the previous aspects of the first example implementation further includes filling at least a portion of the drillhole with a backfill material.

Another aspect combinable with any of the previous aspects of the first example implementation further includes removing the heating unit from the drillhole prior to moving the one or more canisters through the vertical portion of the drillhole.

A second example implementation according to the present disclosure includes a thermal testing system for a hazardous waste repository configured to perform the operations of the first example implementation and all of the aspects of the first example implementation.

A third example implementation includes a method that includes forming a vertical access drillhole from a terranean surface toward a subterranean zone that includes a hazardous waste repository; forming at least one curved access drillhole from the vertical access drillhole toward or into the subterranean zone; forming a horizontal drillhole into the subterranean zone from the at least one curved access drillhole, the horizontal drillhole including at least a portion of the hazardous waste repository; moving radioactive water from the terranean surface, through the vertical access drillhole and the at least one curved access drillhole, and into the hazardous waste repository of the horizontal drillhole; and installing at least one seal within at least one of the vertical access drillhole or the curved access drillhole.

In an aspect combinable with the third example implementation, the radioactive water includes a radioactive material.

In another aspect combinable with any of the previous aspects of the third example implementation, the radioactive material includes at least one of tritium, cesium, or strontium.

In another aspect combinable with any of the previous aspects of the third example implementation, moving the radioactive water includes pumping the radioactive water into the hazardous waste repository of the horizontal drillhole.

Another aspect combinable with any of the previous aspects of the third example implementation further includes, prior to pumping the radioactive water into the hazardous waste repository of the horizontal drillhole, mixing the radioactive water with a cementitious material or a gel.

Another aspect combinable with any of the previous aspects of the third example implementation further includes enclosing the radioactive water into one or more hazardous waste canisters.

In another aspect combinable with any of the previous aspects of the third example implementation, moving the radioactive water into the hazardous waste repository of the horizontal drillhole includes moving the one or more hazardous waste canisters into the hazardous waste repository of the horizontal drillhole.

Another aspect combinable with any of the previous aspects of the third example implementation further includes, prior to enclosing the radioactive water into one or more hazardous waste canisters, mixing the radioactive water with a cementitious material or a gel.

In another aspect combinable with any of the previous aspects of the third example implementation, the one or more hazardous waste canisters include a corrosion-resistant alloy.

Another aspect combinable with any of the previous aspects of the third example implementation further includes installing a casing in the horizontal drillhole; and securing the casing in the horizontal drillhole with cement.

Another aspect combinable with any of the previous aspects of the third example implementation further includes mixing at least a portion of the radioactive water with a cementitious aggregate to form the cement; and circulating the formed cement between the casing and the horizontal drillhole.

Another aspect combinable with any of the previous aspects of the third example implementation further includes monitoring the radioactive water stored in the hazardous waste repository of the horizontal drillhole.

In another aspect combinable with any of the previous aspects of the third example implementation, monitoring includes measuring an amount of beta or gamma radiation in the horizontal drillhole near the stored radioactive water.

In a fourth example implementation, a hazardous waste repository includes a vertical access drillhole formed from a terranean surface toward a subterranean zone that includes a hazardous waste repository; at least one curved access drillhole formed from the vertical access drillhole toward or into the subterranean zone; and a horizontal drillhole formed into the subterranean zone from the at least one curved access drillhole. The horizontal drillhole includes at least a portion of the hazardous waste repository configured to enclose a volume of radioactive water moved from the terranean surface. The horizontal drillhole is formed through the vertical access drillhole and the at least one curved access drillhole, and into the hazardous waste repository of the horizontal drillhole. The repository also includes at least one seal installed within at least one of the vertical access drillhole or the curved access drillhole.

In an aspect combinable with the fourth example implementation the radioactive water includes a radioactive material.

In another aspect combinable with any of the previous aspects of the fourth example implementation, the radioactive material includes at least one of tritium, cesium, or strontium.

In another aspect combinable with any of the previous aspects of the fourth example implementation, the volume of radioactive water is pumped into the hazardous waste repository of the horizontal drillhole.

In another aspect combinable with any of the previous aspects of the fourth example implementation, the volume of radioactive water is mixed with a cementitious material or a gel.

In another aspect combinable with any of the previous aspects of the fourth example implementation, the volume of radioactive water is enclosed in one or more hazardous waste canisters.

In another aspect combinable with any of the previous aspects of the fourth example implementation, the one or more hazardous waste canisters are stored in the hazardous waste repository of the horizontal drillhole.

In another aspect combinable with any of the previous aspects of the fourth example implementation. the mixed volume of radioactive water and cementitious material or gel is enclosed within the one or more hazardous waste canisters.

In another aspect combinable with any of the previous aspects of the fourth example implementation, the one or more hazardous waste canisters include a corrosion-resistant alloy.

Another aspect combinable with any of the previous aspects of the fourth example implementation further includes a casing installed in the horizontal drillhole; and cement that secures the casing in the horizontal drillhole.

In another aspect combinable with any of the previous aspects of the fourth example implementation, the cement includes at least a portion of radioactive water mixed with a cementitious aggregate.

Another aspect combinable with any of the previous aspects of the fourth example implementation further includes a downhole monitoring system configured to monitor the radioactive water stored in the hazardous waste repository of the horizontal drillhole.

In another aspect combinable with any of the previous aspects of the fourth example implementation, the monitoring system is configured to measure an amount of beta or gamma radiation in the horizontal drillhole near the stored radioactive water.

In another aspect combinable with any of the previous aspects of the fourth example implementation, the monitoring system includes a wire or fiber optic cable positioned in at least a portion of the horizontal drillhole to measure the amount of beta or gamma radiation.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A hazardous material repository, comprising:
 a drillhole formed from a terranean surface into a subterranean zone that comprises a geologic formation, the drillhole comprising a vertical portion and a non-vertical portion coupled to the vertical portion by a transition portion, the non-vertical portion comprising a storage volume for hazardous waste;
 a casing installed between the geologic formation and the drillhole, the casing comprising one or more metallic tubular sections formed of API-5CT L80 steel;
 at least one canister positioned in the storage volume of the non-vertical portion of the drillhole, the at least one canister sized to enclose a portion of hazardous material and comprising an outer housing formed from a nickel-chromium-molybdenum alloy;
 an engineered filling inserted into the drillhole to fill at least a portion of the storage volume between the at least one canister and the casing, the engineered filling comprising a deaerated bentonite-based slurry; and
 a backfill material inserted into the at least one canister to fill a void between the portion of hazardous material and the canister, the backfill material comprising a quartz material.

2. The hazardous material repository of claim 1, wherein the hazardous material comprises radioactive material waste.

3. The hazardous material repository of claim 2, wherein the radioactive material waste comprises one or more portions of a spent nuclear fuel assembly.

4. The hazardous material repository of claim 2, wherein the geologic formation is at a depth in which a hydrostatic pressure at the depth is great enough to prevent boiling of water at a boiling point of about 310° C., or the geologic formation comprises pore water that is highly reducing, or the geologic formation comprises a rock in which pore waters are anoxic, or the geologic formation comprises a fully saturated rock formation.

5. The hazardous material repository of claim 1, wherein the nickel-chromium-molybdenum alloy comprises Alloy 625.

6. The hazardous material repository of claim 1, wherein a wall thickness of the at least one canister is between 9.25 mm and 10 mm.

7. The hazardous material repository of claim 6, wherein a wall thickness of the casing is 12.5 mm.

8. The hazardous material repository of claim 1, wherein a wall thickness of the casing is 12.5 mm.

9. The hazardous material repository of claim 1, wherein the bentonite-based slurry is pumped from the terranean surface into the non-vertical portion of the drillhole to fill the portion of the storage volume between the at least one canister and the casing.

10. The hazardous material repository of claim 1, wherein the geologic formation is at a depth in which a hydrostatic pressure at the depth is great enough to prevent boiling of water at a boiling point of about 310° C., or the geologic formation comprises pore water that is highly reducing, or the geologic formation comprises a rock in which pore waters are anoxic, or the geologic formation comprises a fully saturated rock formation.

11. The hazardous material repository of claim 1, wherein a thermal load of the hazardous material repository is controlled by spacing of the at least one canister within the storage volume.

12. The hazardous material repository of claim 1, wherein the nickel-chromium-molybdenum alloy is configured to self-form a passive protective film on an exterior surface of the outer housing of the at least one canister.

13. The hazardous material repository of claim 1, further comprising one or more expansion absorbers placed at predetermined locations in the casing.

14. The hazardous material repository of claim 1, wherein the deaerated bentonite-based slurry is pumped from the terranean surface into the non-vertical portion of the drillhole to fill the portion of the storage volume between the at least one canister and the casing to a level that extends uphole to at or near a drillhole seal that is positioned to isolate an entry of the drillhole at a terranean surface from the storage volume.

15. The hazardous material repository of claim 1, wherein the deaerated bentonite-based slurry comprises an insulator and a radioactive energy absorber between the at least one canister and the casing.

16. A method for forming an engineered barrier system for a hazardous material repository, comprising:
 forming a drillhole from a terranean surface into a subterranean zone that comprises a geologic formation, the drillhole comprising a vertical portion and a non-vertical portion coupled to the vertical portion by a transition portion, the non-vertical portion comprises a storage volume for hazardous waste;
 installing a casing between the geologic formation and the drillhole, the casing comprising one or more metallic tubular sections formed of API-5CT L80 steel;
 positioning at least one canister in the storage volume of the non-vertical portion of the drillhole, the at least one canister enclosing a portion of hazardous material and comprising an outer housing formed from a nickel-chromium-molybdenum alloy, the outer housing defining a volume that encloses the portion of the hazardous material and a backfill material that comprises a quartz material; and
 inserting an engineered filling into the drillhole to fill at least a portion of the storage volume between the at least one canister and the casing, the engineered filling comprising a deaerated bentonite-based slurry.

17. The method of claim 16, wherein the hazardous material comprises radioactive material waste.

18. The method of claim 17, wherein the radioactive material waste comprises one or more portions of a spent nuclear fuel assembly.

19. The method of claim 16, wherein the nickel-chromium-molybdenum alloy comprises Alloy 625.

20. The method of claim 16, wherein a wall thickness of the at least one canister is between 9.25 mm and 10 mm.

21. The method of claim 20, wherein a wall thickness of the casing is 12.5 mm.

22. The method of claim 16, wherein a wall thickness of the casing is 12.5 mm.

23. The method of claim 16, wherein inserting the engineered filling into the drillhole comprises pumping the bentonite-based slurry from the terranean surface into the non-vertical portion of the drillhole to fill the portion of the storage volume between the at least one canister and the casing.

24. The method of claim 16, wherein the geologic formation is at a depth in which a hydrostatic pressure at the depth is great enough to prevent boiling of water at a boiling point of about 310° C., or the geologic formation comprises pore water that is highly reducing, or the geologic formation comprises a rock in which pore waters are anoxic, or the geologic formation comprises a fully saturated rock formation.

25. The method of claim 16, wherein positioning the at least one canister in the storage volume of the non-vertical portion of the drillhole comprises:
- positioning a first canister in the storage volume of the non-vertical portion of the drillhole; and
- positioning a second canister in the storage volume of the non-vertical portion of the drillhole apart from the first canister a specified distance based on a thermal load of the hazardous material repository.

26. The method of claim 16, further comprising, subsequent to the inserting the engineered filling into the drillhole, sealing the vertical portion of the drillhole from the terranean surface.

27. The method of claim 16, further comprising inserting one or more expansion absorbers at predetermined locations in the casing.

28. The method of claim 16, further comprising forming a passive protective film on an exterior surface of the outer housing by the nickel-chromium-molybdenum alloy.

* * * * *